United States Patent
Yeh et al.

(10) Patent No.: US 9,851,607 B2
(45) Date of Patent: Dec. 26, 2017

(54) PIXEL STRUCTURE COMPRISING A PIXEL ELECTRODE HAVING BLOCK-SHAPED PORTION AND BRANCH-SHAPED PORTION FORMED OVER A PASSIVATION LAYER HAVING BRANCH-SHAPED PORTION AND BLOCK-SHAPED PORTION

(71) Applicant: Au Optronics Corporation, Hsinchu (TW)

(72) Inventors: Chao-Wei Yeh, Taoyuan County (TW); Cheng-Pim Ku, Taipei (TW); Tien-Lun Ting, Taichung (TW); Wen-Hao Hsu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/686,793

(22) Filed: Apr. 15, 2015

(65) Prior Publication Data
US 2016/0291419 A1 Oct. 6, 2016

(30) Foreign Application Priority Data

Mar. 30, 2015 (TW) .............................. 104110293 A

(51) Int. Cl.
*G02F 1/1343* (2006.01)
*H01L 27/12* (2006.01)
*G02F 1/1337* (2006.01)

(52) U.S. Cl.
CPC .. *G02F 1/134309* (2013.01); *G02F 1/133707* (2013.01); *H01L 27/124* (2013.01)

(58) Field of Classification Search
None
See application file for complete search history.

(56) References Cited

U.S. PATENT DOCUMENTS

| 6,734,924 B2 | 5/2004 | Hirakata et al. |
| 7,248,320 B2 | 7/2007 | Hirakata et al. |

(Continued)

FOREIGN PATENT DOCUMENTS

| CN | 102236216 | 11/2011 |
| CN | 103676351 | 3/2014 |

(Continued)

OTHER PUBLICATIONS

Miyakawa et al., "High Transmission VA-LCD with a Three Dimensionally Shaped Pixel Electrode for 4K x 2K Displays," SID Symposium Digest of Technical Papers, Jun. 2013, pp. 107-110.

*Primary Examiner* — Anh Mai
(74) *Attorney, Agent, or Firm* — JCIPRNet

(57) ABSTRACT

A pixel structure includes a substrate, an opposite substrate, a scan line and a data line, an active device, a pixel electrode, and a passivation layer. The pixel electrode has at least one block-shaped electrode and a plurality of first branch electrodes. The passivation layer has at least one block-shaped protrusion pattern, a plurality of branch protrusion patterns, and a plurality of grooves. The first branch electrodes are located on the block-shaped protrusion patterns. An Edge of the block-shaped electrodes further extends to the block-shaped protrusion patterns. An orthogonal projection gap W1 is between an orthogonal projection edge of the block-shaped electrode and an orthogonal projection edge of the nearest first branch electrode, and 0 μm<W1≤5 μm. An orthogonal projection distance W2 is between the orthogonal projection edge of the block-shaped electrode and an orthogonal projection edge of the block-shaped protrusion pattern, and 0 μm<W2≤10 μm.

28 Claims, 40 Drawing Sheets

(56) References Cited

U.S. PATENT DOCUMENTS

| | | |
|---|---|---|
| 7,609,332 B2 | 10/2009 | Hirakata et al. |
| 8,102,480 B2 | 1/2012 | Hirakata et al. |
| 8,587,741 B2 | 11/2013 | Hirakata et al. |
| 9,176,344 B2 | 11/2015 | Jeong et al. |
| 9,519,187 B2 | 12/2016 | Yeh et al. |
| 2002/0063841 A1 | 5/2002 | Hirakata et al. |
| 2004/0160540 A1 | 8/2004 | Hirakata et al. |
| 2007/0268439 A1 | 11/2007 | Hirakata et al. |
| 2011/0260957 A1* | 10/2011 | Jeong ............... G02F 1/133707 345/98 |
| 2011/0317104 A1* | 12/2011 | Nakamura ........ G02F 1/133371 349/106 |
| 2012/0188476 A1 | 7/2012 | Hirakata et al. |
| 2013/0242239 A1 | 9/2013 | Chang et al. |
| 2014/0125896 A1 | 5/2014 | Suwa et al. |
| 2014/0132871 A1 | 5/2014 | Hirakata et al. |
| 2015/0049288 A1 | 2/2015 | Yeh et al. |
| 2016/0018705 A1 | 1/2016 | Cheng et al. |
| 2016/0202564 A1* | 7/2016 | Kim .................. G02F 1/134309 349/43 |
| 2016/0342038 A1* | 11/2016 | Shih ................. G02F 1/134309 |
| 2017/0059945 A1* | 3/2017 | Yeh ................... G02F 1/134309 |

FOREIGN PATENT DOCUMENTS

| | | |
|---|---|---|
| CN | 103809334 | 5/2014 |
| CN | 104267548 | 1/2015 |
| JP | 2013011903 | 1/2013 |
| JP | 2014095783 | 5/2014 |
| JP | 2015038611 | 2/2015 |
| JP | 2016070954 | 5/2016 |

\* cited by examiner

PIXEL STRUCTURE COMPRISING A PIXEL ELECTRODE HAVING BLOCK-SHAPED PORTION AND BRANCH-SHAPED PORTION FORMED OVER A PASSIVATION LAYER HAVING BRANCH-SHAPED PORTION AND BLOCK-SHAPED PORTION

CROSS-REFERENCE TO RELATED APPLICATION

This application claims the priority benefit of Taiwan application serial no. 104110293, filed on Mar. 30, 2015. The entirety of the above-mentioned patent application is hereby incorporated by reference herein and made a part of this specification.

FIELD OF THE DISCLOSURE

An exemplary embodiment of the disclosure is directed to a pixel structure and a display panel.

DESCRIPTION OF RELATED ART

Among flat panel displays, liquid crystal displays (LCDs) have been extensively employed. In the LCD, pixel electrodes and a common electrode are formed on one or two substrates, and a liquid crystal layer is interposed between the two substrates. By applying a voltage to the LCD, an electric field is generated on the liquid crystal layer; the arrangement of liquid crystal molecules in the liquid crystal layer may be decided according to the electric field, and patterns can thereby be displayed.

Among a variety of LCDs, a vertically aligned liquid crystal display (VA-LCD) draws great attention because such VA-LCD is characterized by high contrast and wide view angle. Specifically, if no electric field is applied to the VA-LCD, the main axis (the long axis) of liquid crystal molecules of the VA-LCD is perpendicular to the alignment direction of the display panel. In the VA-LCD, plural liquid crystal molecules corresponding to one pixel electrode may be aligned in different directions through solely forming slits and branch electrodes in the pixel electrode so as to provide the wide view angle. However, when the branch electrodes and the slits are only included d in the pixel electrode, the liquid crystal molecules near the slits are slightly twisted or are not tilted in a stable manner; thereby, the efficiency of the liquid crystal molecules in the LCD is deteriorated, and the transmittance is reduced as well. The unstably tilted liquid crystal molecules may further result in dark-state light leakage. Furthermore, in the pixel electrode only consisting of the branch electrodes, the pixel electrode dose not have any other patterns or type designs. Additionally, a passivation layer which is disposed between the pixel electrode and a thin film transistor only consists of a contact hole via which the pixel electrode is contacted with the thin film transistor. Here, the passivation layer dose not have any other patterns, grooves, or type designs.

The information in this section is for understanding of the background of the disclosure, and therefore, it may contain information that is not part of the related art.

SUMMARY OF THE DISCLOSURE

The disclosure provides a pixel structure capable of enhancing stability of liquid crystal alignment and resolving the issue of dark-state light leakage.

The disclosure is further directed to a display panel with desirable transmittance.

In an embodiment of the disclosure, a pixel structure that includes a substrate, an opposite substrate, a scan line and a data line, an active device, a pixel electrode, and a passivation layer is provided. The opposite substrate is located on the substrate, and the opposite substrate has a common electrode on one side of the opposite substrate facing the substrate. The scan line and the data line are formed on the substrate. The active device is formed on the substrate and electrically connected to the scan line and the data line. The pixel electrode is electrically connected to the active device and has at least one block-shaped electrode and a plurality of first branch electrodes. The passivation layer is located below the pixel electrode. The passivation layer has at least one block-shaped protrusion pattern and a plurality of branch protrusion patterns. The block-shaped electrode of the pixel electrode conformally covers the branch protrusion patterns of the passivation layer, such that the block-shaped electrode protrudes based on the branch protrusion patterns to form a plurality of second branch electrodes. The first branch electrodes of the pixel electrode are located on the block-shaped protrusion pattern of the passivation layer. An edge of the block-shaped electrode of the pixel electrode further extends to the block-shaped protrusion pattern of the passivation layer. An orthogonal projection gap W1 is between an orthogonal projection edge of the block-shaped electrode and an orthogonal projection edge of the nearest one of the first branch electrodes, and 0 μm<W1≤4 μm. An orthogonal projection distance W2 is between the orthogonal projection edge of the block-shaped electrode and an orthogonal projection edge of the block-shaped protrusion pattern, and 2 μm≤W2≤5.5 μm.

In an embodiment of the disclosure, a display panel that includes a plurality of said pixel structures is provided. At least three of the pixel structures form a pixel unit, and a width of each of the first branch electrodes or an interval between the first branch electrodes in at least one of the pixel structures in the pixel unit is different from a width of each of the first branch electrodes or an interval between the first branch electrodes in the other pixel structures in the pixel unit.

In an embodiment of the disclosure, another pixel structure that includes a substrate, an opposite substrate, a scan line and a data line, an active device, a pixel electrode, and a passivation layer is provided. The opposite substrate is located on the substrate, and the opposite substrate has a common electrode on one side of the opposite substrate facing the substrate. The scan line and the data line are formed on the substrate. The active device is formed on the substrate and electrically connected to the scan line and the data line. The pixel electrode is electrically connected to the active device. The pixel electrode has a plurality of branch electrodes, an interval is between every two adjacent branch electrodes of the branch electrodes, an orthogonal projection width of the interval is a, and 0 μm<a<3 μm. The passivation layer is located below the pixel electrode. The passivation layer has a plurality of branch protrusion patterns, and at least one groove is located between two adjacent branch protrusion patterns of the branch protrusion patterns. Each of the branch electrodes of the pixel electrode is arranged corresponding to one of the grooves of the passivation layer. Each of the branch electrodes extends from the one of the grooves to two adjacent branch protrusion patterns of the branch protrusion patterns, and the interval is overlapped with the two adjacent branch protrusion patterns. An orthogonal projection distance b is between an orthogonal projection edge of each of the branch electrodes and an orthogonal projection edge one groove corresponding to said branch electrode, and 1.5 µm≤b≤10 µm.

In an embodiment of the disclosure, another display panel is provided. At least three pixel structures form a pixel unit, and a width of each of the first branch electrodes or a gap between the first branch electrodes in at least one of the pixel structures in the pixel unit is different from a width of each of the first branch electrodes or a gap between the first branch electrodes in the other pixel structures in the pixel unit.

In view of the above, the pixel electrode may have plural branch electrodes, and the passivation layer may have plural branch protrusion patterns. The branch electrodes and the branch protrusion patterns are intersected with each other, and thereby the pixel structure described herein may have the desirable undulated structure (a structure that protrudes upward and is recessed downward). As a result, the issue of the unstably tilted liquid crystal caused by the insufficient depth of each groove in the passivation layer can be prevented. Moreover, the pixel structure described herein is able to reduce the dark-state light leakage caused by the sidewalls of the branch protrusion patterns of the passivation layer, such that the resultant display panel can have favorable transmittance.

Several exemplary embodiments accompanied with figures are described in detail below to further describe the disclosure in details.

DETAILED DESCRIPTION OF DISCLOSED EMBODIMENTS

Figure 1:
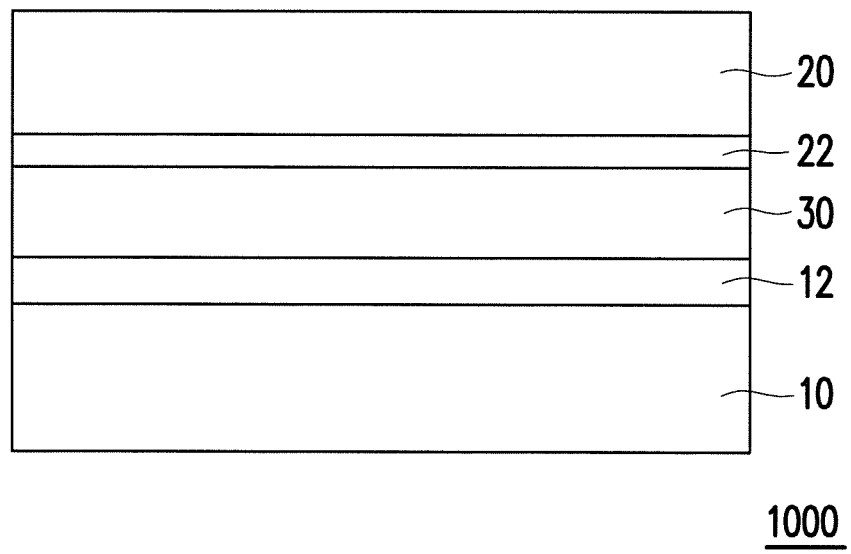
FIG. 1 is a schematic cross-sectional view illustrating a display panel according to an embodiment of the disclosure.

FIG. 1 is a schematic cross-sectional diagram illustrating a display panel 1000 according to an embodiment of the disclosure. With reference to FIG. 1, a display panel 1000 described in the present embodiment has a substrate 10, an opposite substrate 20, a display medium 30, and a pixel array layer 12. The display panel 1000 provided herein is an LCD panel, for instance.

The substrate 10 may be made of glass, quartz, an organic polymer, or the like.

The opposite substrate 20 is located opposite to the substrate 10. The opposite substrate 20 may be made of glass, quartz, an organic polymer, or the like. The opposite substrate 20 has a common electrode 22 on one side of the opposite substrate 20 facing the substrate 10. A material of the common electrode 22 includes metal oxide, such as indium tin oxide (ITO), indium zinc oxide (IZO), aluminum tin oxide (ATO), aluminum zinc oxide (AZO), indium germanium zinc oxide (IGZO), graphene, carbon nanotubes, nanometer-scale conductive wires, other suitable materials, or a stacked layer having at least two of the above materials.

The display medium 30 is located between the substrate 10 and the opposite substrate 20. The display medium 30 includes liquid crystal molecules (not shown). According to the present embodiment, the display medium 30 in the display panel 1000 not only has the liquid crystal molecules but also includes monomers. In other words, before a curing process is performed on the monomers in the display panel 1000, the display medium 30 has the liquid crystal molecules and the monomers. When the curing process is performed on the monomers in the display panel 1000, the monomers are polymerized to form a polymer thin film on the surface of the pixel array layer 122. The polymer thin film is capable of aligning liquid crystal molecules and thus may be called as an alignment film. The curing process may be a light polymerization process, a thermal polymerization process, or a combination thereof. In addition, together with the curing process, a voltage may be input to pre-tilt the liquid crystal molecules. Therefore, after the curing process is performed on the monomers in the display panel 1000, the display medium 30 is mainly comprised of the liquid crystal molecules.

Figure 2:
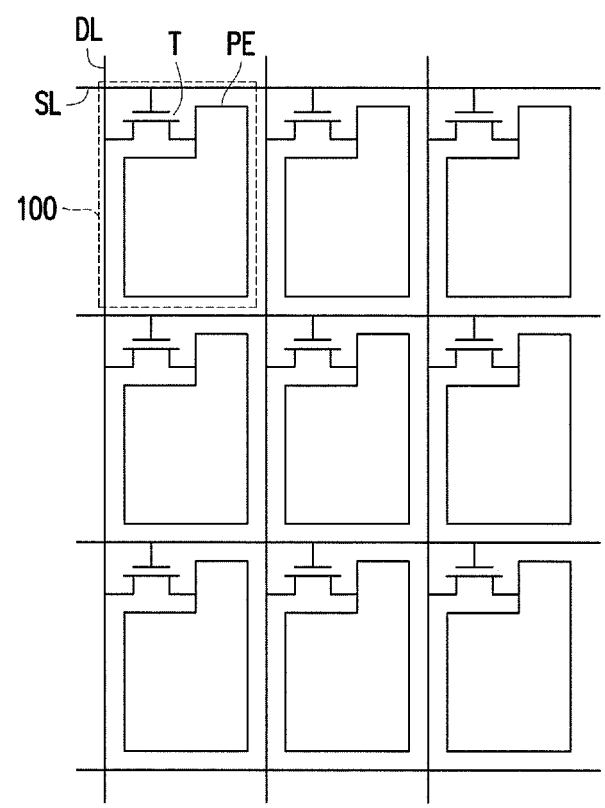
FIG. 2 is a schematic top view illustrating a pixel array layer according to an embodiment of the disclosure.

The pixel array layer 12 is located on the substrate 10, and the display medium 30 covers the pixel array layer 12. The pixel array layer 12 includes a plurality of pixel structures 100. The design of the pixel structure 100 will be elaborated hereinafter with reference to FIG. 2. FIG. 2 is a schematic top view illustrating a pixel array layer 12 according to an embodiment of the disclosure. To clearly describe the present embodiment, FIG. 2 merely illustrates the pixel structures 100 arranged in a 3×3 manner in the pixel array layer 12; however, people having ordinary skill in the pertinent art should be able to comprehend that the pixel array layer 12 depicted in FIG. 1 is actually comprised of plural pixel structures 100 arranged in an array.

As shown in FIG. 2, the pixel structure 100 includes a scan line SL, a data line DL, an active device T, a pixel electrode PE, and a passivation layer (not shown).

The extension direction of the scan line SL is different from the extension direction of the data line DL; preferably, the extension directions of the data line DL and the scan line SL are perpendicular to each other, which should however not be construed as a limitation to the disclosure. In addition, the scan line SL and the data line DL are located at different film layers, and an insulation layer (not shown) is sandwiched therebetween. The scan line SL and the data line DL serve to transmit driving signals (e.g., scan signals and data signals) of the pixel structure 100. The scan line SL and the data line DL are often made of metallic materials. However, the disclosure is not limited thereto, and the scan line SL and the data line DL in other embodiments of the disclosure may be made of other conductive materials, such as an alloy, metal oxide, metal nitride, metal oxynitride, graphene, carbon nanotubes, conductive polymer materials, other suitable conductive materials, or a stacked layer having at least two of the above materials.

The active device T is electrically connected to the scan line SL and the data line DL. Here, the active device T is a thin film transistor (TFT) that includes a gate, a channel layer, a drain, and a source. The gate is electrically connected to the scan line SL, and the source is electrically connected to the data line DL. That is, when a control signal is input to the scan line SL, the control signal is transmitted from the scan line SL to the gate; when a control signal is input to the data line DL, the control signal is transmitted from the data line DL to the source. The control signal which is input to the scan line SL acts as the scan signal and the control signal which is input to the data line DL acts as the data signal. The channel layer is located above the gate and under the source and the drain. In the present embodiment, the active device T is a bottom-gate TFT, for instance, while the disclosure is not limited thereto. In another embodiment of the disclosure, the active device T can also be a top-gate TFT, i.e. the channel layer is located below the gate and below the source and the drain. A material of the channel layer includes polysilicon, microcrystalline silicon, monocrystalline silicon, amorphous silicon, a metal oxide semiconductor material, an organic semiconductor material, graphene, carbon nanotubes, other suitable conductive materials, or a stacked layer having at least two of the above materials.

The pixel electrode PE is electrically connected to the active device T. Specifically, the pixel electrode PE may be electrically connected to the drain of the active device T through a contact window (not marked). The pixel electrode PE is, for instance, a transparent conductive layer comprising metal oxide, such as ITO, IZO, ATO, AZO, IGZO, graphene, carbon nanotubes, nanometer-scale conductive wires, other suitable materials, or a stacked layer having at least two of the above materials.

The passivation layer is located below the pixel electrode PE. A material of the passivation layer includes an inorganic material, an organic material, a single layer containing the mixture of said materials, or a stacked layer having at least two of the above materials, for instance. The inorganic material includes silicon oxide, silicon nitride, silicon oxynitride, graphene nitride, graphene oxide, graphene oxynitride, carbon nitride nanotubes, carbon oxide nanotubes, carbon oxynitride nanotubes, other suitable materials, or a stacked layer having at least two of the above materials, for instance.

The organic material includes a colorless photoresist, a color and transparent photoresist, benzocyclobutene (BCB), polyimide (PI), polymethyl methacrylate (PMMA), other suitable materials, or a stacked layer having at least two of the above materials, for instance.

The LCD described in an embodiment of the disclosure is required to have the undulated pixel structures (i.e., pixel structures that protrude upward and are recessed downward or concavo-convex pixel structures); to comply with said requirement, the pixel electrode PE and the passivation layer in each pixel structure described herein may be designed in different manners, and some pixel structures are elaborated hereinafter with reference to drawings. Thereby, the design of the pixel electrode PE and the passivation layer in each pixel structure can be clarified.

Figure 3:
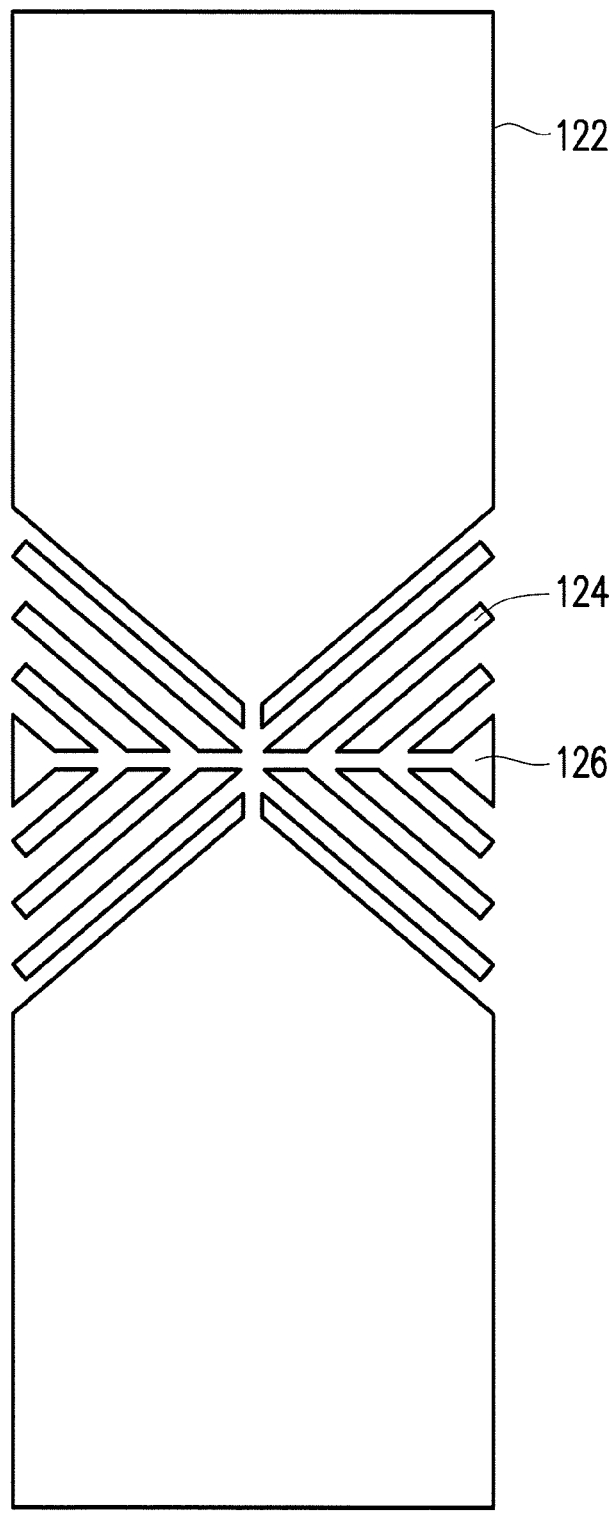
FIG. 3 is a schematic top view illustrating a pixel electrode in a pixel structure according to a first embodiment of the disclosure.
Figure 4:
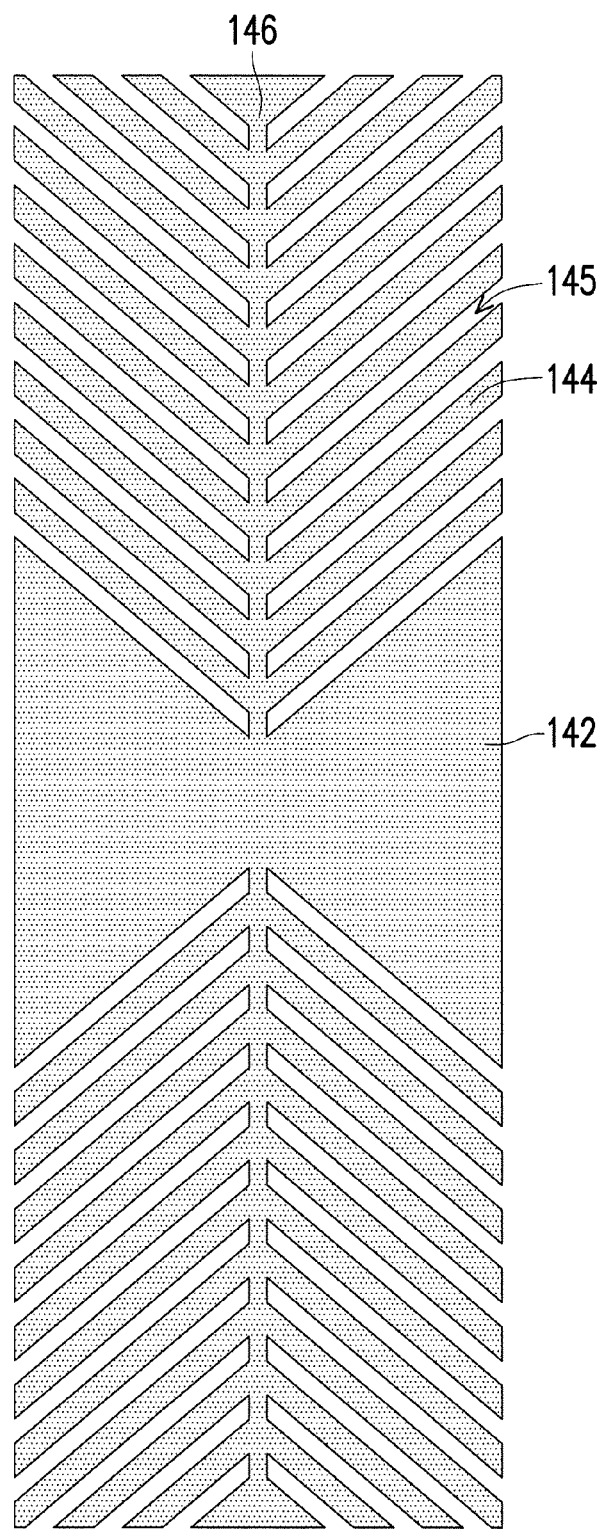
FIG. 4 is a schematic top view illustrating a passivation layer below the pixel electrode depicted in FIG. 3.
Figure 5:
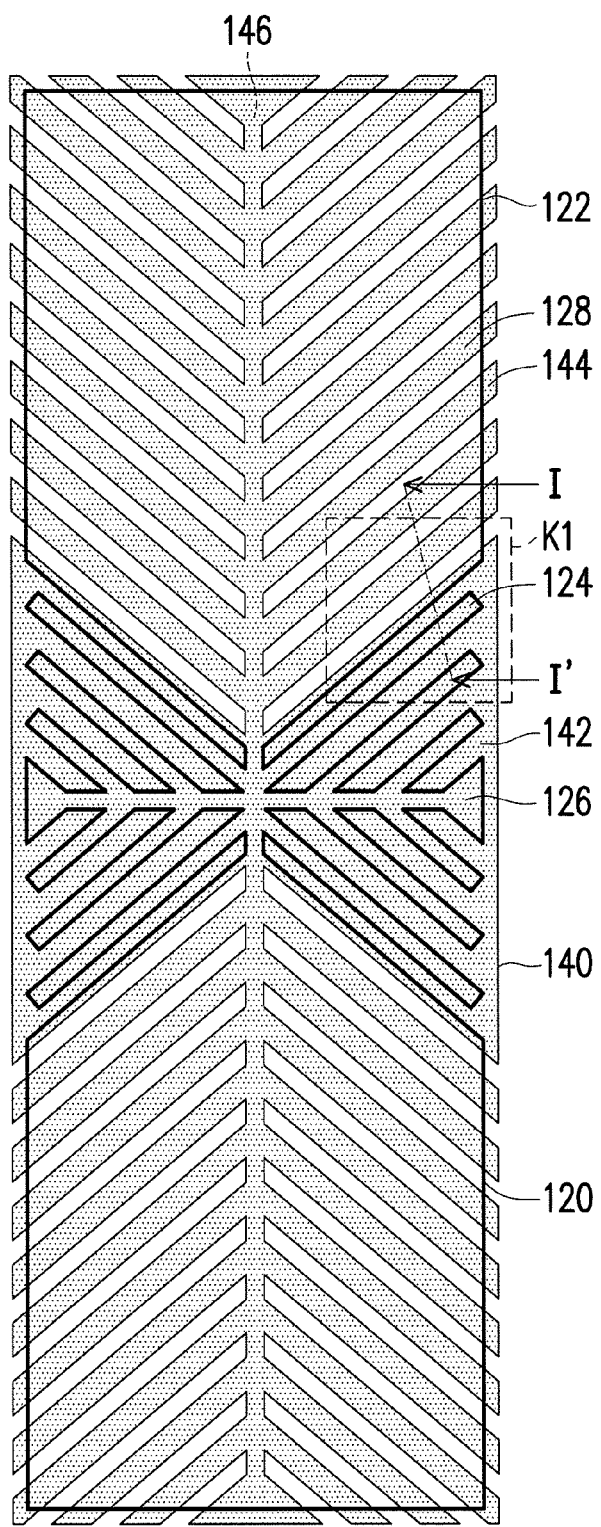
FIG. 5 is a schematic view illustrating that the pixel electrode depicted in FIG. 3 and the passivation layer depicted in FIG. 4 are overlapped.

FIG. 3 is a schematic top view illustrating a pixel electrode in a pixel structure according to a first embodiment of the disclosure. FIG. 4 is a schematic top view illustrating a passivation layer below the pixel electrode depicted in FIG. 3. FIG. 5 is a schematic view illustrating that the pixel electrode depicted in FIG. 3 and the passivation layer depicted in FIG. 4 are overlapped. With reference to FIG. 3, the pixel electrode 120 has at least one block-shaped electrode (i.e., at least one plate electrode) 122 and a plurality of first branch electrodes 124. Particularly, the block-shaped electrode 122 is an electrode region in the pixel electrode 120 and is not patterned; that is, the block-shaped electrode 122 does not have any opening, hole, slit, groove, and gap. By contrast, the first branch electrodes 124 are electrode regions in the pixel electrode 120 and are patterned. The pixel electrode 120 may further include a main electrode (i.e., a main-truck electrode) 126. The first branch electrodes 124 are connected to the main electrode 126, and an interval (i.e., a slit, not marked) is between every two adjacent first branch electrodes 124 and an interval (i.e., a slit, not marked) is between the main electrode 126 and any first branch electrode 124 near the main electrode 126. In the present embodiment, two block-shaped electrodes 122 are located at two sides of the main electrode 126, for instance; that is, the first branch electrodes 124 and the main electrode 122 are located between the two block-shaped electrodes 122, and the two block-shaped electrodes 122 are neither in direct contact with each other nor directly connected to each other. However, the disclosure is not limited thereto. According to another embodiment, the pixel electrode 120 may have only one block-shaped electrode 122, and a plurality of first branch electrodes 124, and the main electrode 126. The orthogonal projection of each block-shaped electrode 122 has a polygonal shape; in the present embodiment, the block-shaped electrodes 122 are exemplarily shaped as pentagons, which should however not be construed as a limitation to the disclosure. The outer contours of the orthogonal projections of the first branch electrodes 124 and the block-shaped electrode 122 may be collectively shaped in other manners, e.g., shaped as a rectangle or shaped in a zigzag manner, which should not be construed as a limitation to the disclosure.

With reference to FIG. 4, the passivation layer 140 has at least one block-shaped protrusion pattern 142 and a plurality of branch protrusion patterns 144. A groove 145 is between any two branch protrusion patterns 144. Particularly, the block-shaped protrusion pattern (i.e., the plate-shaped protrusion pattern or the plate pattern) 142 is a protrusion region occupying a rather large area of the passivation layer 140 and is not patterned; that is, the block-shaped protrusion pattern 144 does not have any opening, hole, slit, groove, and gap. Where the branch protrusion patterns 144 and the grooves 145 are formed are undulated regions (i.e., regions which protrude upward and are recessed downward or concavo-convex region) in the passivation layer 140. In the present embodiment, the passivation layer 140 has a main protrusion pattern 146, and the branch protrusion patterns 144 and the main protrusion pattern (i.e., the main-truck protrusion pattern) 146 are connected. The groove 145 is between every two adjacent branch protrusion patterns 144 and between the main protrusion pattern 146 and any one branch protrusion patterns 144 near the main protrusion pattern 146. In the present embodiment, only one block-shaped protrusion pattern 142 is located between two groups of branch protrusion patterns 144 at two separate regions, and the two groups of branch protrusion patterns 144 at two separate regions are neither in direct contact nor directly connected together. Hence, the two groups of branch protrusion patterns 144 at two separate regions respectively have the main protrusion pattern 146, and the main protrusion patterns 146 at the two separate regions are neither in direct contact with each other nor directly connected to each other but are connected via the block-shaped protrusion pattern 142; however, the disclosure is not limited thereto. In other embodiments, the passivation layer 140 may have two block-shaped protrusion patterns 142, the branch protrusion patterns 144 at several regions, and the main protrusion pattern 146.

FIG. 5 is a schematic view illustrating that the pixel electrode 120 depicted in FIG. 3 and the passivation layer 140 depicted in FIG. 4 are overlapped. With reference to FIG. 3 to FIG. 5, the pixel electrode 120 is formed above the passivation layer 140, and the block-shaped electrodes 122 of the pixel electrode 120 conformally cover the branch protrusion patterns 144 of the passivation layer 140, such that the block-shaped electrodes 122 protrude upward based on the branch protrusion patterns 144 and are recessed downward based on the grooves 145, so as to form a plurality of second branch electrodes 128. The main electrode 126 and the first branch electrodes 124 of the pixel electrode 120 are formed on the block-shaped protrusion patterns 142 of the passivation layer 140, and thus the main electrode 126 of the pixel electrode 120 and the main protrusion pattern 146 of the passivation layer 140 are intersected (i.e., interlaced or crossed over) with each other. The manner in which the main electrode 126 and the main protrusion pattern 146 are intersected manner is not limited in the disclosure; preferably, the main electrode 126 and the main protrusion pattern 146 are perpendicular to each other, as shown in FIG. 5. Note that the main electrode 126 of the pixel electrode 120 includes electrodes arranged in two intersected directions, e.g., the row direction and the column direction; one of the two directions is substantially parallel to the main protrusion pattern 146, and the other substantially intersected with (e.g., is substantially perpendicular to) the main protrusion pattern 146.

Figure 6:
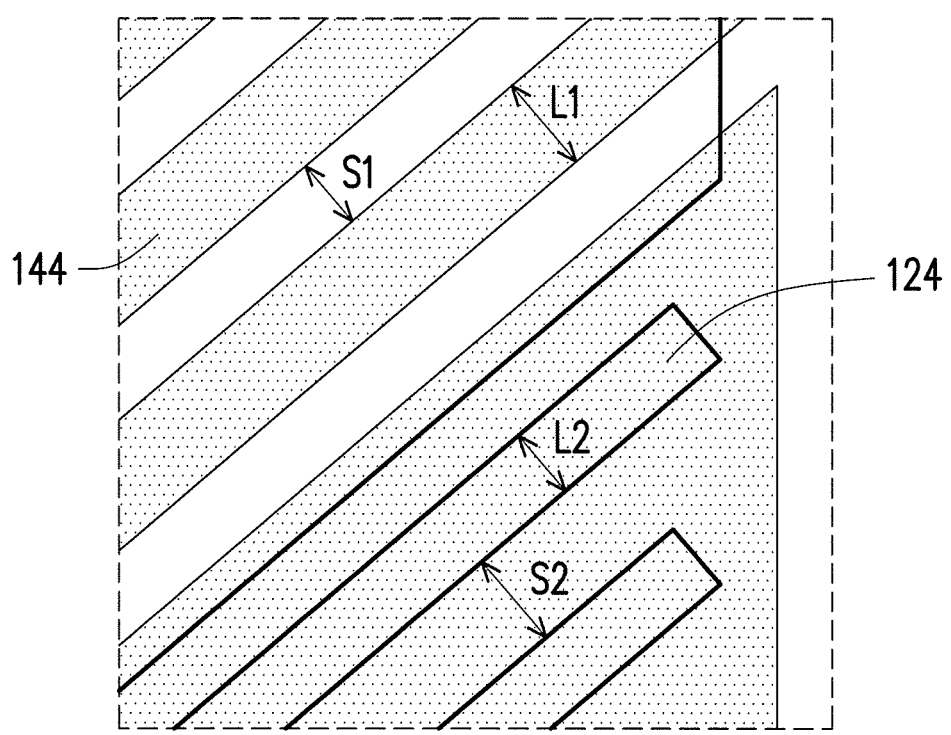
FIG. 6 is a schematic enlarged view illustrating the K1 region depicted in FIG. 5.
Figure 7:
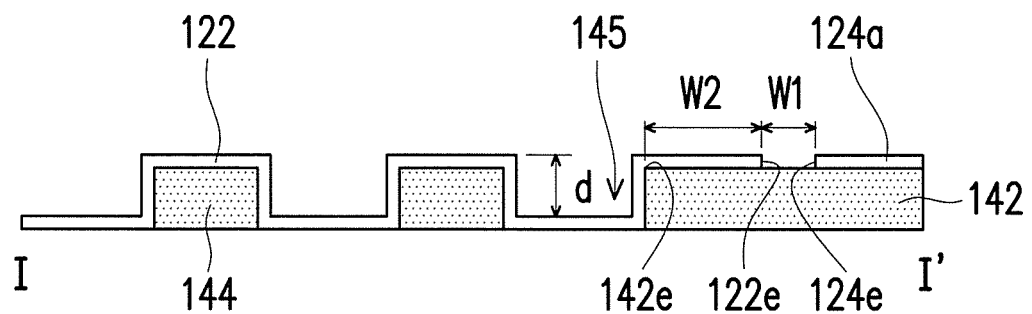
FIG. 7 is a schematic cross-sectional view taken along a line I-I' in FIG. 5.

FIG. 6 is a schematic enlarged view illustrating the K1 region depicted in FIG. 5. FIG. 7 is a schematic cross-sectional view taken along a line I-I' in FIG. 5. With reference to FIG. 5, FIG. 6, and FIG. 7, a width L1 of each of the branch protrusion patterns 144 ranges from about 1 μm to about 10 μm, preferably ranges from about 2 μm to about 6 μm. Besides, an interval (i.e., a gap or a slit) S1 between the branch protrusion patterns 144 ranges from about 1 μm to about 10 μm, preferably ranges from about 2 μm to about 6 μm. Here, the interval S1 may be deemed as the width of the groove 145. A width L2 of each of the first branch electrodes 124 is from about 1 μm to about 10 μm, preferably from about 4 μm to about 6 μm. Besides, an interval (i.e., a gap or a slit) S2 between the first branch electrodes 124 ranges from about 1 μm to about 10 μm, preferably ranges from about 2 μm to about 6 μm. Here, the interval S2 may be deemed as the width of the slit (not marked). But adjusting the widths L1 and L2 as well as the intervals S1 and S2, the tilting direction of the liquid crystal molecules may be adjusted.

In particular, an edge 122e of the block-shaped electrode 122 of the pixel electrode 120 further extends to the block-shaped protrusion pattern 142 of the passivation layer 140. An orthogonal projection gap W1 is between an orthogonal projection edge 122e of the block-shaped electrode 122 and an orthogonal projection edge 124e of the nearest first branch electrode 124a. In consideration of transmittance, the orthogonal projection gap W1 falls within the following range: 0 μm<W1≤4 μm, preferably 1 μm≤W1≤3 μm, and most preferably about 2 μm. Besides, an orthogonal projection distance W2 is between the orthogonal projection edge 122e of the block-shaped electrode 122 and an orthogonal projection edge 142e of the block-shaped protrusion pattern 142. In consideration of transmittance, the orthogonal projection distance W2 falls within the following range: 2 μm≤W2≤5.5 μm, most preferably about 3 μm.

As shown in FIG. 7, it should be mentioned that the edge 122e of the block-shaped electrode 122 of the pixel electrode 120 extends to the block-shaped protrusion pattern 142 of the passivation layer 140. Specifically, the interval (i.e., a gap or a boundary) between the block-shaped electrode 122 and the first one 124a of the branch electrodes 124 is located at the protruding region of the block-shaped protrusion pattern 142 of the passivation layer 140 and is not located in the groove 145 of the branch protrusion pattern 144 of the passivation layer 140. A depth d of each of the grooves 145 of the branch protrusion pattern 144 is not limited in the present embodiment, for example: 0.1 μm≤d≤0.3 μm.

Note that the interval between the block-shaped electrode 122 and the first one of the branch electrodes 124a of the pixel structure is located on the block-shaped protrusion pattern 142 of the passivation layer 140. The efficiency of liquid crystal corresponding to the region (referred to as W2) may be enhanced in the pixel structure described in the present embodiment, and the dark-state light leakage caused by the tapered sidewalls can be reduced in the pixel structure only constituted by parts of the branch protrusion patterns 144 and the grooves 145 of the passivation layer 140; as a result, the resultant display panel can have favorable transmittance and contrast.

Figure 8:
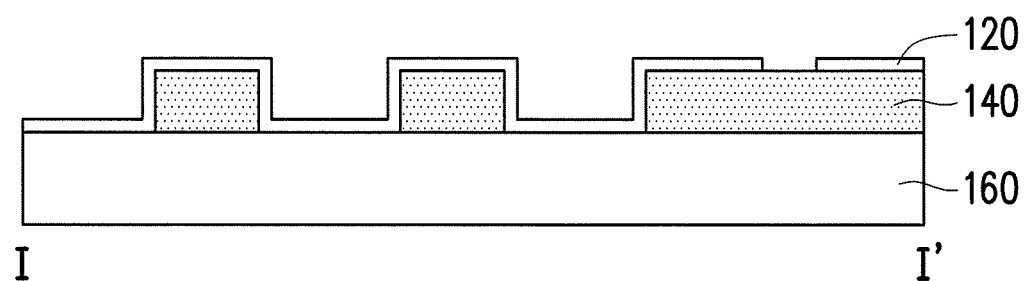
FIG. 8 is a schematic cross-sectional view illustrating the pixel structure taken along the line I-I' in FIG. 5 according to another embodiment of the disclosure.

FIG. 8 is a schematic cross-sectional view illustrating the pixel structure taken along the line I-I' in FIG. 5 according to another embodiment of the disclosure. The embodiment shown in FIG. 8 is similar to the embodiments shown in FIG. 5 to FIG. 7, and therefore identical or similar components in these embodiments and figures will be denoted by the same or similar numerals and will not be further described hereinafter. With reference to FIG. 8, not only the passivation layer 140 but also the color filter layer 160 may be located below the pixel electrode 120. The passivation layer 140 may be made of an inorganic material, an organic material, or a stacked layer including the above-mentioned materials. In order to protect the color of the color filter layer 160 from being affected, the organic material of the passivation layer 140 is preferably not selected from the color photoresist. Here, the color filter layer 160 is constituted by at least one of a green filter layer, a blue filter layer, and a red filter layer, for instance.

Figure 9:
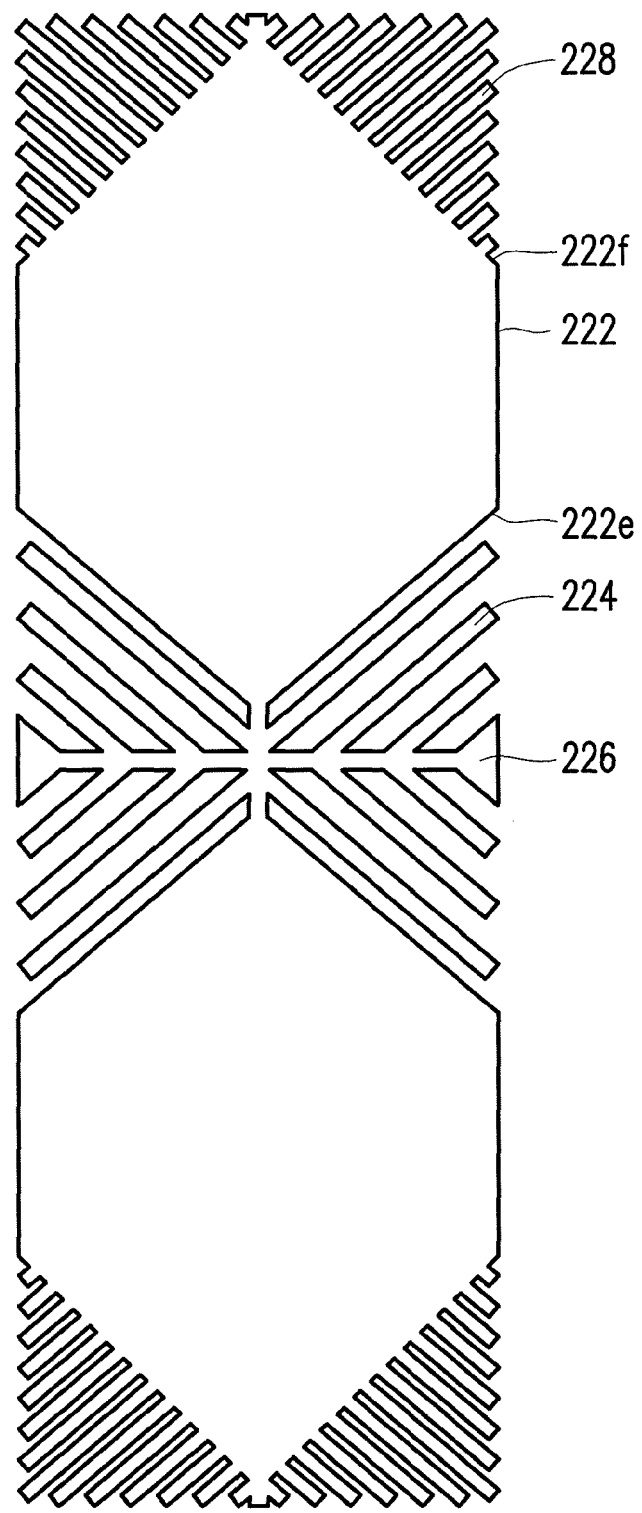
FIG. 9 is a schematic top view illustrating a pixel electrode in a pixel structure according to a second embodiment of the disclosure.
Figure 10:
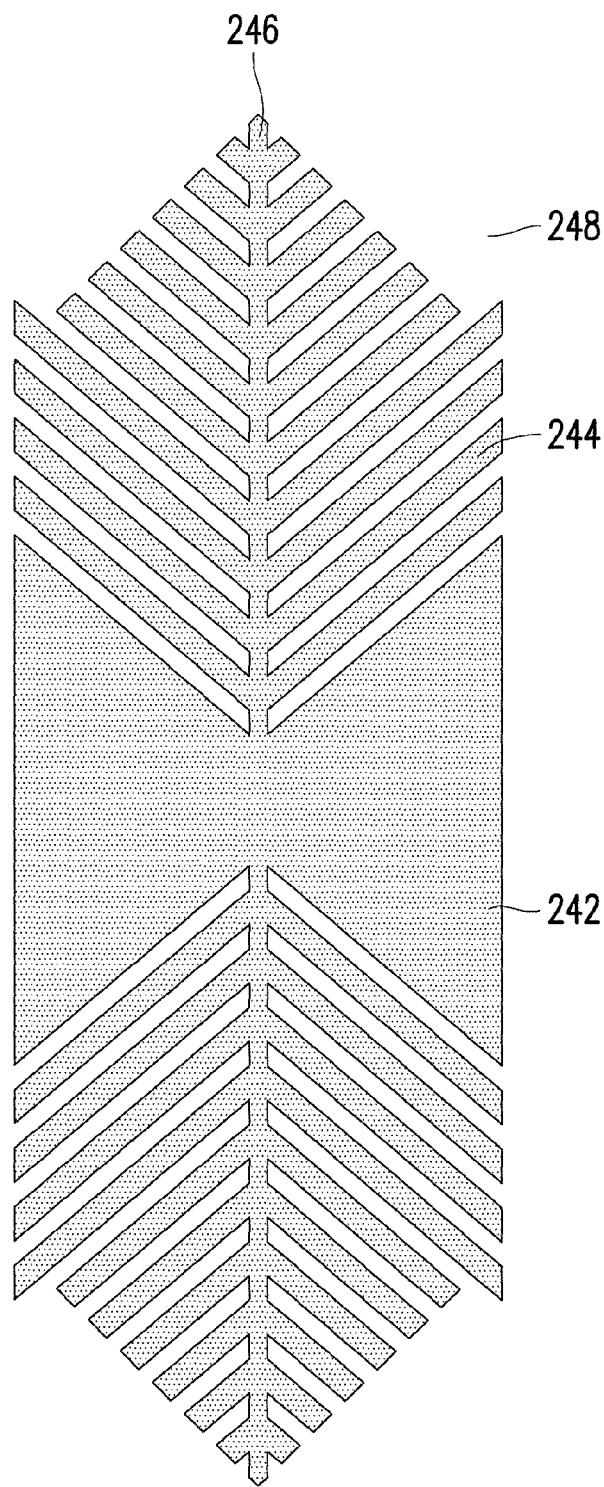
FIG. 10 is a schematic top view illustrating a passivation layer below the pixel electrode depicted in FIG. 9.
Figure 11:
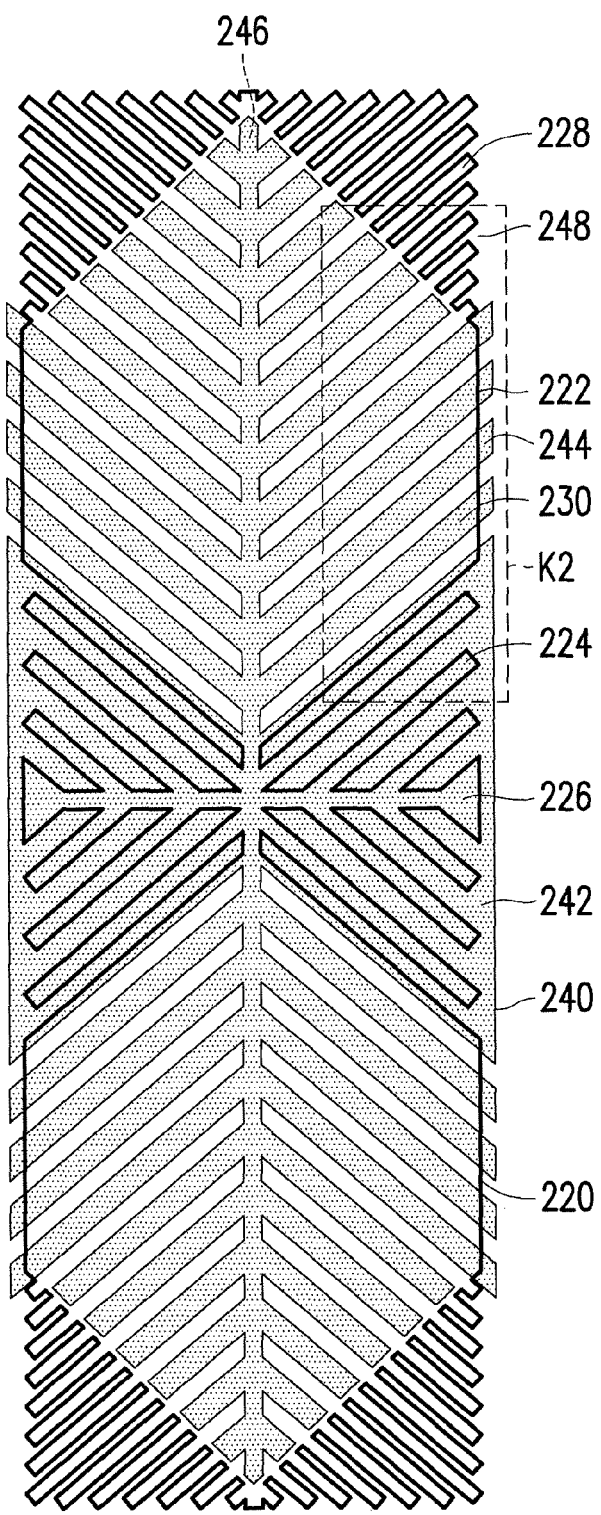
FIG. 11 is a schematic view illustrating that the pixel electrode depicted in FIG. 9 and the passivation layer depicted in FIG. 10 are overlapped.

FIG. 9 is a schematic top view illustrating a pixel electrode in a pixel structure according to a second embodiment of the disclosure. FIG. 10 is a schematic top view illustrating a passivation layer below the pixel electrode depicted in FIG. 9. FIG. 11 is a schematic view illustrating that the pixel electrode depicted in FIG. 9 and the passivation layer depicted in FIG. 10 are overlapped. As shown in FIG. 9, the pixel electrode 220 has at least one block-shaped electrode (i.e., at least one plate electrode) 222, a plurality of first branch electrodes 224, a main electrode (i.e., a main-truck electrode) 226, and a plurality of outer branch electrodes 228. Particularly, the block-shaped electrode 222 is an electrode region in the pixel electrode 220 and is not patterned; that is, the block-shaped electrode 222 does not have any opening, hole, slit, groove, and gap. By contrast, the first branch electrodes 224, the main electrode 226, and the outer branch electrodes 228 are electrode regions in the pixel electrode 220 and are patterned. Here, the block-shaped electrodes 222 are located at two sides of the main electrode 226. The first branch electrodes 224 are located on one side of the block-shaped electrodes 222 and are adjacent to edges 222e of the block-shaped electrodes 222. Besides, the first branch electrodes 224 are connected to the main electrode 226, and an interval (i.e., a slit, not marked) is between every two adjacent first branch electrodes 224 and between the main electrode 226 and any one of the first branch electrodes 224 near the main electrode. The outer branch electrodes 228 are located on another side of the block-shaped electrodes 222, and the outer branch electrodes 228 extend outwardly in a radial manner along the other edges 222f of the block-shaped electrodes 222. An interval (i.e., a slit, not marked) is between every two adjacent outer branch electrodes 228. A shown in FIG. 9, the edges 222e of the block-shaped electrodes 222 are not directly connected to the edges 222f of the block-shaped electrodes 222. The orthogonal projection of each block-shaped electrode 222 has a polygonal shape; in the present embodiment, the block-shaped electrodes 122 are shaped as hexagons, which should however not be construed as a limitation to the disclosure. The outer contour of the orthogonal projection of each outer branch electrode 228 and the outer contour of the orthogonal projection of each block-shaped electrode 222 may be collectively shaped as a pentagon. Besides, the outer contours of the orthogonal projections of the first branch electrodes 224, the outer branch electrodes 2228, and the block-shaped electrodes 222 may be collectively shaped in other manners, e.g., shaped as a rectangle or shaped in a zigzag manner, which should not be construed as a limitation to the disclosure.

As shown in FIG. 10, the passivation layer 240 has at least one block-shaped protrusion pattern (i.e., at least one plate protrusion pattern or at least one plate pattern) 242, a plurality of branch protrusion patterns 244, a main protrusion pattern (i.e., a main-truck protrusion pattern) 246, and at least one block-shaped pattern 248. Particularly, the block-shaped protrusion pattern 242 is a protrusion region occupying a rather large area of the passivation layer 240 and is not patterned. That is, the block-shaped protrusion pattern 242 does not have any opening, hole, slit, groove, and gap. The branch protrusion patterns 244 are protrusions in the passivation layer 240, and a groove (not marked) having a recess is between every two adjacent branch protrusion patterns 244, such that the regions where the branch protrusion patterns 244 and the grooves are located are undulated regions (i.e., regions that protrude upward and are recessed downward or concavo-convex regions). The block-shaped pattern (i.e., the plate pattern) 248 is a recess region occupying a rather large area of the passivation layer 240 and thus may be called as a plate-shaped recess pattern.

A thickness of the block-shaped pattern 248 is lower in height than a thickness of the block-shaped protrusion pattern 242 but may be similar to a thickness of the groove. In the present embodiment, the branch protrusion patterns 244 are connected to the main protrusion pattern 246, and a groove (not marked) is between every two adjacent branch protrusion patterns 244 and between the main protrusion pattern 246 and any one of the branch protrusion patterns 244 near the main protrusion pattern. The groove (not marked) between every two adjacent branch protrusion patterns 244 is communicated with the block-shaped pattern. In the present embodiment, the block-shaped protrusion pattern 242 is located between two groups of branch protrusion patterns 244 at two separate regions, and the two groups of branch protrusion patterns 244 at two separate regions are neither in direct contact nor directly connected to each other. Hence, the two groups of branch protrusion patterns 244 at two separate regions are respectively connected to the main protrusion patterns 246 respectively at the separate regions, and the main protrusion patterns 146 at the two separate regions are neither in direct contact with each other nor directly connected to each other but are connected via the block-shaped protrusion pattern 242. In addition, according to the present embodiment, four block-shaped patterns 248 are exemplarily located at the outer corners of the branch protrusion patterns 244, for instance, whereas the disclosure is not limited thereto.

FIG. 11 is a schematic view illustrating that the pixel electrode 220 depicted in FIG. 9 and the passivation layer 240 depicted in FIG. 10 are overlapped. With reference to FIG. 9 to FIG. 11, the pixel electrode 220 is formed above the passivation layer 240, and the block-shaped electrodes 222 of the pixel electrode 220 conformally cover the branch protrusion patterns 244 of the passivation layer 240, such that the block-shaped electrodes 222 protrude upward based on the branch protrusion patterns 244 and is recessed downward based on the grooves (not marked), so as to form a plurality of second branch electrodes 230. The main electrode 226 and the first branch electrodes 224 of the pixel electrode 220 are formed on the block-shaped protrusion patterns 242 of the passivation layer 240, the outer branch electrodes 228 of the pixel electrode 220 are formed on the block patterns 248 of the passivation layer 240; thus, the main electrode 226 of the pixel electrode 220 and the main protrusion pattern 246 of the passivation layer 240 are intersected (i.e., interlaced or crossed over) with each other. The manner in which the main electrode 226 and the main protrusion pattern 246 are intersected is not limited in the disclosure; preferably, the main electrode 226 and the main protrusion pattern 246 are perpendicular to each other, as shown in FIG. 11. Note that the main electrode 226 of the pixel electrode 220 includes electrodes arranged in two intersected directions, e.g., the row direction and the column direction; one of the two directions is substantially parallel to the main protrusion pattern 246, and the other substantially intersected with (e.g., is substantially perpendicular to) the main protrusion pattern 246.

Figure 12:
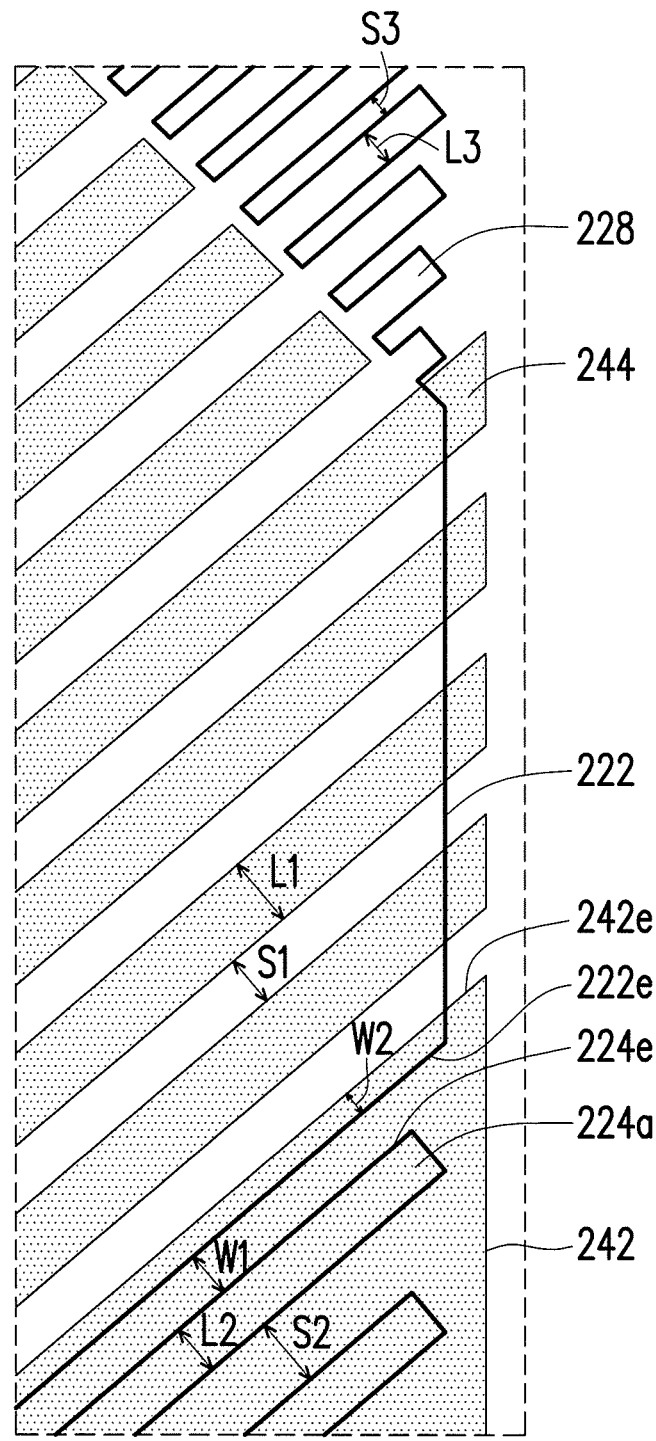
FIG. 12 is a schematic enlarged view illustrating the K2 region depicted in FIG. 11.

FIG. 12 is a schematic enlarged view illustrating the K2 region depicted in FIG. 11. With reference to FIG. 11 and FIG. 12, similarly, the width L1 of each of the branch protrusion patterns 244 ranges from about 1 μm to about 10 μm, preferably ranges from about 2 μm to about 6 μm. Besides, the interval (i.e., the gap or the slit) S1 between the branch protrusion patterns 244 ranges from about 1 μm to about 10 μm, preferably ranges from about 2 μm to about 6 μm. Here, the interval S1 may be deemed as the width of the groove (not marked). The width L2 of each of the first branch electrodes 224 ranges from about 1 μm to about 10 μm, preferably ranges from about 2 μm to about 6 μm. Besides, the interval (or namely gap, or slit) S2 between the first branch electrodes 224 ranges from about 1 μm to about 10 μm, preferably ranges from about 2 μm to about 6 μm. Here, the interval S2 may be deemed as the width of the slit (not marked). A width L3 of each of the outer branch electrodes 228 ranges from about 1 μm to about 10 μm, preferably ranges from about 2 μm to about 6 μm. Besides, an interval (or namely gap, or slit) S3 between the outer branch electrodes 228 ranges from about 1 μm to about 10 μm, preferably range from about 2 μm to about 6 μm. Here, the interval S3 may be deemed as the width of the slit (not marked). But adjusting the widths L1, L2, and L3 as well as the intervals S1, S2, and S3, the tilting direction of the liquid crystal molecules may be adjusted.

As shown in FIG. 12, similarly, the first branch electrodes 224 of the pixel electrode 220 are located on the block-shaped protrusion pattern 242 of the passivation layer 240. The edge 222e of the block-shaped electrode 222 of the pixel electrode 220 further extends to the block-shaped protrusion pattern 242 of the passivation layer 240. Note that the orthogonal projection gap W1 is between the orthogonal projection edge 222e of the block-shaped electrode 222 and the orthogonal projection edge 224e of the nearest first branch electrode 224a. In consideration of transmittance, the orthogonal projection gap W1 falls within the following range: $0 \ \mu m < W1 \le 4 \ \mu m$, preferably about $1 \ \mu m \le W1 \le 3 \ \mu m$, and most preferably about 2 μm. Besides, the orthogonal projection distance W2 is between the orthogonal projection edge 222e of the block-shaped electrode 222 and the orthogonal projection edge 242e of the block-shaped protrusion pattern 242. In consideration of transmittance, the orthogonal projection distance W2 falls within the following range: $2 \ \mu m \le W2 \le 5.5 \ \mu m$, most preferably about 3 μm. The cross-sectional views of said components, the orthogonal projection gap W1, and the orthogonal projection distance W2 are shown in FIG. 7.

Specifically, the interval (i.e., a gap or a boundary) between the block-shaped electrode 222 and the first one of the first branch electrode 224a of the pixel structure is located on the block-shaped protrusion pattern 242 of the passivation layer 240 and is not located in the groove (not marked) of the branch protrusion pattern 244 of the passivation layer 240, which is shown in FIG. 7. The depth d (can be refer to FIG. 7) of each groove (not marked) of the branch protrusion pattern 244 is not limited in the present embodiment. Therefore, the issue of the unstably tilted liquid crystal caused by the insufficient depth d of each groove in the passivation layer 240 can be prevented in the pixel structure; what is more, the efficiency of liquid crystal corresponding to the region (referred to as W2) may be enhanced in the pixel structure described in the present embodiment, and the dark-state light leakage caused by the tapered sidewalls can be reduced in the pixel structure only constituted by parts of the branch protrusion patterns 244 and the grooves of the passivation layer 240; as a result, the resultant display panel can have favorable transmittance and contrast.

Figure 13:
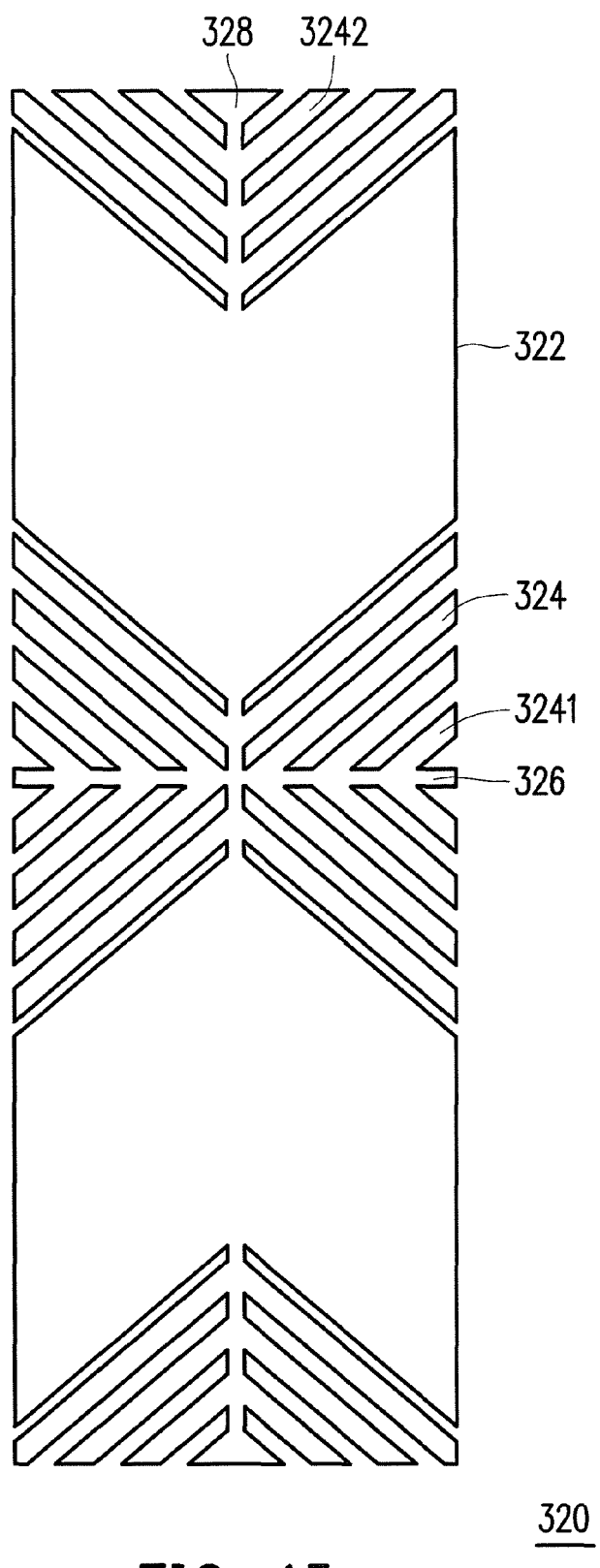
FIG. 13 is a schematic top view illustrating a pixel electrode in a pixel structure according to a third embodiment of the disclosure.
Figure 14:
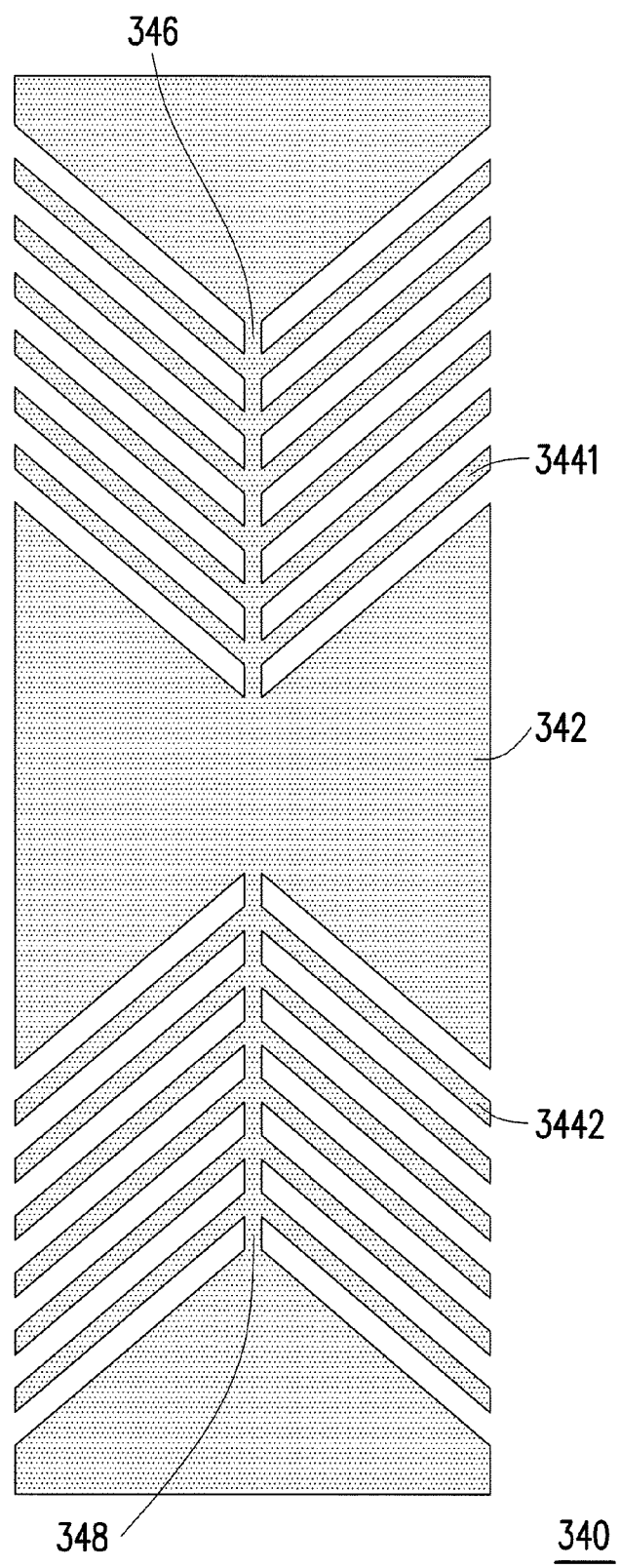
FIG. 14 is a schematic top view illustrating a passivation layer below the pixel electrode depicted in FIG. 13.
Figure 15:
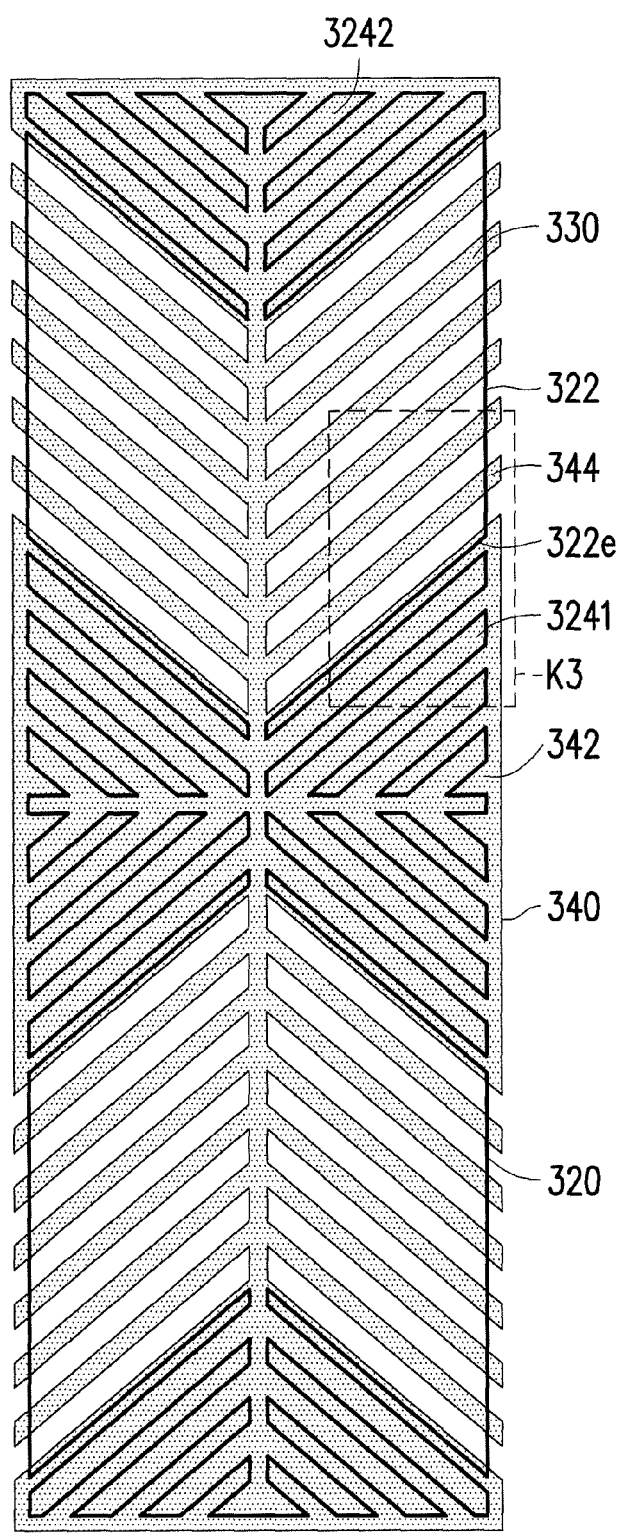
FIG. 15 is a schematic view illustrating that the pixel electrode depicted in FIG. 13 and the passivation layer depicted in FIG. 14 are overlapped.

FIG. 13 is a schematic top view illustrating a pixel electrode in a pixel structure according to a third embodiment of the disclosure. FIG. 14 is a schematic top view illustrating a passivation layer below the pixel electrode depicted in FIG. 13. FIG. 15 is a schematic view illustrating that the pixel electrode depicted in FIG. 13 and the passivation layer depicted in FIG. 14 are overlapped. As shown in FIG. 13, the pixel electrode 320 has at least one block-shaped electrode (i.e., at least one plate electrode) 322, a plurality of first branch electrodes 324, a first main electrode (i.e., a first main-truck electrode) 326, and a second main electrode (i.e., a second main-truck electrode) 328. Particularly, the block-shaped electrode 322 is an electrode region in the pixel electrode 320 and is not patterned; that is, the block-shaped electrode 322 does not have any opening, hole, slit, groove, and gap. By contrast, the first branch electrodes 324 are electrode regions in the pixel electrode 320 and are patterned. With reference to FIG. 13, the first branch electrodes 324 of the pixel electrode 320 further include a plurality of first sub-branch electrodes 3241 connected to the first main electrode 326 and a plurality of second sub-branch electrodes 3242 connected to the second main electrode 328, an interval (i.e., a slit, not marked) is between every two adjacent first sub-branch electrodes 3241 and between the first main electrode 326 and any one of the first sub-branch electrodes 3241 near the first main electrode, and an interval (i.e., a slit, not marked) is between every two adjacent second sub-branch electrodes 3242 and between the second main electrode 328 and any one of the second sub-branch electrodes 3242 near the second main electrode. The block-shaped electrode 322 is located between the first sub-branch electrodes 3241 and the second sub-branch electrodes 3242, such that the first sub-branch electrodes 3241 are neither in direct contact with nor directly connected to the second sub-branch electrodes 3242. The orthogonal projection of each block-shaped electrode 322 has a polygonal shape; in the present embodiment, each block-shaped electrode 322 is shaped as a hexagon, which should however not be construed as a limitation to the disclosure. The outer contours of the orthogonal projections of the second sub-branch electrodes 3242. and the block-shaped electrode 322 may be collectively shaped as a normal pentagon, and the outer contours of the orthogonal projections of the first branch electrodes 324, the second main electrode 328, and the block-shaped electrode 322 may be collectively shaped in various manners, e.g., shaped as a rectangle or shaped in a zigzag manner, which should not be construed as a limitation to the disclosure.

With reference to FIG. 14, the passivation layer 340 has at least one block-shaped protrusion pattern 342, a plurality of branch protrusion patterns 344, a first main protrusion pattern (i.e., a first main-truck protrusion pattern) 346, and a second main protrusion pattern (i.e., a second main-truck protrusion pattern) 348. Particularly, the block-shaped protrusion pattern (i.e., the plate-shaped protrusion pattern or the plate pattern) 342 is a protrusion region occupying a rather large area of the passivation layer 340 and is not patterned; that is, the block-shaped protrusion pattern 342 does not have any opening, hole, slit, groove, and gap. The branch protrusion patterns 344 are protrusions in the passivation layer 340, and a groove (not marked) having a recess is between every two adjacent branch protrusion patterns 344, such that the regions where the branch protrusion patterns 344 and the grooves are located are undulated regions (i.e., regions protruding upward and are recessed downward or concavo-convex regions). Particularly, as shown in FIG. 14, the branch protrusion patterns 344 of the passivation layer 340 further include a plurality of first branch protrusion patterns 3441 connected to the first main protrusion pattern 346 and a plurality of second branch protrusion patterns 3442 connected to the second main protrusion pattern 348. In the present embodiment, there are three exemplary block-shaped protrusion patterns 342. The first branch protrusion patterns 3441 are located between two of the adjacent block-shaped protrusion patterns 342, such as an upper part and a middle part, and the second branch protrusion patterns 3442 are also located between two of the adjacent block-shaped protrusion patterns 342, such as a middle part and a lower part. The first and second branch protrusion patterns 3441 and 3442 at two separate regions are neither in direct contact nor directly connected together. Hence, the main protrusion patterns 346 and 348 respectively connected to the first and second branch protrusion patterns 3441 and 3442 at the two separate regions are neither in direct contact with each other nor directly connected to each other but are connected via the block-shaped protrusion pattern (i.e., the middle part) 342 between the main protrusion patterns 346 and 348; however, the disclosure is not limited thereto.

FIG. 15 is a schematic view illustrating that the pixel electrode 320 depicted in FIG. 13 and the passivation layer 340 depicted in FIG. 14 are overlapped. With reference to FIG. 13 to FIG. 15, the pixel electrode 320 is foil led above the passivation layer 340, and the block-shaped electrodes 322 of the pixel electrode 320 conformally cover the branch protrusion patterns 344 of the passivation layer 340, such that the block-shaped electrodes 322 protrude upward based on the branch protrusion patterns 344 and are recessed downward based on the grooves (not marked), so as to form a plurality of second branch electrodes 330. Note that the block-shaped protrusion pattern 342 is located below orthogonal projections of the first sub-branch electrodes 3241 and the second sub-branch electrodes 3242, such that the block-shaped protrusion pattern 342 is overlapped with the first sub-branch electrodes 3241 and the second sub-branch electrodes 3242. Edges 322e of the block-shaped electrodes 322 further extend onto the block-shaped protrusion pattern 342 of the passivation layer 342 and are not located in the groove (not marked) of the branch protrusion patterns 344 of the passivation layer 340, which is shown in FIG. 7. The depth d (can be refer to FIG. 7) of each groove (not marked) of the branch protrusion pattern 344 is not limited in the present embodiment. The main electrode 326 of the pixel electrode 320 and the main protrusion patterns 346 and 348 of the passivation layer 340 are intersected (i.e., interlaced or crossed over) with each other. The manner in which the main electrode 326 and the main protrusion patterns 346 and 348 are intersected is not limited in the disclosure; preferably, the main electrode 326 is perpendicular to the main protrusion patterns 346 and 348. Note that the main electrode 326 of the pixel electrode 320 includes electrodes arranged in two intersected directions, e.g., the row direction and the column direction; one of the two directions is substantially parallel to the main protrusion patterns 346 and 348, and the other substantially intersected with (e.g., is substantially perpendicular to) the main protrusion patterns 346 and 348.

Figure 16:
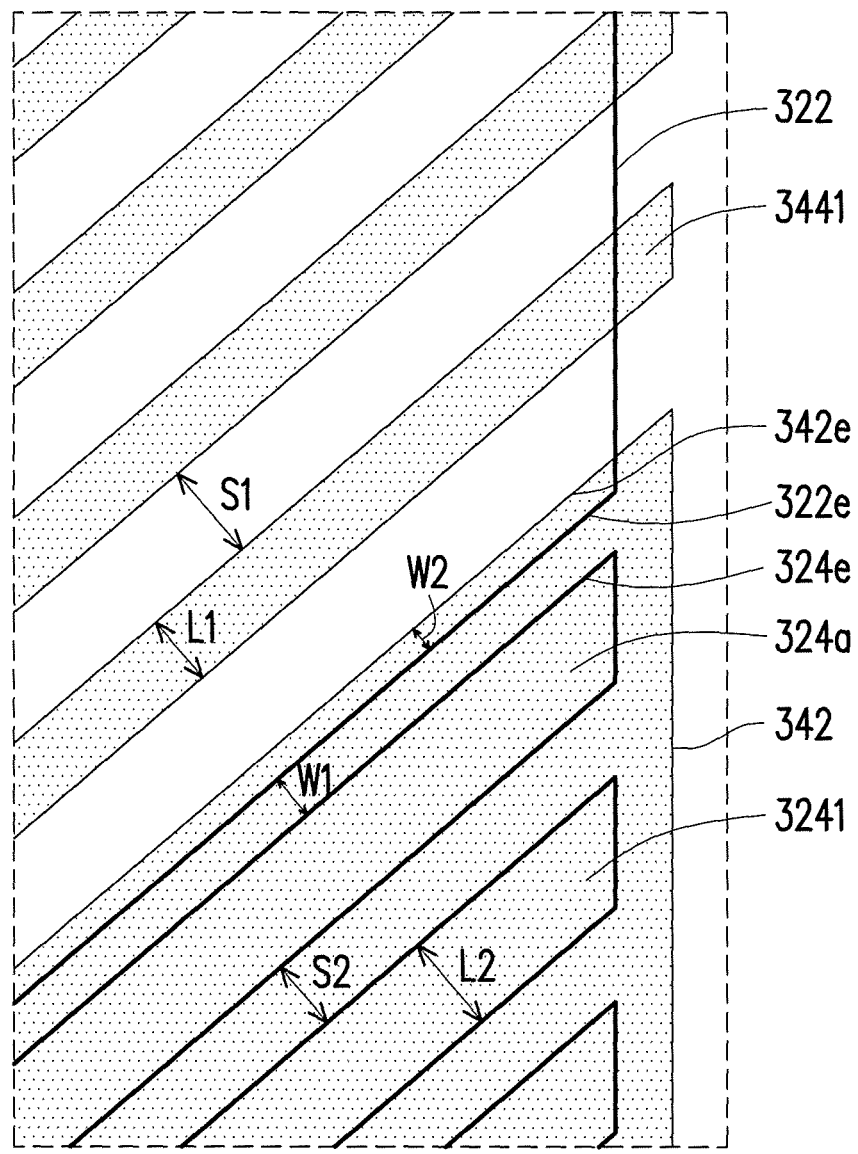
FIG. 16 is a schematic enlarged view illustrating the K3 region depicted in FIG. 15.

FIG. 16 is a schematic enlarged view illustrating the K3 region depicted in FIG. 15. With reference to FIG. 15 and FIG. 16, the width L1 of each of the first branch protrusion patterns 3441 ranges from about 1 μm to about 10 μm, preferably ranges from about 2 μm to about 6 μm. Besides, the interval (i.e., the gap or the slit) S1 between the first branch protrusion patterns 3441 ranges from about 1 μm to about 10 μm, preferably ranges from about 2 μm to about 6 μm. Here, the interval S1 may be deemed as the width of the groove (not marked). The width L2 of each of the first sub-branch electrodes 3241 ranges from about 1 μm to about 10 μm, preferably range from about 2 μm to about 6 μm. Besides, the interval (i.e., the gap or the slit) S2 between the first sub-branch electrodes 3241 ranges from about 1 μm to about 10 μm, preferably ranges from about 2 μm to about 6 μm. Here, the interval S2 may be deemed as the width of the slit (not marked). But adjusting the widths L1 and L2 as well as the intervals S1 and S2, the tilting direction of the liquid crystal molecules may be adjusted. With reference to FIG. 15 and FIG. 16, it should be mentioned that the width L1 and the interval S1 between the second branch protrusion patterns 3442 and the width L1 and the interval S1 between the first branch protrusion patterns 3441 may be within substantially the same range, and the width L1 and the interval S1 between the second branch protrusion patterns 3442 may be substantially the same as or different from the width L1 and the interval S1 between the first branch protrusion patterns 3441. The disclosure is not limited thereto. Similarly, the width L2 and the interval S2 between the second sub-branch electrodes 3242 and the width L2 and the interval S2 between the first sub-branch electrodes 3241 may be within substantially the same range, and the width L2 and the interval S2 between the second sub-branch electrodes 3242 may be substantially the same as or different from the width L2 and the interval S2 between the first sub-branch electrodes 3241. The disclosure is not limited thereto.

As shown in FIG. 16, similarly, the first branch electrodes 324 of the pixel electrode 320 are located on the block-shaped protrusion pattern 342 of the passivation layer 340. Note that the orthogonal projection gap W1 is between the orthogonal projection edge 322e of the block-shaped electrode 322 and the orthogonal projection edge 324e of the nearest first branch electrode 324a. In consideration of transmittance, the orthogonal projection gap W1 falls within the following range: 0 μm<W1≤4 μm, preferably about 1 μm≤W1≤3 μm, and most preferably about 2 μm. Besides, the orthogonal projection distance W2 is between the orthogonal projection edge 322e of the block-shaped electrode 322 and the orthogonal projection edge 342e of the block-shaped protrusion pattern 342. In consideration of transmittance, the orthogonal projection distance W2 falls within the following range: 2 μm≤W2≤5.5 μm, preferably 1 μm<W2≤6 μm. The cross-sectional views of said components, the orthogonal projection gap W1, and the orthogonal projection distance W2 are shown in FIG. 7.

Specifically, the interval between the block-shaped electrode 322 and the first branch electrode 324a of the first branch electrodes 324 (i.e. 3241) of the pixel structure is located on the block-shaped protrusion pattern 340 of the passivation layer 342 and is not located in the groove (not marked) of the branch protrusion pattern 344 (including the first and second branch protrusion patterns 3441 and 3442) of the passivation layer 340, which is shown in FIG. 7. The depth d (can be refer to FIG. 7) of each groove (not marked) of the first and second branch protrusion patterns 3441 and 3442 is not limited in the present embodiment. Therefore, the issue of the unstably tilted liquid crystal caused by the insufficient depth d of each groove in the passivation layer 340 can be prevented in the pixel structure; what is more, the efficiency of liquid crystal corresponding to the region (referred to as W2) may be enhanced in the pixel structure described in the present embodiment, and the dark-state light leakage caused by the tapered sidewalls can be reduced in the pixel structure constituted by parts of the branch protrusion patterns 344 and the grooves of the passivation layer 340; as a result, the resultant display panel can have favorable transmittance and contrast.

Figure 17:
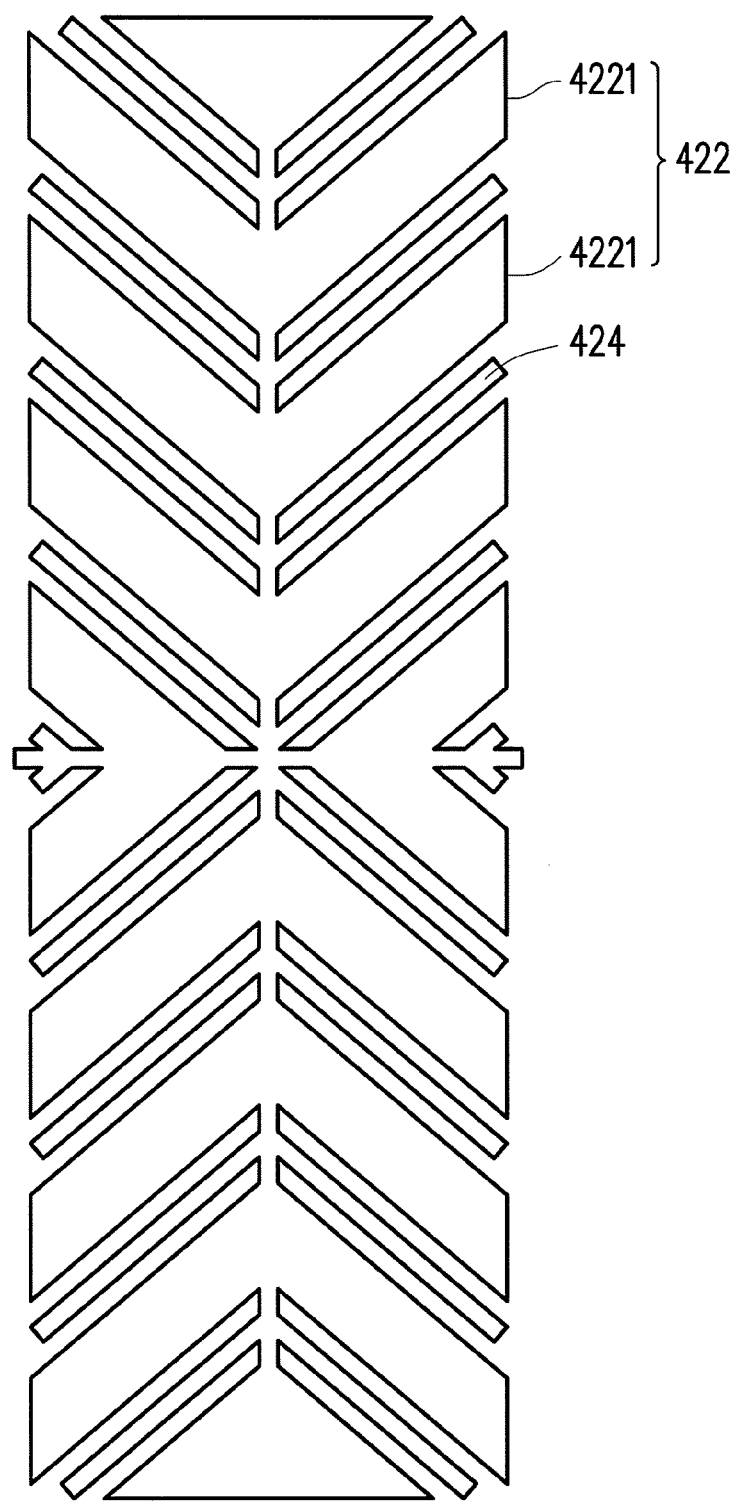
FIG. 17 is a schematic top view illustrating a pixel electrode in a pixel structure according to a fourth embodiment of the disclosure.
Figure 18:
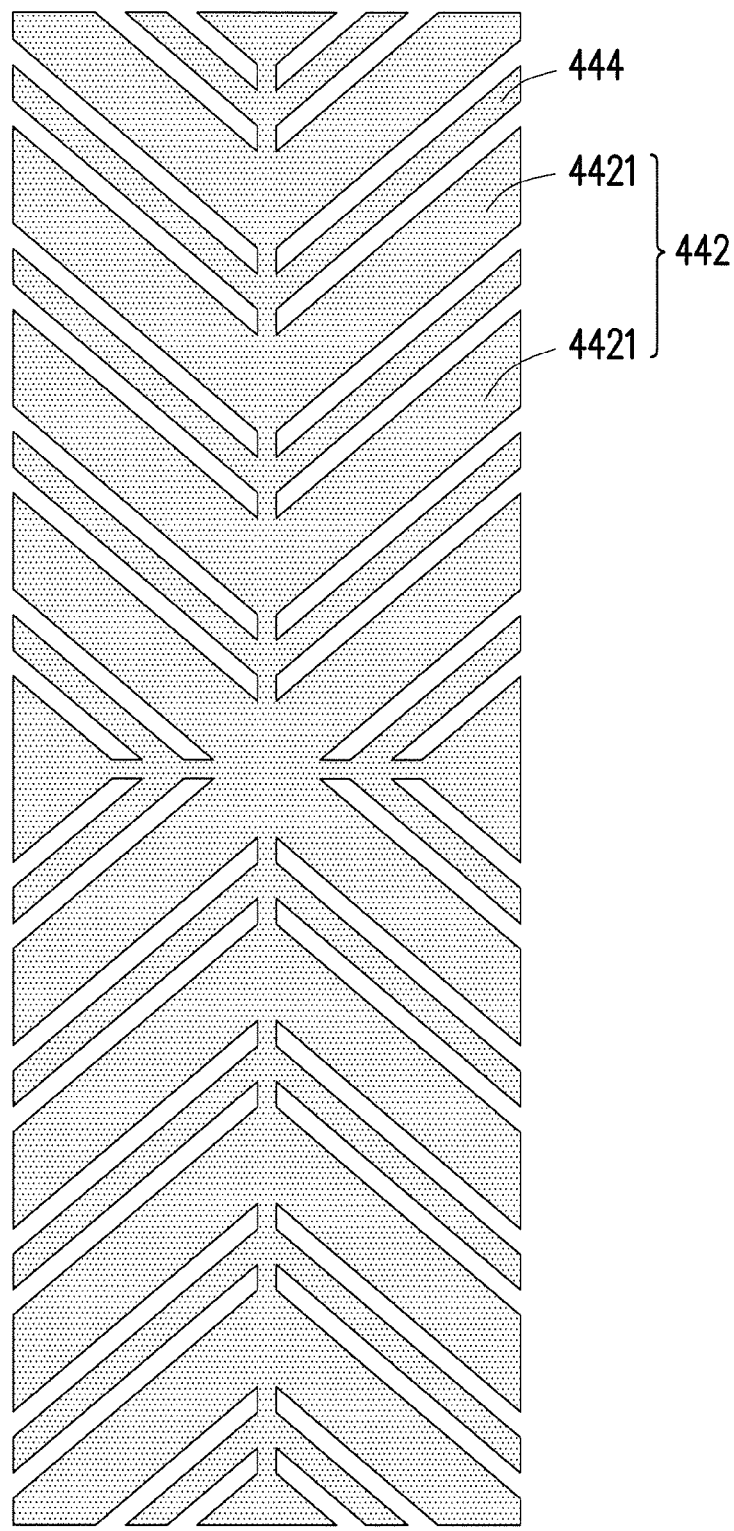
FIG. 18 is a schematic top view illustrating a passivation layer below the pixel electrode depicted in FIG. 17.
Figure 19:
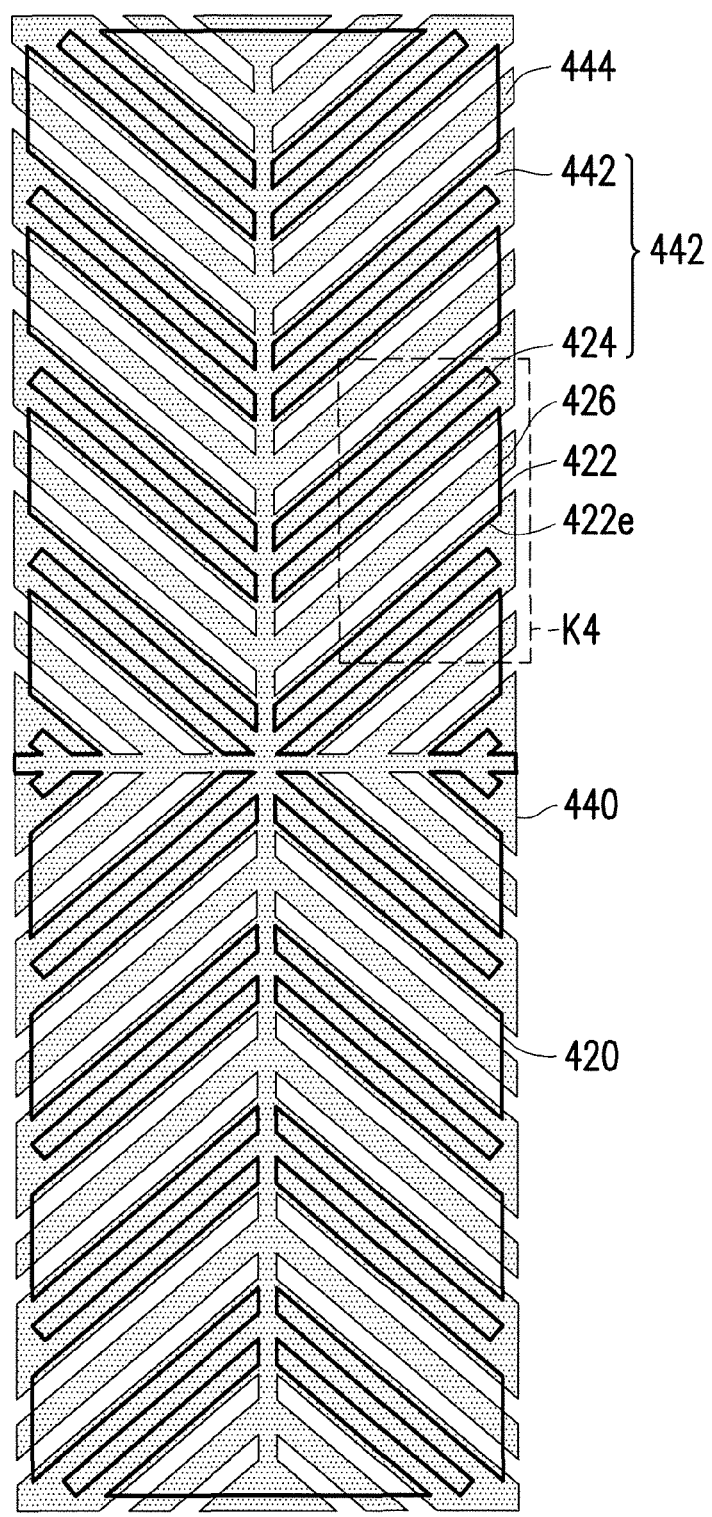
FIG. 19 is a schematic view illustrating that the pixel electrode depicted in FIG. 17 and the passivation layer depicted in FIG. 18 are overlapped.

FIG. 17 is a schematic top view illustrating a pixel electrode in a pixel structure according to a fourth embodiment of the disclosure. FIG. 18 is a schematic top view illustrating a passivation layer below the pixel electrode depicted in FIG. 17. FIG. 19 is a schematic view illustrating that the pixel electrode depicted in FIG. 17 and the passivation layer depicted in FIG. 18 are overlapped. As shown in FIG. 17, the pixel electrode 420 has at least one block-shaped electrode 422 and a plurality of first branch electrodes 424. The block-shaped electrode 422 includes a plurality of sub-block-shaped electrodes 4221. Particularly, the sub-block-shaped electrodes 4221 of the block-shaped electrode (i.e., the plate electrode) 422 are electrode regions in the pixel electrode 420 and are not patterned; that is, the sub-block-shaped electrodes (i.e., the sub-plate electrodes) 4221 do not have any opening, hole, interval, groove, and gap. By contrast, the first branch electrodes 424 are electrode regions in the pixel electrode 420 and are patterned. Note that only one of the first branch electrodes 424 is located between two adjacent sub-block-shaped electrodes 4221 according to the present embodiment, which should however not be construed as a limitation to the disclosure. The first branch electrodes 424 may be connected to a main electrode (i.e., a main-truck electrode, not marked), and an interval (i.e., a slit or a gap, not marked) may be between each of the first branch electrodes 424 and adjacent electrode (e.g., the sub-block-shaped electrode 4221 or another first branch electrode 424). Two adjacent block-shaped electrodes 422 are neither in direct contact with nor directly connected to each other. The orthogonal projection of each sub-block-shaped electrode 4221 has a polygonal shape; in the present embodiment, each sub-block-shaped electrode 4221 is shaped in a zigzag manner, which should however not be construed as a limitation to the disclosure. The outer contours of the orthogonal projections of the first branch electrodes 424 and the block-shaped electrode 422 may be collectively shaped in other manners, e.g., shaped as a rectangle or shaped in a zigzag manner, which should not be construed as a limitation to the disclosure.

With reference to FIG. 18, the passivation layer 440 has at least one block-shaped protrusion pattern (i.e., at least one plate protrusion pattern or at least one plate pattern) 442 and a plurality of branch protrusion patterns 444. As shown in FIG. 18, each block-shaped protrusion pattern 442 of the passivation layer 440 further includes a plurality of sub-block-shaped protrusion patterns (i.e., sub-plate protrusion patterns or sub-plate patterns) 4421. Note that only one of the branch protrusion patterns 444 is located between two adjacent sub-block-shaped protrusion patterns 4421 according to the present embodiment. A groove (not marked) may be between each branch protrusion pattern 444 and the adjacent patterns (e.g., the sub-block-shaped protrusion pattern 4421 or another branch protrusion pattern 444). Two adjacent sub-block-shaped protrusion patterns 4421 are neither in direct contact with nor directly connected to each other. Particularly, the block-shaped protrusion pattern 442 and the sub-block-shaped protrusion patterns 4421 are protrusion regions occupying a rather large area of the passivation layer 440 and are not patterned; that is, the block-shaped protrusion pattern 442 and the sub-block-shaped protrusion patterns 4421 do not have any opening, hole, slit, groove, and gap. Where the branch protrusion patterns 444 and the grooves (not marked) are formed are undulated regions (i.e., regions that protrude upward and are recessed downward or concavo-convex regions) in the passivation layer 440. In the present embodiment, the branch protrusion patterns 444 are connected to main protrusion pattern (not marked). Note that the orthogonal projection of each block-shaped protrusion pattern 442 shaped in a zigzag manner or shaped as a letter X can serve to distinguish the main protrusion patterns in two different directions from each other and specify the intersection of the two directions.

FIG. 19 is a schematic view illustrating that the pixel electrode 420 depicted in FIG. 17 and the passivation layer 440 depicted in FIG. 18 are overlapped. With reference to FIG. 17 to FIG. 19, the pixel electrode 420 is formed above the passivation layer 440, and the block-shaped electrodes 422 of the pixel electrode 420 conformally cover the branch protrusion patterns 444 of the passivation layer 440, such that the block-shaped electrodes 422 protrude upward based on the branch protrusion patterns 444 and are recessed downward based on the grooves (not marked), so as to form a plurality of second branch electrodes 426. The first branch electrodes 424 of the pixel electrode 420 are located on the block-shaped protrusion pattern 442 of the passivation layer 440. The edge 422e of the block-shaped electrode 422 of the pixel electrode 420 further extends to the block-shaped protrusion pattern 442 of the passivation layer 440.

Figure 20:
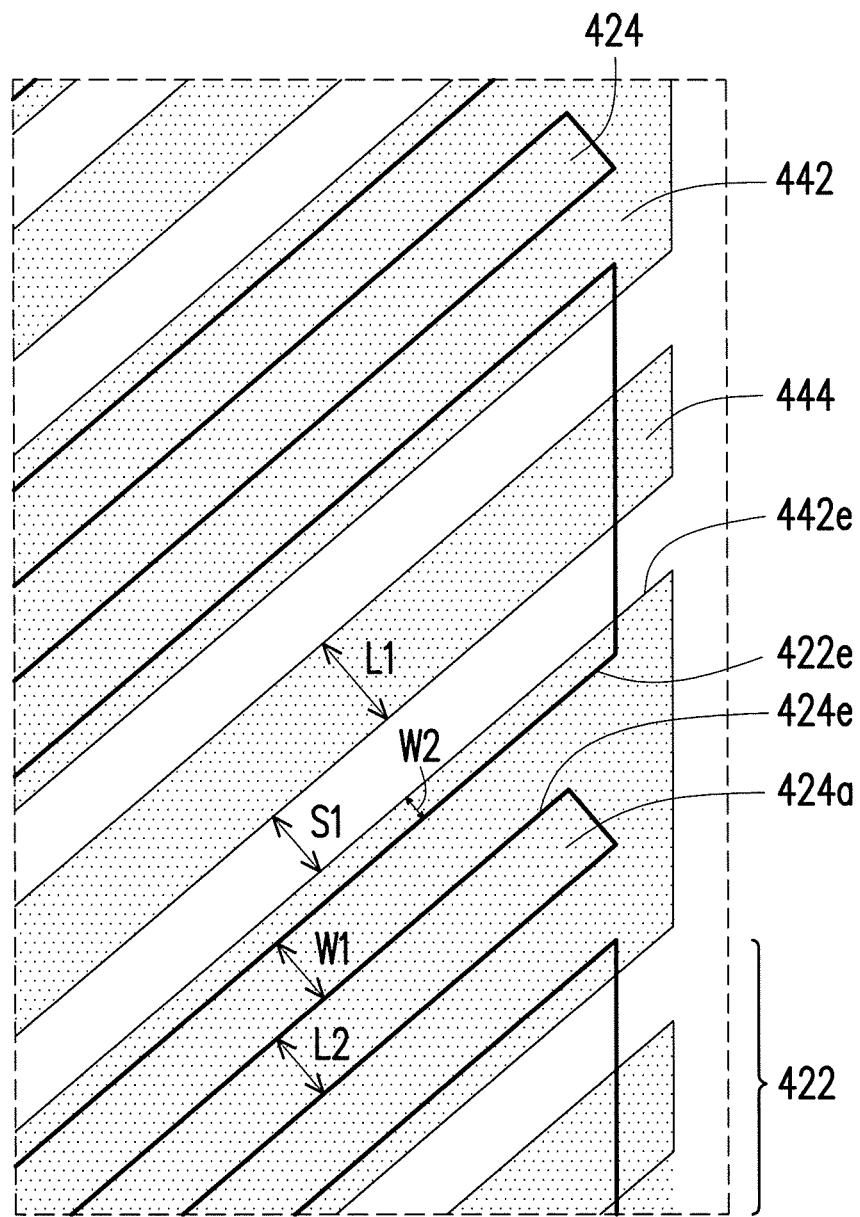
FIG. 20 is a schematic enlarged view illustrating the K4 region depicted in FIG. 19.

FIG. 20 is a schematic enlarged view illustrating the K4 region depicted in FIG. 19. With reference to FIG. 19 and FIG. 20, the width L1 of each of the branch protrusion patterns 444 ranges from about 1 µm to about 10 µm, preferably ranges from about 2 µm to about 6 µm. Besides, the interval (i.e., the gap or the slit) S1 between each of the branch protrusion patterns 444 and the block-shaped protrusion pattern 442 ranges from about 1 µm to about 10 µm, preferably ranges from about 2 µm to about 6 µm. Here, the interval S1 may be deemed as the width of the groove (not marked). The width L2 of each of the first branch electrodes 424 ranges from about 1 µm to about 10 µm, preferably ranges from about 2 µm to about 6 µm. But adjusting the widths L1 and L2 as well as the interval S1, the tilting direction of the liquid crystal molecules may be adjusted.

As shown in FIG. 20, similarly, the first branch electrodes 424 of the pixel electrode 420 are located on the block-shaped protrusion pattern 442 of the passivation layer 440. Note that the orthogonal projection gap W1 is between the orthogonal projection edge 422e of the block-shaped electrode 422 and the orthogonal projection edge 424e of the nearest first branch electrode 424a. In consideration of transmittance, the orthogonal projection gap W1 falls within the following range: 0 µm<W1≤4 µm, preferably 1 µm≤W1≤3 µm, and more preferably about 2 µm. In the present embodiment, only one of the first branch electrodes 424 is located between two adjacent sub-block-shaped electrodes 4221, and thus the orthogonal projection gap W1 may be considered as the width of the slit between two adjacent electrodes. Besides, the orthogonal projection distance W2 is between the orthogonal projection edge 422e of the block-shaped electrode 422 and the orthogonal projection edge 442e of the block-shaped protrusion pattern 442. In consideration of transmittance, the orthogonal projection distance W2 falls within the following range: 2 µm≤W2≤5.5 µm, most preferably 1 µm<W2≤3 µm. The cross-sectional views of said components, the orthogonal projection gap W1, and the orthogonal projection distance W2 are shown in FIG. 7.

Specifically, the interval between the block-shaped electrode 422 and the first one 424a of the first branch electrodes of the pixel structure is located on the block-shaped protrusion pattern 442 of the passivation layer 440 and is not located in the groove (not marked) of the branch protrusion pattern 444 of the passivation layer 440, which can still be observed in FIG. 7. The depth d (can be refer to FIG. 7) of each groove (not marked) of the branch protrusion pattern 444 is not limited in the present embodiment. Therefore, the issue of the unstably tilted liquid crystal caused by the insufficient depth d of each groove in the passivation layer 440 can be prevented in the pixel structure; what is more, the efficiency of liquid crystal corresponding to the region (referred to as W2) may be enhanced in the pixel structure described in the present embodiment, and the dark-state light leakage caused by the tapered sidewalls can be reduced in the pixel structure constituted by parts of the branch protrusion patterns 444 and the grooves of the passivation layer 440; as a result, the resultant display panel can have favorable transmittance and contrast.

Figure 21:
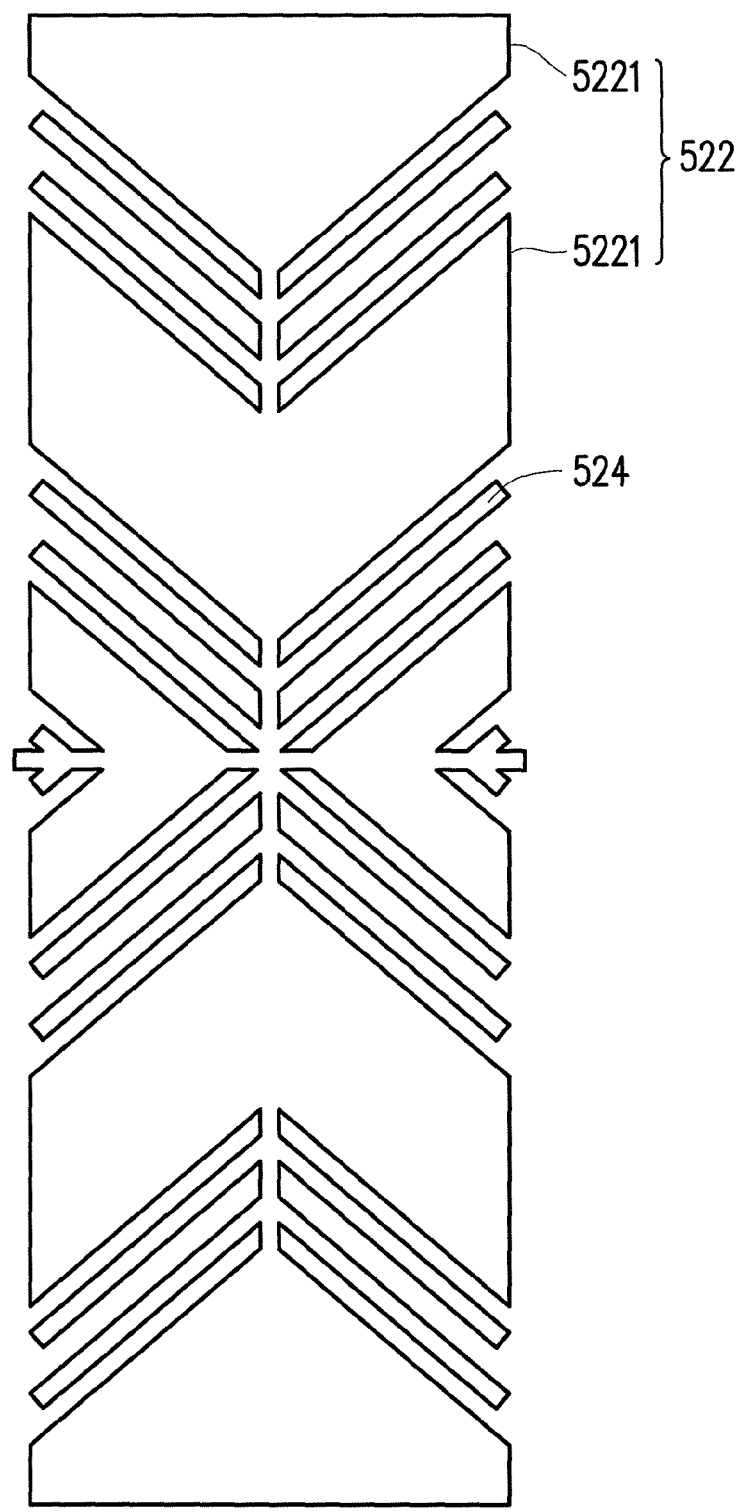
FIG. 21 is a schematic top view illustrating a pixel electrode in a pixel structure according to a fifth embodiment of the disclosure.
Figure 22:
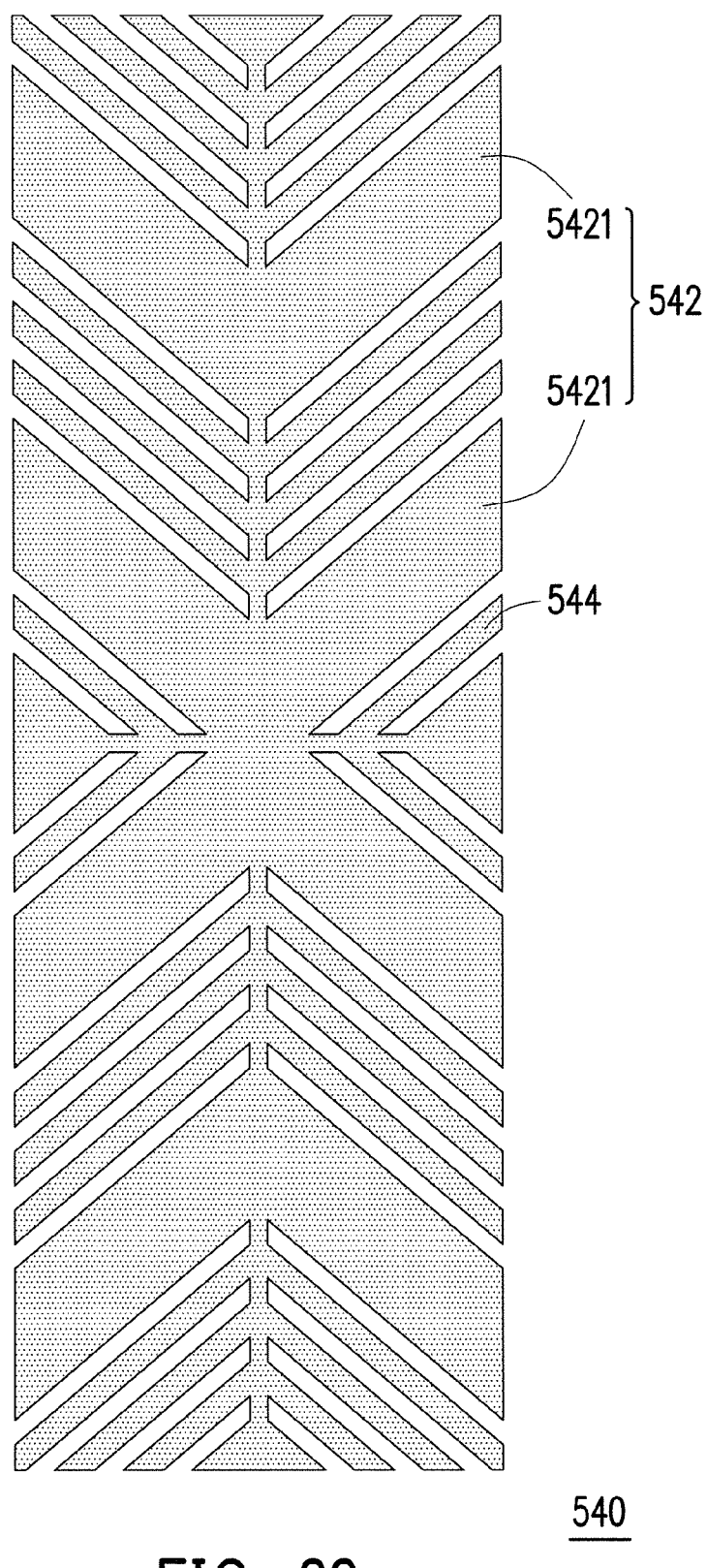
FIG. 22 is a schematic top view illustrating a passivation layer below the pixel electrode depicted in FIG. 21.
Figure 23:
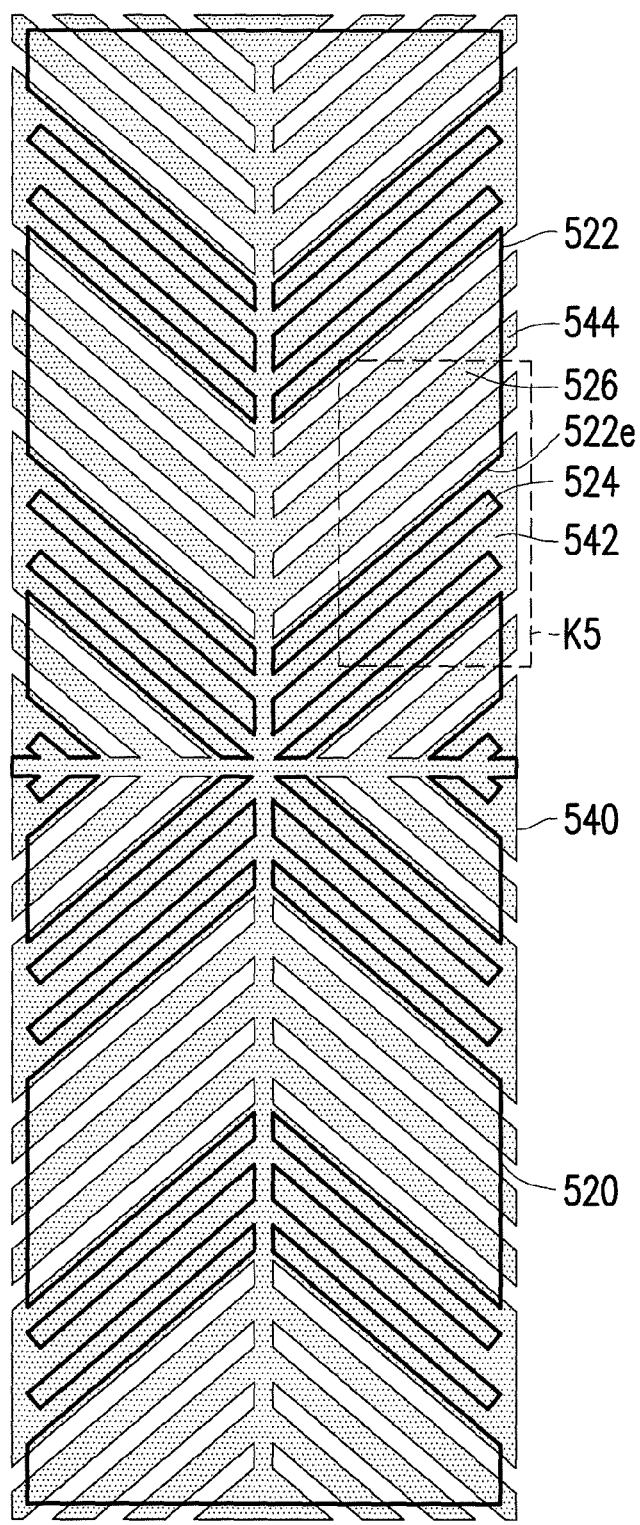
FIG. 23 is a schematic view illustrating that the pixel electrode depicted in FIG. 21 and the passivation layer depicted in FIG. 22 are overlapped.

FIG. 21 is a schematic top view illustrating a pixel electrode in a pixel structure according to a fifth embodiment of the disclosure. FIG. 22 is a schematic top view illustrating a passivation layer below the pixel electrode depicted in FIG. 21. FIG. 23 is a schematic view illustrating that the pixel electrode depicted in FIG. 21 and the passivation layer depicted in FIG. 22 are overlapped. As shown in FIG. 21, the pixel electrode 520 has at least one block-shaped electrode (i.e., at least one plate electrode) 522 and a plurality of first branch electrodes 524. The block-shaped electrode 522 includes a plurality of sub-block-shaped electrodes (i.e., a plurality of sub-plate electrodes) 5221. The sub-block-shaped electrodes 5221 are electrode regions in the pixel electrode 520 and are not patterned; that is, the sub-block-shaped electrodes 4221 and the block-shaped electrode 522 do not have any opening, hole, slit, groove, and gap. By contrast, the first branch electrodes 524 are electrode regions in the pixel electrode 520 and are patterned. Note that the pixel electrode 520 shown in FIG. 21 is similar to the pixel electrode 420 shown in FIG. 17 are similar to each other, and the similar components in these two pixel electrodes 520 and 420 are described in the fourth embodiment and thus will not be further provided hereinafter. The difference between the two embodiments lies in that two of the first branch electrodes 524 are located between two adjacent sub-block-shaped electrodes 5221 according to the present embodiment, which should however not be construed as a limitation to the disclosure.

With reference to FIG. 22, the passivation layer 540 has at least one block-shaped protrusion pattern (i.e., at least one plate-shaped protrusion pattern or at least one plate pattern) 542 and a plurality of branch protrusion patterns 544. As shown in FIG. 22, each block-shaped protrusion pattern 542 of the passivation layer 540 further includes a plurality of sub-block-shaped protrusion patterns (i.e., a plurality of sub-plate-shaped protrusion patterns or a plurality of sub-plate patterns) 5421. Note that the passivation layer 540 shown in FIG. 22 is similar to the passivation layer 440 shown in FIG. 18 are similar to each other, and the similar components in these two passivation layers 540 and 440 are described in the fourth embodiment and thus will not be further provided hereinafter. The difference between the two embodiments lies in that at least one of the branch protrusion patterns 544 is located between two adjacent sub-block-shaped protrusion patterns 5421, as shown in FIG. 22. According to the present embodiment, three branch protrusion patterns 544 are exemplarily located between two adjacent sub-block-shaped protrusion patterns 5421.

FIG. 23 is a schematic view illustrating that the pixel electrode 520 depicted in FIG. 21 and the passivation layer 540 depicted in FIG. 22 are overlapped. With reference to FIG. 21 to FIG. 23, the pixel electrode 520 is formed above the passivation layer 540, and the block-shaped electrodes 522 of the pixel electrode 520 conformally cover the branch protrusion patterns 544 of the passivation layer 540, such that the block-shaped electrodes 522 protrude upward based on the branch protrusion patterns 544 and are recessed downward based on the grooves (not marked), so as to form a plurality of second branch electrodes 526. The first branch electrodes 524 of the pixel electrode 520 are located on the block-shaped protrusion pattern 542 of the passivation layer 540. The edge 522e of the block-shaped electrode 522 of the pixel electrode 520 further extends to the block-shaped protrusion pattern 542 of the passivation layer 540.

Figure 24:
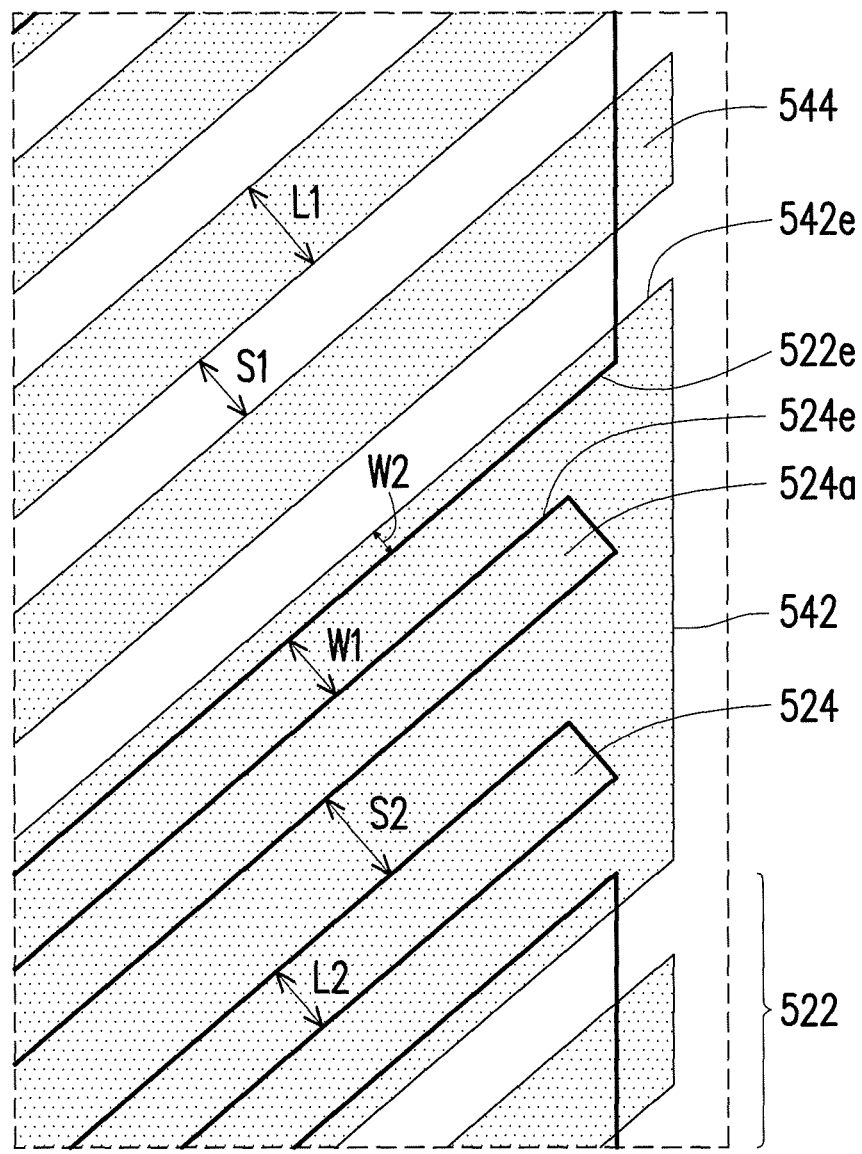
FIG. 24 is a schematic enlarged view illustrating the K5 region depicted in FIG. 23.

FIG. 24 is a schematic enlarged view illustrating the K5 region depicted in FIG. 23. With reference to FIG. 23 and FIG. 24, the width L1 of each of the branch protrusion patterns 544 ranges from about 1 µm to about 10 µm, preferably ranges from about 2 µm to about 6 µm. Besides, the interval (i.e., the gap or the slit) S1 between the branch protrusion patterns 544 ranges from about 1 µm to about 10 µm, preferably ranges from about 2 µm to about 6 nm. Here, the interval S1 may be deemed as the width of the groove (not marked). The width L2 of each of the first branch electrodes 524 ranges from about 1 µm to about 10 µm, preferably ranges from about 2 µm to about 6 µm. Besides, the interval (i.e., the gap or the slit) S2 between the first branch electrodes 524 ranges from about 1 µm to about 10 µm, preferably ranges from about 2 µm to about 6 µm. Here, the interval S2 may be deemed as the width of the slit (not marked). But adjusting the widths L1 and L2 as well as the intervals S1 and S2, the tilting direction of the liquid crystal molecules may be adjusted.

As shown in FIG. 24, similarly, the first branch electrodes 524 of the pixel electrode 520 are located on the block-shaped protrusion pattern 542 of the passivation layer 540. Note that the orthogonal projection gap W1 is between the orthogonal projection edge 522e of the block-shaped electrode 522 and the orthogonal projection edge 524e of the nearest first branch electrode 524a. In consideration of transmittance, the orthogonal projection gap W1 falls within the following range: 0 µm<W1≤4 µm, preferably 1 µm≤W1≤3 µm, and most preferably about 2 µm. Besides, the orthogonal projection distance W2 is between the orthogonal projection edge 522e of the block-shaped electrode 522 and the orthogonal projection edge 542e of the block-shaped protrusion pattern 542. In consideration of transmittance, the orthogonal projection distance W2 falls within the following range: 2 µm≤W2≤5.5 µm, preferably 3 µm. The cross-sectional views of said components, the orthogonal projection gap W1, and the orthogonal projection distance W2 are shown in FIG. 7.

Specifically, the interval (i.e., the gap or the boundary) between the block-shaped electrode 522 and the first one of first branch electrodes 524a of the pixel structure is located on the block-shaped protrusion pattern 542 of the passivation layer 540 and is not located in the groove (not marked) of the branch protrusion pattern 544 of the passivation layer 540, which can still be observed in FIG. 7. The depth d of each groove (not marked) of the branch protrusion pattern 544 is not limited in the present embodiment. Therefore, the issue of the unstably tilted liquid crystal caused by the insufficient depth d of each groove in the passivation layer 540 can be prevented in the pixel structure; what is more, the efficiency of liquid crystal corresponding to the region (referred to as W2) may be enhanced in the pixel structure described in the present embodiment, and the dark-state light leakage caused by the tapered sidewalls can be reduced in the pixel structure constituted by parts of the branch protrusion patterns 544 and the grooves of the passivation layer 540; as a result, the resultant display panel can have favorable transmittance and contrast.

Figure 25:
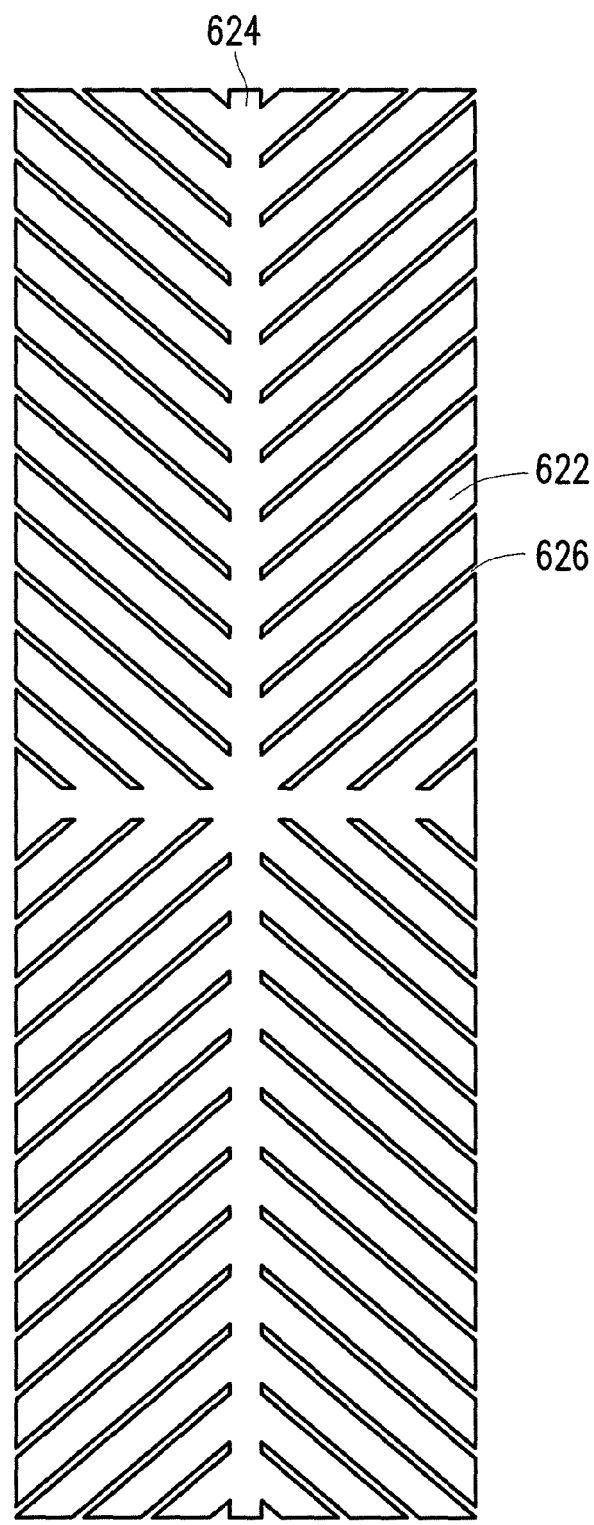
FIG. 25 is a schematic top view illustrating a pixel electrode in a pixel structure according to a sixth embodiment of the disclosure.
Figure 26:
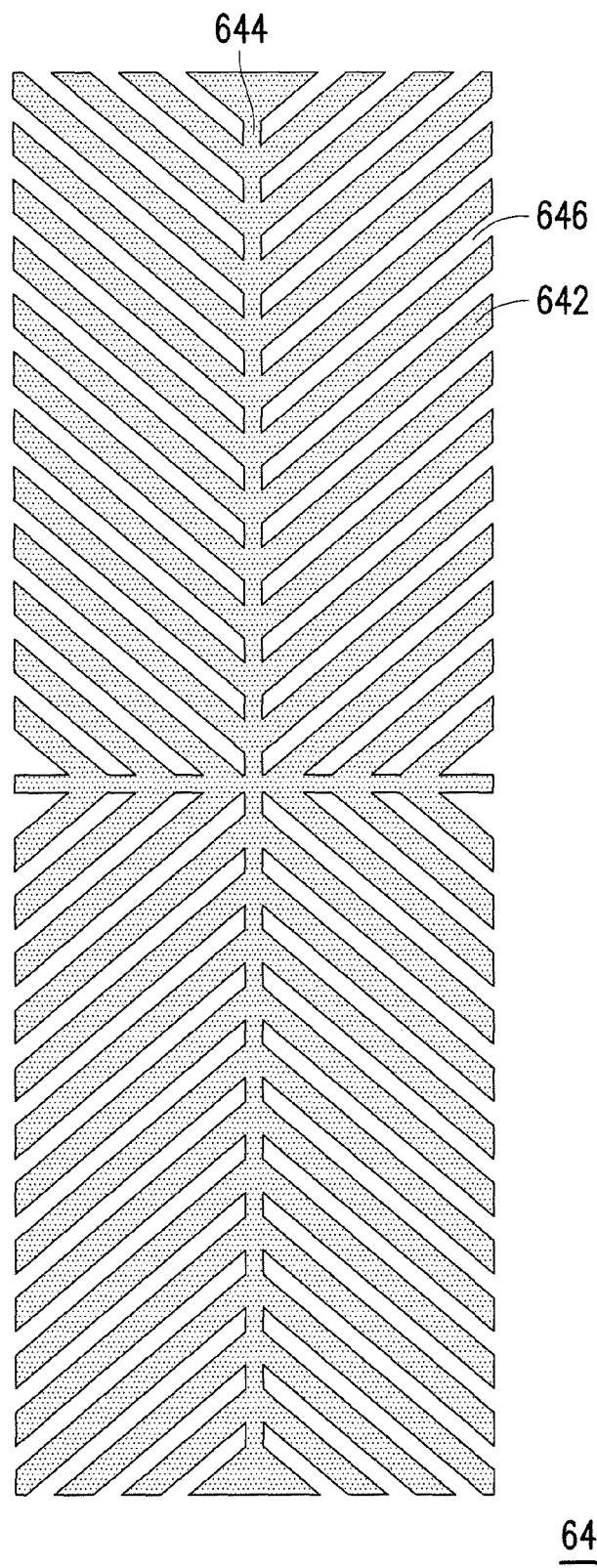
FIG. 26 is a schematic top view illustrating a passivation layer below the pixel electrode depicted in FIG. 25.
Figure 27:
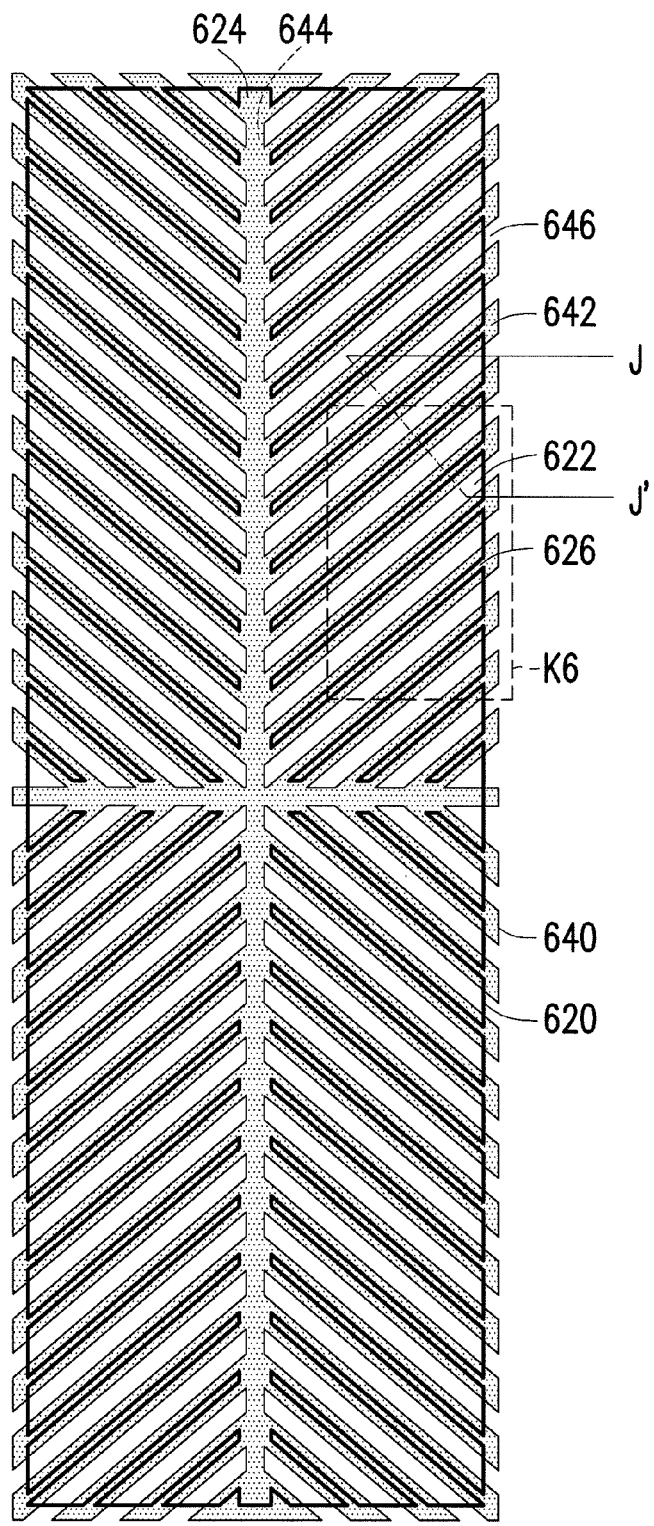
FIG. 27 is a schematic view illustrating that the pixel electrode depicted in FIG. 25 and the passivation layer depicted in FIG. 26 are overlapped.

FIG. 25 is a schematic top view illustrating a pixel electrode in a pixel structure according to a sixth embodiment of the disclosure. FIG. 26 is a schematic top view illustrating a passivation layer below the pixel electrode depicted in FIG. 25. FIG. 27 is a schematic view illustrating that the pixel electrode depicted in FIG. 25 and the passivation layer depicted in FIG. 26 are overlapped. As shown in FIG. 25, the pixel electrode 620 has a plurality of branch electrodes 622 and a main electrode (i.e., a main-truck electrode) 624. An interval (i.e., a slit) 626 is between two adjacent branch electrodes 622. The branch electrodes 622 are connected to the main electrode 624 and extend along a plurality of directions from the main electrode 624. Note that the main electrode 624 is shaped as a crisscross in the present embodiment, while the disclosure is not limited thereto.

As shown in FIG. 26, the passivation layer 640 has a plurality of branch protrusion patterns 642 and a main protrusion pattern (i.e., a main-truck protrusion pattern) 644. A groove (i.e., a recess) 646 is between two adjacent branch protrusion patterns 642. The branch protrusion patterns 642 are connected to the main protrusion pattern 644 and extend along a plurality of directions from the main protrusion pattern 644. Note that the main protrusion pattern 644 is shaped as a crisscross in the present embodiment, while the disclosure is not limited thereto.

FIG. 27 is a schematic view illustrating that the pixel electrode 620 depicted in FIG. 25 and the passivation layer 640 depicted in FIG. 26 are overlapped. With reference to FIG. 25 to FIG. 27, the pixel electrode 620 is formed above the passivation layer 640, each one of the branch electrodes 622 of the pixel electrode 620 is arranged corresponding to one of the grooves 646 of the passivation layer 640, and each one of the intervals 626 of the pixel electrode 620 is arranged corresponding to one of the branch protrusion patterns 642 of the passivation layer 640. Each of the branch electrodes 622 extends from one of the grooves 646 to two adjacent branch protrusion patterns 642, and each interval 626 is overlapped with two adjacent branch protrusion patterns 642; however, the disclosure is not limited thereto. As shown in FIG. 27, the main electrode 624 and the main protrusion pattern 644 are overlapped. It should be mentioned that the intervals 626 of the branch electrodes 622 are located on the branch protrusion patterns 642, and thus the dark lines of the pixel electrode 620 are dimmish. In the present embodiment, the width of the main electrode 624 is substantially greater than the width of the main protrusion pattern 644, for instance; however, the disclosure is not limited thereto.

Figure 28:
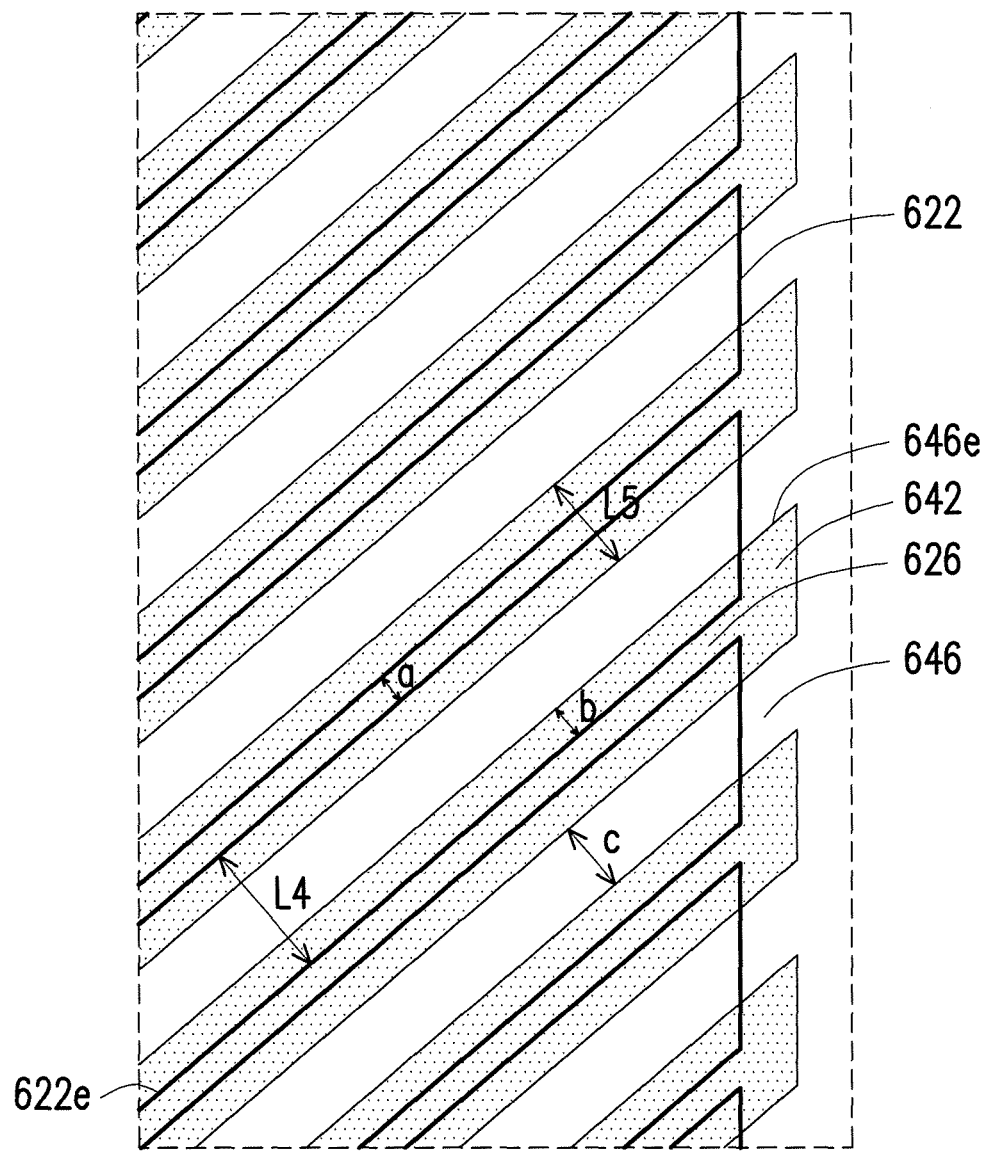
FIG. 28 is a schematic enlarged view illustrating the K6 region depicted in FIG. 27.
Figure 29:
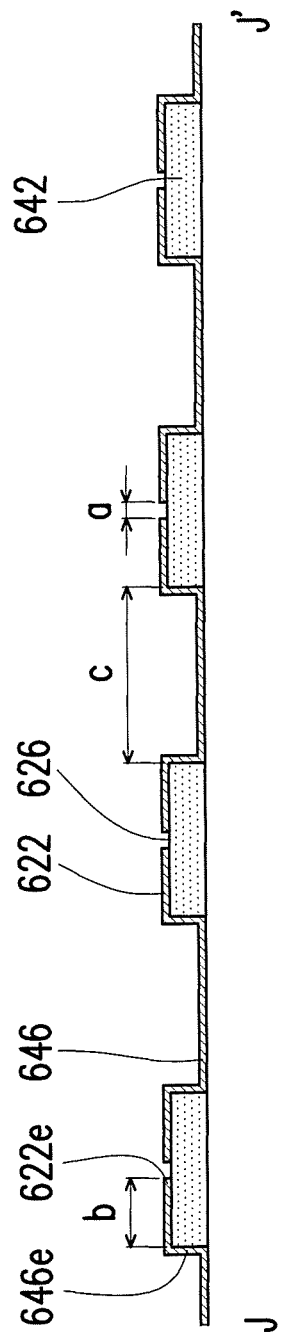
FIG. 29 is a schematic cross-sectional view taken along a line J-J' in FIG. 27.

FIG. 28 is a schematic enlarged view illustrating the K6 region depicted in FIG. 27. FIG. 29 is a schematic cross-sectional view taken along a line J-J' in FIG. 27. With reference to FIG. 27, FIG. 28, and FIG. 29, each interval 626 between two adjacent branch electrodes 622 of the pixel electrode 620 has an orthogonal projection width a, and a≠0. The orthogonal projection width a substantially falls within the following range 0 µm<a≤3 µm; in consideration of transmittance, the most preferable orthogonal projection width a is 2 µm. Nevertheless, the disclosure is not limited thereto. An orthogonal projection distance b is between an orthogonal projection edge 622e of each of the branch electrodes 622 of the pixel electrode 620 and an orthogonal projection edge 646e of each of the grooves 646 of the passivation layer 640, and b≠0. The orthogonal projection distance b substantially falls within the following range 1.5 µm≤b≤10 µm and most preferably 1.5 µm. Nevertheless, the disclosure is not limited thereto. A width of each of the grooves 646 in the passivation layer 640 is c; according to the present embodiment, the width c substantially falls within the following range: 3 µm≤c≤(a+2b)µm.

A width L4 of each of the branch electrodes 622 of the pixel electrode 620 is from about 1 µm to about 10 µm. A width L5 of each of the branch protrusion patterns 642 of the passivation layer 640 is from about 1 µm to about 10 µm. According to the present embodiment, the width c of each groove 646 is substantially identical to the width L5 of each branch protrusion pattern 642; however, the disclosure is not limited thereto. But adjusting the widths L4, L5, and c as well as the distances a and b, the tilting direction of the liquid crystal molecules may be adjusted.

Specially, even if the width of the branch electrode 622 is not small, the alignment stability of the liquid crystal molecules still can be improved. Similarly, the issue of the unstably tilted liquid crystal caused by the insufficient depth of each groove in the passivation layer 640 can be prevented in the pixel structure; what is more, the efficiency of liquid crystal may be improved in the pixel structure described in the present embodiment, and the dark-state light leakage caused by the tapered sidewalls can be reduced in the pixel structure constituted by parts of the branch protrusion patterns 642 of the passivation layer 640; as a result, the resultant display panel can have favorable transmittance and contrast.

Figure 30:
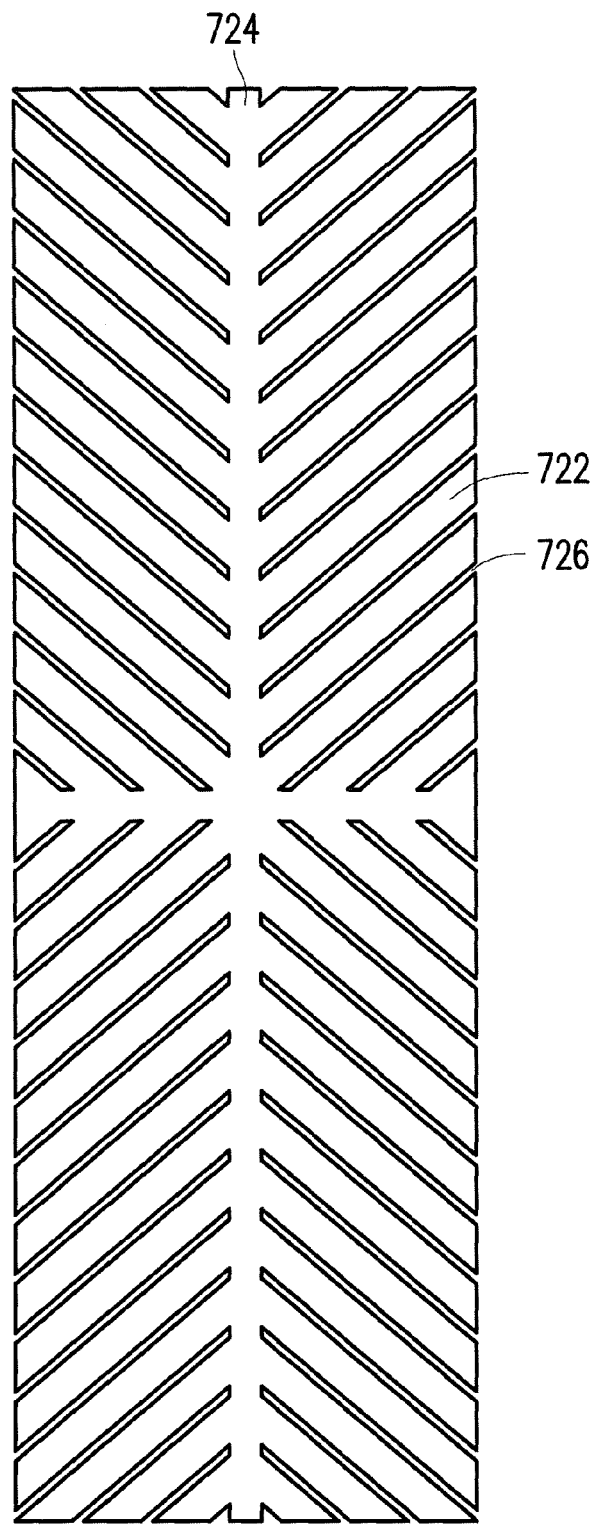
FIG. 30 is a schematic top view illustrating a pixel electrode in a pixel structure according to a seventh embodiment of the disclosure.
Figure 31:
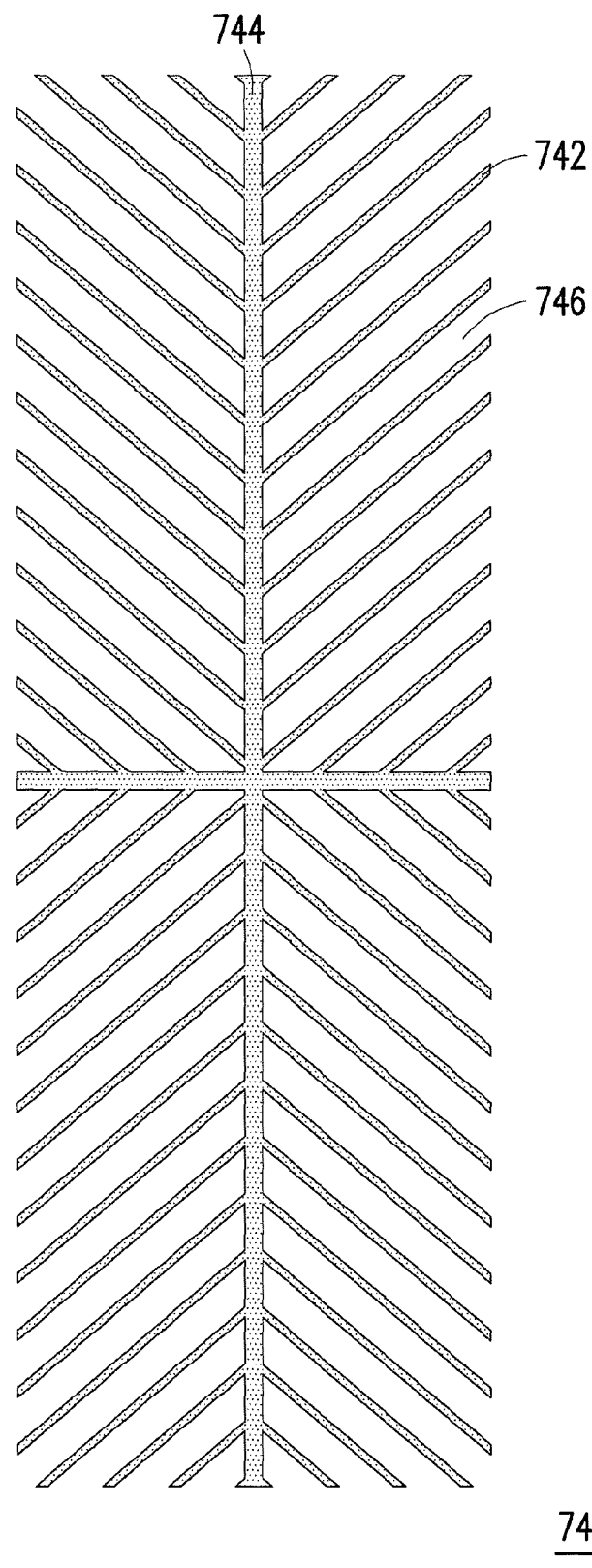
FIG. 31 is a schematic top view illustrating a passivation layer below the pixel electrode depicted in FIG. 30.
Figure 32:
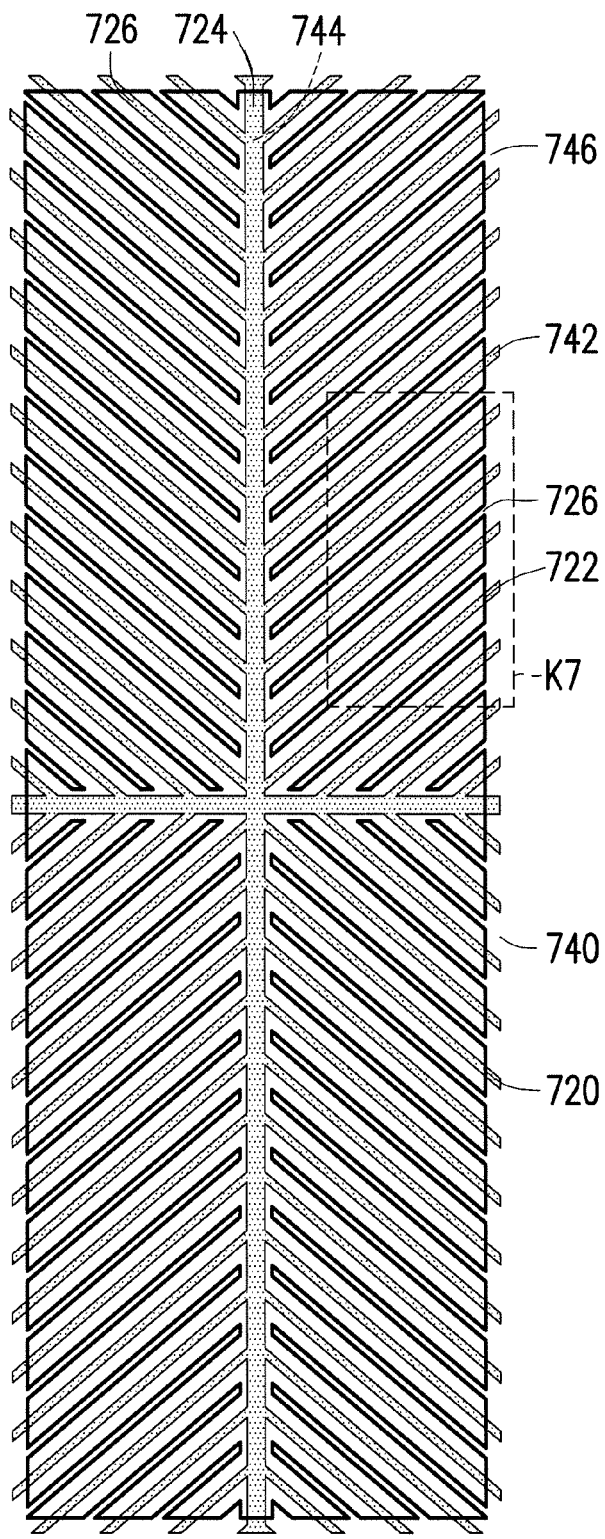
FIG. 32 is a schematic view illustrating that the pixel electrode depicted in FIG. 30 and the passivation layer depicted in FIG. 31 are overlapped.

FIG. 30 is a schematic top view illustrating a pixel electrode in a pixel structure according to a seventh embodiment of the disclosure. FIG. 31 is a schematic top view illustrating a passivation layer below the pixel electrode depicted in FIG. 30. FIG. 32 is a schematic view illustrating that the pixel electrode depicted in FIG. 30 and the passivation layer depicted in FIG. 31 are overlapped. The embodiment shown herein is similar to the embodiment shown in FIG. 27, so that identical or similar components in these figures will be denoted by the same or similar numerals and will not be reiterated herein. As shown in FIG. 30, the pixel electrode 720 has a plurality of branch electrodes 722 and a main electrode (i.e., a main-truck electrode) 724. An interval (i.e., a slit) 722 is between two adjacent branch electrodes 726. The branch electrodes 722 are connected to the main electrode 724 and extend along a plurality of directions from the main electrode 724.

As shown in FIG. 31, the passivation layer 740 has a plurality of branch protrusion patterns 742 and a main protrusion pattern (i.e., a main-truck protrusion pattern) 744. A groove (i.e., a recess) 742 is between two adjacent branch protrusion patterns 746. The branch protrusion patterns 742 are connected to the main protrusion pattern 744 and extend along a plurality of directions from the main protrusion pattern 744.

The difference between the embodiment shown in FIG. 32 and the embodiment shown in FIG. 27 lies in that each of the branch electrodes 722 of the pixel electrode 720 is arranged corresponding to one of the branch protrusion patterns 742 of the passivation layer 740, and each of the intervals 726 of the pixel electrode 720 is arranged corresponding to one of the grooves 746 of the passivation layer 740. Each of the branch electrodes 722 extends from one of the branch protrusion patterns 742 to two adjacent grooves 746, and each interval 726 is overlapped with the two adjacent grooves 746. Similarly, the main electrode 724 and the main protrusion pattern 744 are overlapped. In the present embodiment, note that the width of the main electrode 724 is slightly greater than the width of the main protrusion pattern 744, for instance; however, the disclosure is not limited thereto.

Figure 33:
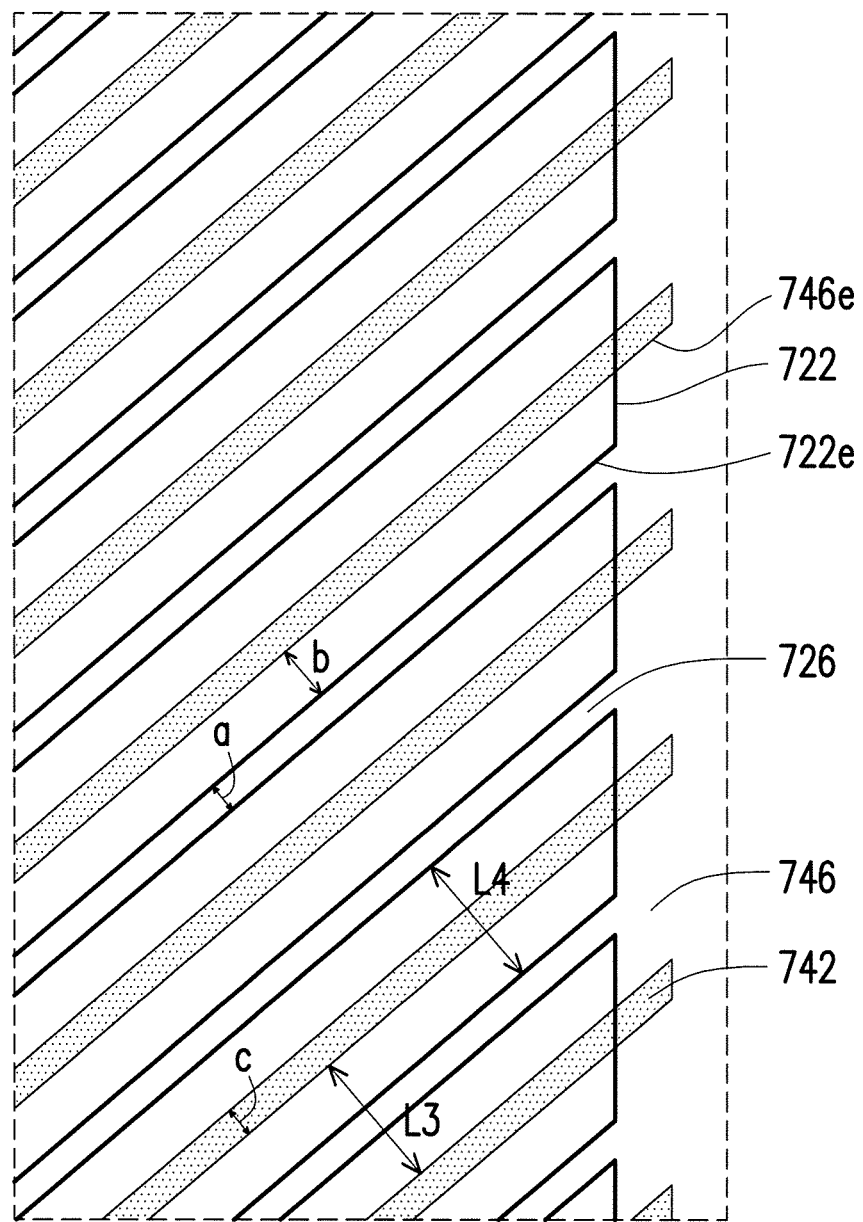
FIG. 33 is a schematic enlarged view illustrating the K7 region depicted in FIG. 32.

FIG. 33 is a schematic enlarged view illustrating the K7 region depicted in FIG. 32. With reference to FIG. 32 and FIG. 33, each interval 726 between two adjacent branch electrodes 722 of the pixel electrode 720 has an orthogonal projection width a, and a≠0. The orthogonal projection width a substantially falls within the following range 0 µm<a≤3 µm; in consideration of transmittance, the most preferable orthogonal projection width is 2 µm. Nevertheless, the disclosure is not limited thereto. An orthogonal projection distance b is between an orthogonal projection edge 722e of each of the branch electrodes 722 of the pixel electrode 720 and an orthogonal projection edge 746e of each of the grooves 746 of the passivation layer 740, and b≠0. The orthogonal projection distance b substantially falls within the following range 1.5 µm≤b≤10 µm and most preferably 1.5 µm. Nevertheless, the disclosure is not limited thereto. A width of each of the grooves 746 in the passivation layer 740 is L3; according to the present embodiment, the width L3 substantially falls within the following range: 3 µm≤L3≤(a+2b)µm.

A width L4 of each of the branch electrodes 722 of the pixel electrode 724 ranges from about 1 µm to about 10 µm. A width c of each of the branch protrusion patterns 742 of the passivation layer 740 ranges from about 1 µm to about 10 µm. But adjusting the widths L4, L3, and c as well as the distances a and b, the tilting direction of the liquid crystal molecules may be adjusted.

Specially, even if the width of the branch electrode 722 is not small, the alignment stability of the liquid crystal molecules still can be improved. Similarly, the issue of the unstably tilted liquid crystal caused by the insufficient depth of each groove in the passivation layer 740 can be prevented in the pixel structure; what is more, the efficiency of liquid crystal corresponding to the region (referred to as b) may be improved in the pixel structure described in the present embodiment, and the dark-state light leakage caused by the tapered sidewalls can be reduced in the pixel structure constituted by parts of the branch protrusion patterns 742 of the passivation layer 740; as a result, the resultant display panel can have favorable transmittance and contrast.

Figure 34:
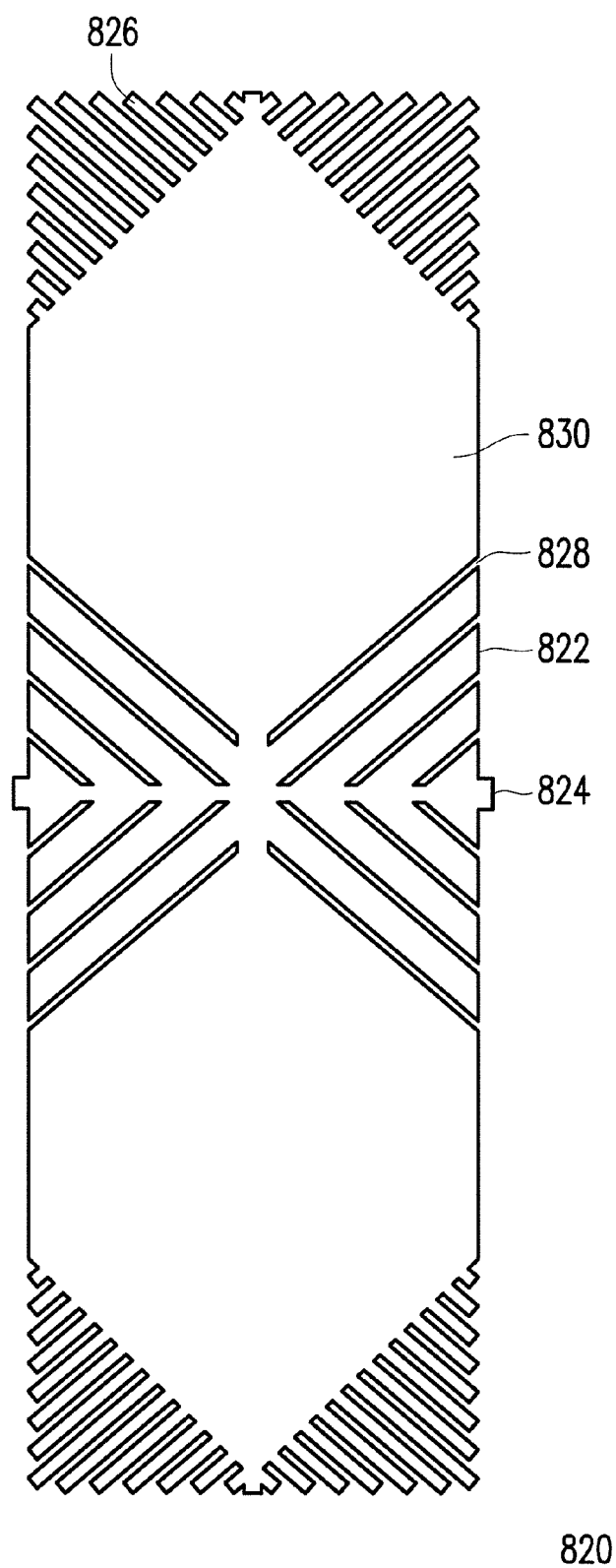
FIG. 34 is a schematic top view illustrating a pixel electrode 820 in a pixel structure according to an eighth embodiment of the disclosure.
Figure 35:
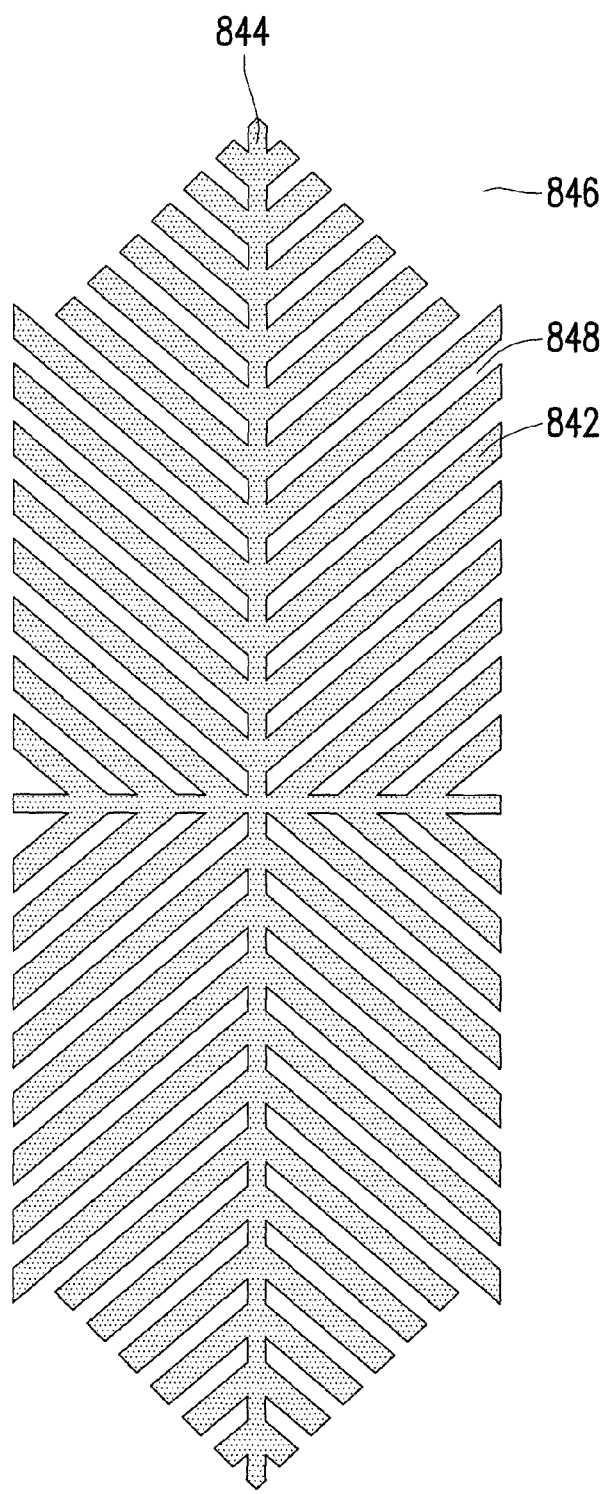
FIG. 35 is a schematic top view illustrating a passivation layer below the pixel electrode depicted in FIG. 34.
Figure 36:
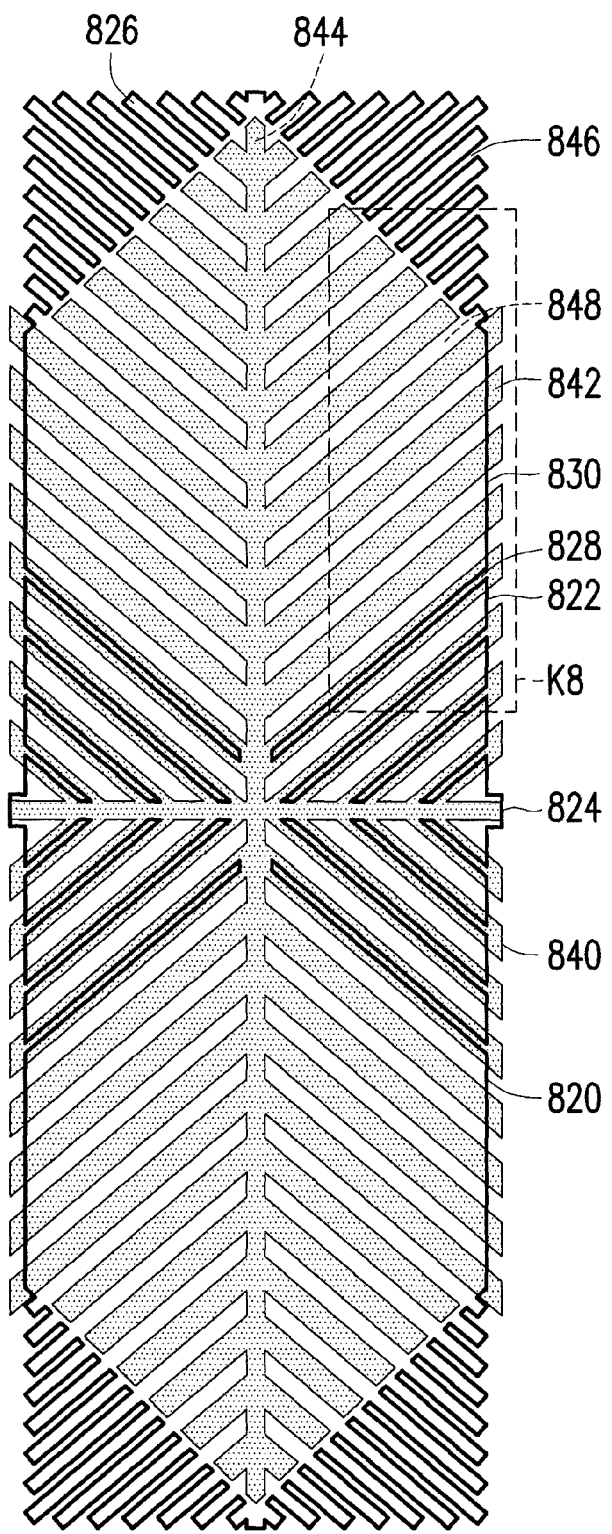
FIG. 36 is a schematic view illustrating that the pixel electrode depicted in FIG. 34 and the passivation layer depicted in FIG. 35 are overlapped.

FIG. 34 is a schematic top view illustrating a pixel electrode 820 in a pixel structure according to an eighth embodiment of the disclosure. FIG. 35 is a schematic top view illustrating a passivation layer below the pixel electrode depicted in FIG. 34. FIG. 36 is a schematic view illustrating that the pixel electrode depicted in FIG. 34 and the passivation layer depicted in FIG. 35 are overlapped. As shown in FIG. 34, the pixel electrode 820 has a plurality of branch electrodes 822, at least one block-shaped electrode 830, a main electrode (i.e., a main-truck electrode) 824, and a plurality of outer branch electrodes 826. An interval (i.e., a slit) 828 is between two adjacent branch electrodes 822. The branch electrodes 822 are connected to the main electrode 824 and extend along a plurality of directions from the main electrode 824. The block-shaped electrode (i.e., the plate-shaped electrode) 830 is an electrode region in the pixel electrode 820 and is not patterned; that is, the block-shaped electrode 830 does not have any opening, hole, slit, groove, and gap. Here, the block-shaped electrodes 830 are located at two sides of the main electrode 824. The first branch electrodes 822 are located on one side of the block-shaped electrodes 830 and are adjacent to edges of the block-shaped electrodes 830. Besides, the first branch electrodes 822 are connected to the main electrode 824. The outer branch electrodes 826 are located on another side of the block-shaped electrodes 830, and the outer branch electrodes 826 extend outwardly in a radial manner along the other edges of the block-shaped electrodes 830. An interval (i.e., a slit or a gap, not marked) is between every two adjacent outer branch electrodes 826. A shown in FIG. 34, the edge of the block-shaped electrodes 830 adjacent to the first branch electrodes 822 are not directly connected to the edge of the block-shaped electrodes 830 connecting outer branch electrodes 826. The orthogonal projection of each block-shaped electrode 830 has a polygonal shape; in the present embodiment, each block-shaped electrode 830 is shaped as a hexagon, which should however not be construed as a limitation to the disclosure. The outer contour of the orthogonal projection of each outer branch electrode 826 and the outer contour of the orthogonal projection of each block-shaped electrode 830 may be collectively shaped as a pentagon. Besides, the outer contours of the orthogonal projections of the first branch electrodes 822, the outer branch electrodes 826, and the block-shaped electrodes 830 may be collectively shaped in other manners, e.g., shaped as a rectangle or shaped in a zigzag manner, which should not be construed as a limitation to the disclosure. The outer branch electrodes 826 are connected to the block-shaped electrodes 830. Note that the main electrode 824 is exemplarily shaped as a crisscross in the present embodiment, while the disclosure is not limited thereto.

As shown in FIG. 35, the passivation layer 840 has a plurality of branch protrusion patterns 842, a main protrusion pattern (i.e., a main-truck protrusion pattern) 844, and at least one block-shaped pattern 846. A groove (i.e., a recess) 848 is between two adjacent branch protrusion patterns 842. The block-shaped pattern (i.e., the plate-shaped pattern) 846 is a recess region (i.e., a groove region) occupying a rather large area of the passivation layer 840 and thus may be called as a plate-shaped recess pattern (i.e., a plate-shaped groove pattern). A thickness of the block-shaped pattern 846 is lower than a thickness of the block-shaped protrusion pattern 842 and a thickness of the main protrusion pattern 844 but may be similar to a thickness of the groove. The branch protrusion patterns 842 are connected to the main protrusion pattern 844 and extend along a plurality of directions from the main protrusion pattern 844. Each groove 848 between every two adjacent branch protrusion patterns 842 is communicated with the block-shaped pattern 846. In addition, according to the present embodiment, four block-shaped patterns 846 are exemplarily located at the outer corners of the branch protrusion patterns 848, for instance, whereas the disclosure is not limited thereto. Note that the main protrusion pattern 844 is exemplarily shaped as a crisscross in the present embodiment, while the disclosure is not limited thereto.

FIG. 36 is a schematic view illustrating that the pixel electrode 820 depicted in FIG. 34 and the passivation layer 840 depicted in FIG. 35 are overlapped. With reference to FIG. 34 to FIG. 36, the pixel electrode 820 is formed above the passivation layer 840, and each one of the branch electrodes 822 of the pixel electrode 820 is arranged correspondingly to one of the grooves 848 of the passivation layer 840. Each of the branch electrodes 822 extends from one of the grooves 848 to two adjacent branch protrusion patterns 842, and each interval 828 is overlapped with two adjacent branch protrusion patterns 842. The outer branch electrodes 826 are arranged on the block-shaped pattern 846 of the passivation layer 840. The block-shaped electrode 830 of the pixel electrode 820 conformally covers parts of the branch protrusion patterns 842 of the passivation layer 840, such that the block-shaped electrode 830 protrudes upward based on the branch protrusion patterns 842 and is recessed downward based on the grooves 848, so as to form a plurality of second branch electrodes (not marked). As shown in FIG. 36, the main electrode 824 and the main protrusion pattern 844 are overlapped. In the present embodiment, note that the width of the main electrode 824 is greater than the width of the main protrusion pattern 844, for instance; however, the disclosure is not limited thereto.

Figure 37:
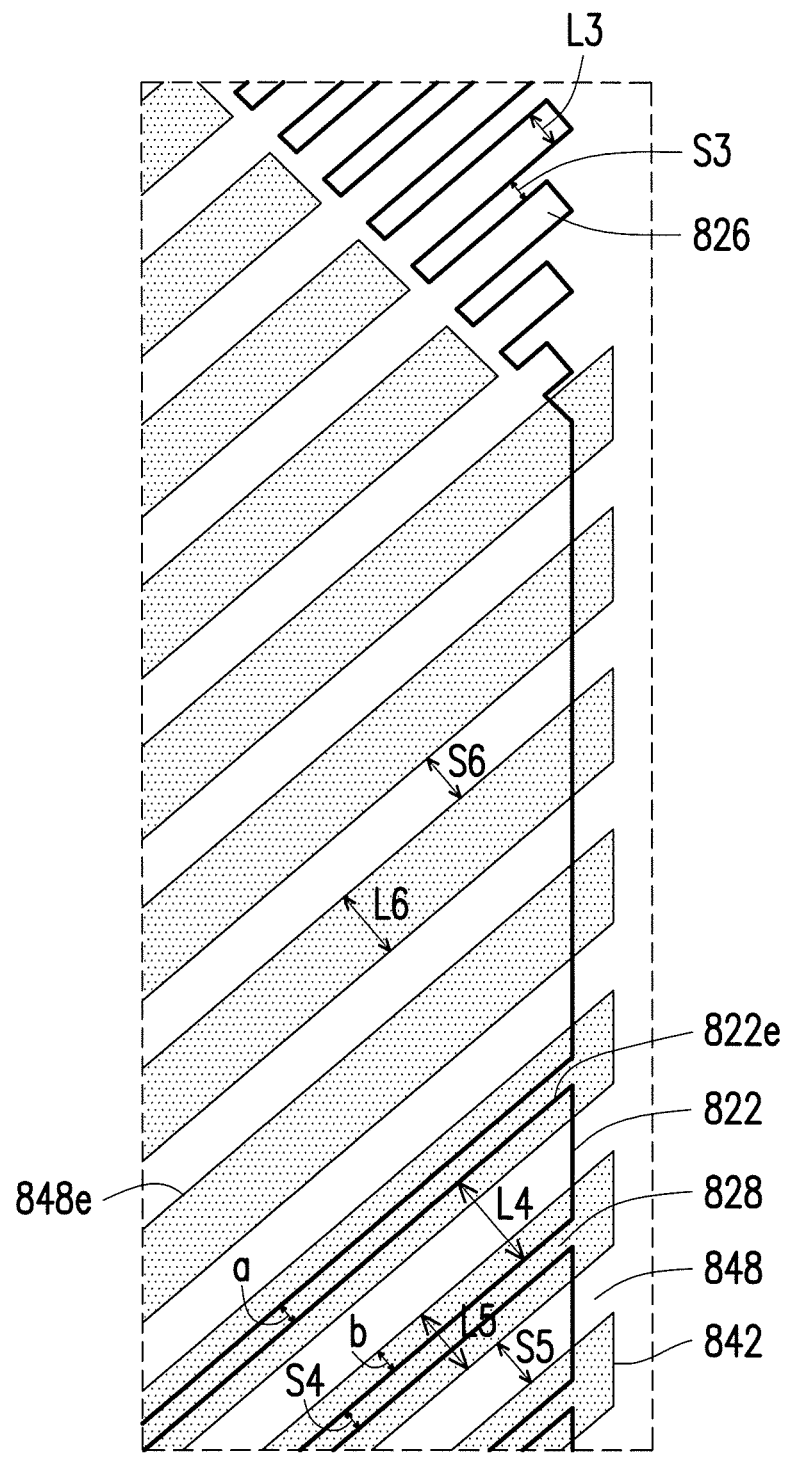
FIG. 37 is a schematic enlarged view illustrating the K8 region depicted in FIG. 36.

FIG. 37 is a schematic enlarged view illustrating the K8 region depicted in FIG. 36. With reference to FIG. 36 and FIG. 37, each interval 828 between two adjacent branch electrodes 822 of the pixel electrode 820 has an orthogonal projection width a, and a≠0. The orthogonal projection width a substantially falls within the following range 0 μm<a≤3 μm; in consideration of transmittance, the most preferable orthogonal projection width a is 2 μm. Nevertheless, the disclosure is not limited thereto. An orthogonal projection distance b is between an orthogonal projection edge 822*e* of each of the branch electrodes 820 of the pixel electrode 822 and an orthogonal projection edge 848*e* of each of the grooves 848 of the passivation layer 840, and b≠0. The orthogonal projection distance b substantially falls within the following range 1.5 μm≤b≤10 μm; in consideration of transmittance, the most preferable orthogonal projection distance b is 1.5 μm. Nevertheless, the disclosure is not limited thereto. A width of each of the grooves 848 in the passivation layer 840 is c; according to the present embodiment, the width c substantially falls within the following range: 3 μm≤c≤(a+2b)μm.

The width L3 of each of the outer branch electrodes 826 of the pixel electrode 820 ranges from about 1 μm to about 10 μm. The interval S3 between the outer branch electrodes 826 ranges from about 1 μm to about 10 μm. The width L4 of each of the branch electrodes 822 ranges from about 1 μm to about 10 μm. The interval S4 between the branch electrodes 822 ranges from about 1 μm to about 10 μm. The width L5 of each of the branch protrusion patterns 842 below the branch electrodes 822 ranges from about 1 μm to about 10 μm. The interval S5 between the branch protrusion patterns 842 below the branch electrodes 822 ranges from about 1 μm to about 10 μm. In other words, the interval S5 is deemed as the width c of each one of grooves 848. The width L6 of each of the branch protrusion patterns 842 below the block-shaped electrode 830 ranges from about 1 μm to about 10 μm. The interval S6 between the branch protrusion patterns 842 below the block-shaped electrode 830 ranges from about 1 μm to about 10 μm. In the present embodiment, the width L5 of each branch protrusion pattern 842 is the same as or different from the width L6 of each branch protrusion pattern 842, and the interval S5 between the branch protrusion patterns 842 is the same as or different from the interval S6 between the branch protrusion pattern 842. But adjusting the widths L3, L4, L5, L6, and c as well as the distances a and b, the tilting direction of the liquid crystal molecules may be adjusted.

Specially, even if the width of the branch electrode 722 is not small, the alignment stability of the liquid crystal molecules still can be improved. Similarly, the issue of the unstably tilted liquid crystal caused by the insufficient depth of each groove in the passivation layer 840 can be prevented in the pixel structure; what is more, the efficiency of liquid crystal corresponding to the region (referred to as b) may be improved in the pixel structure described in the present embodiment, and the dark-state light leakage caused by the tapered sidewalls can be reduced in the pixel structure constituted by parts of the branch protrusion patterns 842 of the passivation layer 840; as a result, the resultant display panel can have favorable transmittance and contrast.

According to an embodiment of the disclosure, the display panel 1000 may include a plurality of the pixel structures described in any of the previous embodiments, and at least three pixel structures may form a pixel unit. Note that a width of each of the first branch electrodes/the branch electrodes or an interval between the first branch electrodes/ the branch electrodes in at least one of the pixel structures in the pixel unit is different from a width of each of the first branch electrodes/the branch electrodes or an interval (i.e., a slit) between the first branch electrodes/the branch electrodes in the other pixel structures in the pixel unit. For instance, one pixel unit of the display panel 1000 may be formed by the pixel structures described in the first, second, and third embodiments; in the pixel unit, the width L2 of each of the first branch electrodes 124 in the pixel structure provided in the first embodiment may be different from the width L2 of each of the first branch electrodes 224 and 344 in the pixel structures provided in the second and third embodiments. Alternatively, the pixel unit may contain three pixel structures, two of which are described in the first embodiment. The other pixel structure may refer to that provided in the first embodiment or in the second embodiment. The above descriptions are merely exemplary and should not be construed as limitations to the disclosure. By adjusting the width of or the internal between the branch electrodes, the alignment direction of liquid crystal molecules may be fine tuned, and thereby no color shift occurs in the display panel 1000 described herein.

Relationships between the pixel structures and the transmittance in a display panel are described below with reference to the drawings.

Figure 38:
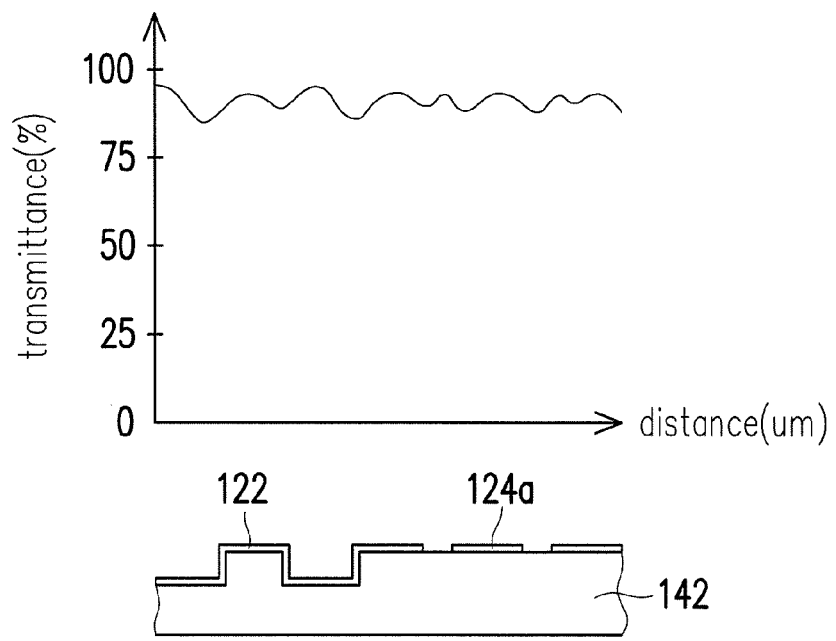
FIG. 38 is a schematic diagram illustrating a relationship between the pixel structure and a transmittance of the display panel described in the first embodiment of the disclosure.
Figure 39:
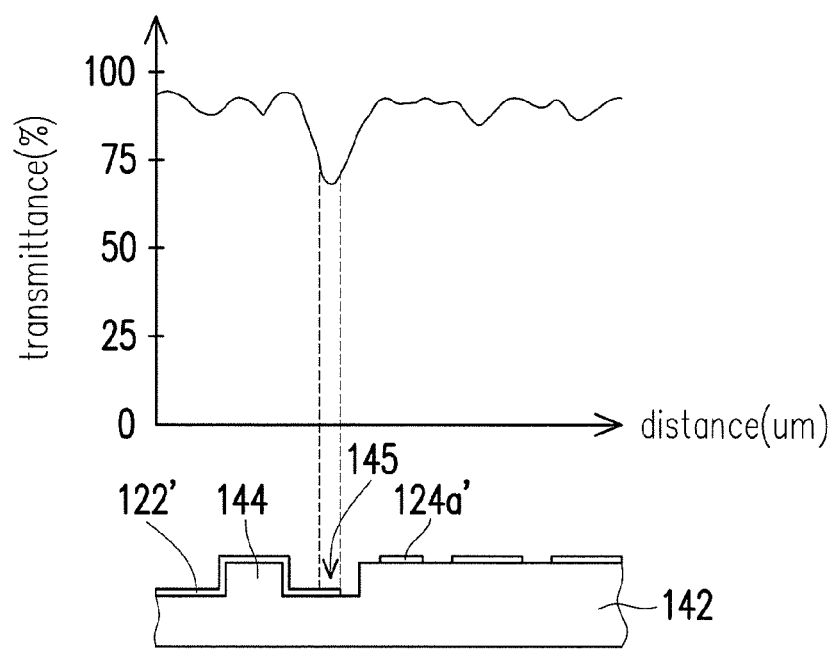
FIG. 39 is a schematic diagram illustrating a relationship between a pixel structure and a transmittance of a display panel described in a comparison example.

FIG. 38 is a schematic diagram illustrating a relationship between the pixel structure and a transmittance of the display panel described in the first embodiment of the disclosure. FIG. 39 is a schematic diagram illustrating a relationship between a pixel structure and a transmittance of a display panel described in a comparison example. Here, the horizontal axis represents distance (µm), and the vertical axis represents normalized transmittance (%) (unit free). As shown in FIG. 38, according to the first embodiment of the disclosure, the interval between the block-shaped electrode 122 and the first one 124a of the branch electrodes is located at the protruding region of the block-shaped protrusion pattern 142; that is, in FIG. 38, the block-shaped electrode 122 extends onto the block-shaped protrusion pattern 142, for instance. In the comparison example shown in FIG. 39, the interval between the block-shaped electrode 122' and the first one 124a' of the branch electrodes of the pixel structure is located in the groove 145 of the branch protrusion pattern 144. Specifically, one side of the interval between the block-shaped electrode 122' and the first one 124a' of the branch electrodes shown in FIG. 39 is located in the groove 145 of the block-shaped protrusion pattern 144, i.e., the edge of the block-shaped electrode 122' is in the groove 145 and does not extend to the block-shaped protrusion pattern 142. The other side of the interval between the block-shaped electrode 122' and the first one 124a' of the branch electrodes is located on the block-shaped protrusion pattern 142, i.e., the first one 124a' of the branch electrodes is merely located on the block-shaped protrusion pattern 142. In addition to the above, an edge of the interval between the block-shaped electrode 122' and the first one of the branch electrodes may be overlapped with (aligned with) an edge of the branch protrusion pattern 144 according to the comparison example; that is, the block-shaped electrode 122' is still within the groove 145, and the edge of the block-shaped electrode 122' is near one side of the block-shaped protrusion pattern 142 and does not extend to the block-shaped protrusion pattern 142, but the first one 124a' of the branch electrodes is merely located on the block-shaped protrusion pattern 142.

As shown in FIG. 38, the display panel described in the first embodiment can constantly have favorable transmittance. Namely, the design of the distance W2 can prevent the dark line issue occurring at the boundary due to the liquid crystal disclination at the boundary, and hence the display panel can be characterized by favorable transmittance and contrast enhancement. By contrast, as shown in FIG. 39, the transmittance is significantly reduced at the interval between the block-shaped electrode 122' and the first one 124a' of the branch electrodes. In case of the condition provided in the comparison example, i.e., the edge of the block-shaped electrode 122' is near the side of the block-shaped protrusion pattern 142, the transmittance is still reduced significantly. That is, in case of lacking the design of the distance W2 (e.g., W2 is equal to or less than 0), the dark line issue is likely to occur at the interval due to the liquid crystal disclination at the interval. If W2 is equal to 0, the edge of the block-shaped electrode 122' is in contact with the edge of the block-shaped protrusion pattern 142, while the edge of the block-shaped protrusion pattern 142 is still located within the groove 145. If W2 is less than 0, the edge of the block-shaped electrode 122' is away from the edge of the block-shaped protrusion pattern 142, and an orthogonal projection of the block-shaped protrusion pattern 142 is not located on the block-shaped protrusion pattern 142 but located on the groove 145 or on the branch protrusion pattern 144. The effects achieved by W2 at the interval and the relevant descriptions as depicted in FIG. 38 are applicable to the previous embodiments illustrated in FIG. 12, FIG. 16, FIG. 20, FIG. 24, and so on. Compared to the effects achieved according to the embodiment shown in FIG. 39, the effects accomplished according to the present embodiment are similar to those provided in the previous embodiments.

Figure 40:
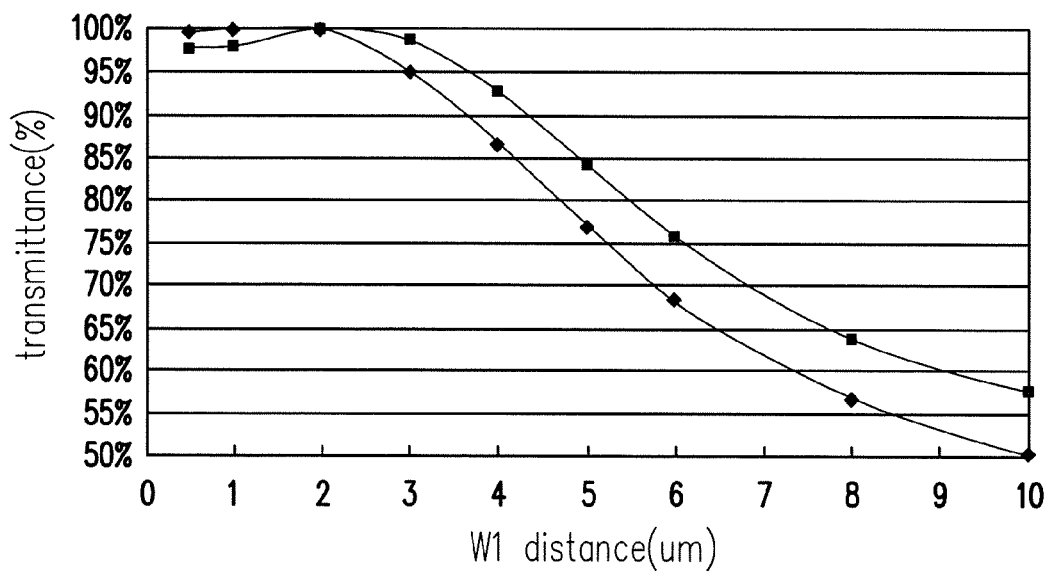
FIG. 40 is a schematic diagram illustrating a relationship between W1 and a transmittance of the display panel described in the first embodiment of the disclosure.

FIG. 40 is a schematic diagram illustrating a relationship between W1 and a transmittance of the display panel described in the first embodiment of the disclosure. Here, the horizontal axis represents the distance of the orthogonal projection gap W1 (µm), and the vertical axis represents normalized transmittance (%) (unit free). The curve connecting the rhombus-shaped dots corresponds to a display panel described in the first embodiment, and the curve connecting the square-shaped dots corresponds to another display panel described in the first embodiment. Please refer to FIG. 6, FIG. 7, and FIG. 40. Particularly, the orthogonal projection distance W2 in both display panels is about 4 µm, and the depth d of each groove in the passivation layer in both display panels is about 0.2 µm. The difference between the two display panels lies in that the width L1 of/the interval S1 between the branch protrusion patterns 144 in the display panel represented by the curve connecting the rhombus-shaped dots is about 4 µm/4 µm, the width L2 of/the interval S2 between the first branch electrodes 124 is about L/S=4 µm/2 µm; the width L1 of/the interval S1 between the branch protrusion patterns 144 in the display panel represented by the curve connecting the square-shaped dots is about 4 µm/4 µm, the width L2 of/the interval S2 between the first branch electrodes 124 is about L/S=4 µm/4 µm. It can be learned from FIG. 40 that the transmittance can reach at least 85% if the orthogonal projection gap W1 is 0 µm<W1≤4 µm. If the orthogonal projection gap W1 is 1 µm≤W1≤3 µm, the transmittance can even reach at least 95%. Note that the transmittance approximates to 100% if the orthogonal projection gap W1 is about 2 µm. Different transmittances satisfy different display modes; in consideration of light utilization, the design of the pixel electrode capable of achieving at least 75% of transmittance is rather appropriate.

Figure 41:
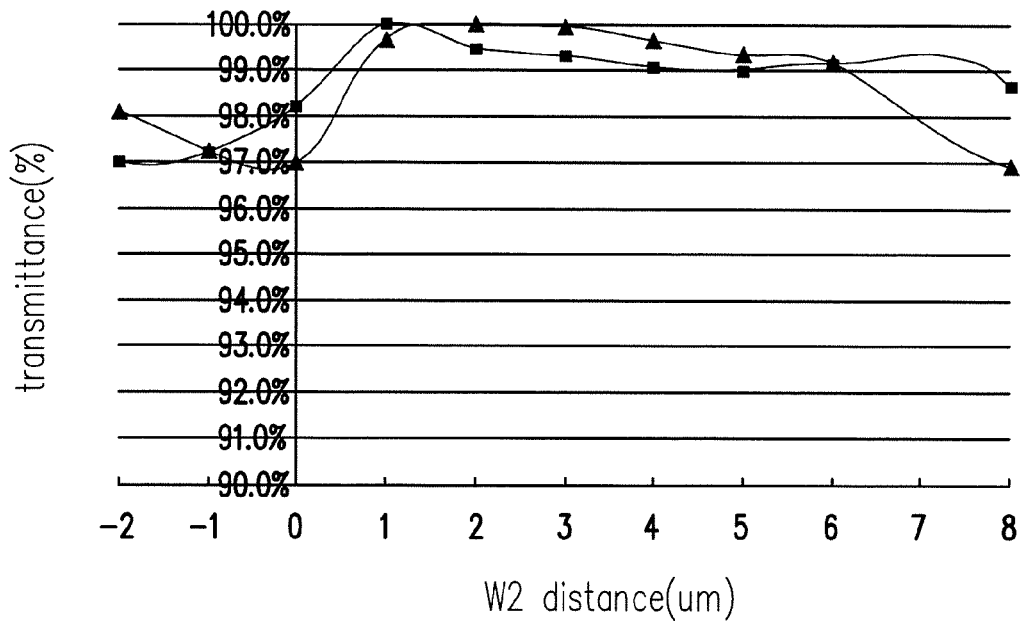
FIG. 41 is a schematic diagram illustrating a relationship between W2 and a transmittance of the display panel described in the first embodiment of the disclosure.

FIG. 41 is a schematic diagram illustrating a relationship between W2 and a transmittance of the display panel described in the first embodiment of the disclosure. As shown in FIG. 41, the horizontal axis represents the distance of the orthogonal projection distance W2 (μm), and the vertical axis represents normalized transmittance (%) (unit free). The curve connecting the triangular dots corresponds to a display panel described in the first embodiment, and the curve connecting the square-shaped dots corresponds to another display panel described in the first embodiment. Here, if W2 is greater than 0 (with a positive "+" value), it indicates that the orthogonal projection of the edge of the block-shaped electrode 122' is on the block-shaped protrusion pattern 142. If W2 is equal to 0, it indicates that the edge of the block-shaped electrode 122' is in contact with the edge of the block-shaped protrusion pattern 142. If W2 is less than 0 (with a negative "−" value), it indicates that the edge of the block-shaped electrode 122' is away from the edge of the block-shaped protrusion pattern 142, and that the orthogonal projection of the block-shaped electrode 122' is located on the groove 145 or on the branch protrusion pattern 144. Please refer to FIG. 6, FIG. 7, and FIG. 41. Particularly, the orthogonal projection distance W2 in both display panels is about 2 μm, and the depth d of each groove in the passivation layer in both display panels is about 0.2 μm. The difference between the two display panels lies in that the width L1 of/the interval S1 between the branch protrusion patterns 144 in the display panel represented by the curve connecting the triangular dots is about 4 μm/4 μm, the width L2 of/the interval S2 between the first branch electrodes 124 is about L/S=4 μm/2 μm; the width L1 of/the interval S1 between the branch protrusion patterns 144 in the display panel represented by the curve connecting the square-shaped dots is about 4 μm/4 μm, the width L2 of/the interval S2 between the first branch electrodes 124 is about L/S=4 μm/4 μm. It can be learned from FIG. 41 that if the orthogonal projection gap W1 has the most preferable value (i.e., with the maximum transmittance), and if the orthogonal projection distance W2 is 0.5 μm≤W2≤7 μm, the transmittance of both types of display panels can reach about 98%. In consideration of manufacturing variations (e.g., PEP shift), if the selected orthogonal projection distance W2 is within a range of about 1.5 μm, the transmittance reaches at least 98%. If W2 is equal to or less than 0 (with a negative "−" value), the selected orthogonal projection distance W2 preferably falls within 2 μm≤W2≤5.5 μm, most preferably 3 μm. FIG. 40 and FIG. 41 may also serve to clarify the design of W1 and W2 provided in the previous embodiment, as shown in FIG. 12, FIG. 16, FIG. 20, FIG. 24, and so on, for instance, and effects achieved according to the previous embodiments can also be accomplished according to the present embodiment.

Figure 42:
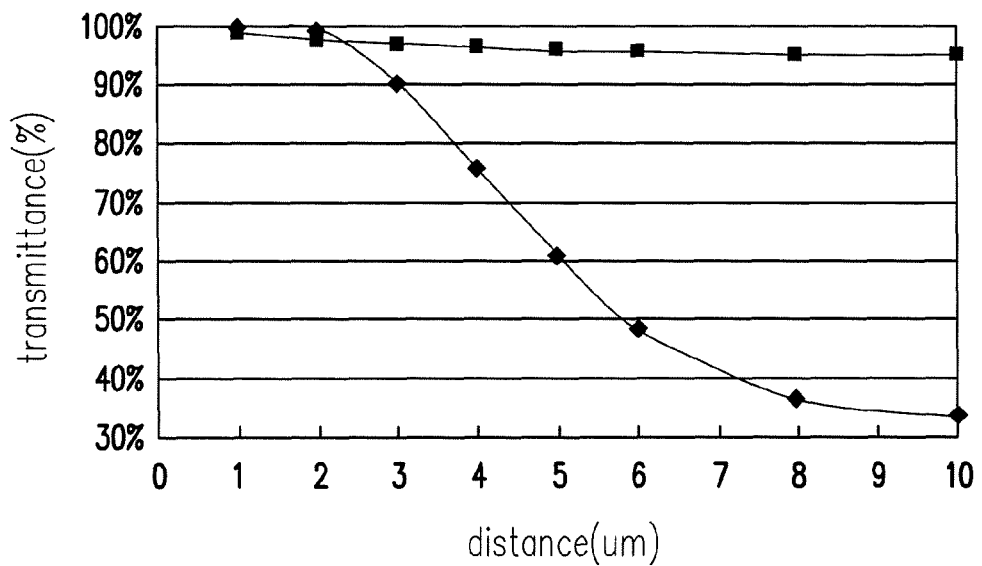
FIG. 42 is a schematic diagram illustrating a relationship between a/b and a transmittance of the display panel described in the sixth embodiment of the disclosure.

FIG. 42 is a schematic diagram illustrating a relationship between a/b and a transmittance of the display panel described in the sixth embodiment of the disclosure. As shown in FIG. 42, the horizontal axis represents distance (μm), and the vertical axis represents normalized transmittance (%) (unit free). The curve connecting the rhombus-shaped dots corresponds to a display panel described in the sixth embodiment, and the orthogonal projection distance b described herein is about 3 μm. The curve connecting the square-shaped dots corresponds to another display panel described in the sixth embodiment, and the orthogonal projection width a described herein is about 2 μm. It can be learned from the curve connecting the rhombus-shaped dots that the transmittance can reach about at least 85% if the orthogonal projection width a is 0 μm<a≤3 μm, and if the orthogonal projection width a is about 2 μm, the transmittance may approximate to about 100%. Since the pixel electrode provided in the present embodiment stands for plural branch electrodes, the orthogonal projection width a between two branch electrodes must be ≠0 μm. Besides, it can be learned from the curve connecting the square-shaped dots that the transmittance can reach about at least 85% if the orthogonal projection distance b is 0 μm<b≤10 μm. Since the branch electrodes of the pixel electrode provided in the present embodiment are bound to be extended onto the branch protrusion patterns of the passivation layer, the orthogonal projection distance b≠0 μm.

Figure 43:
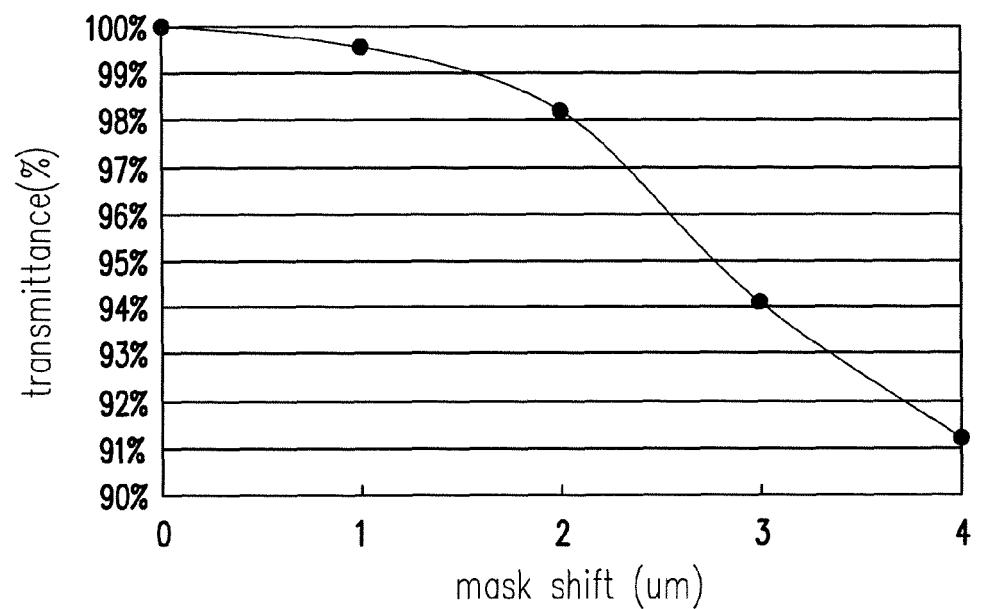
FIG. 43 is a schematic diagram illustrating a relationship between mask shift and a transmittance of the display panel described in the sixth embodiment of the disclosure.

FIG. 43 is a schematic diagram illustrating a relationship between mask (PEP) shift and a transmittance of the display panel described in the sixth embodiment of the disclosure. As shown in FIG. 43, the horizontal axis represents PEP shift (μm), and the vertical axis represents normalized transmittance (%) (unit free). The orthogonal projection width a of the display panel shown in FIG. 43 is about 2 μm, and the orthogonal projection distance b is about 3 μm. Note that a 1.5 μm PEP shift may occur between the pixel electrode and the passivation layer during the manufacturing process. It can be learned from FIG. 43 that if the PEP shift is about 1.5 μm, variations in the transmittance of the display panel may be kept within about 2% (i.e., the transmittance is less than 98%). In light of the above, the selected orthogonal projection distance b is 1.5 μm≤b≤10 μm, most preferably 1.5 μm approximately.

Figure 44:
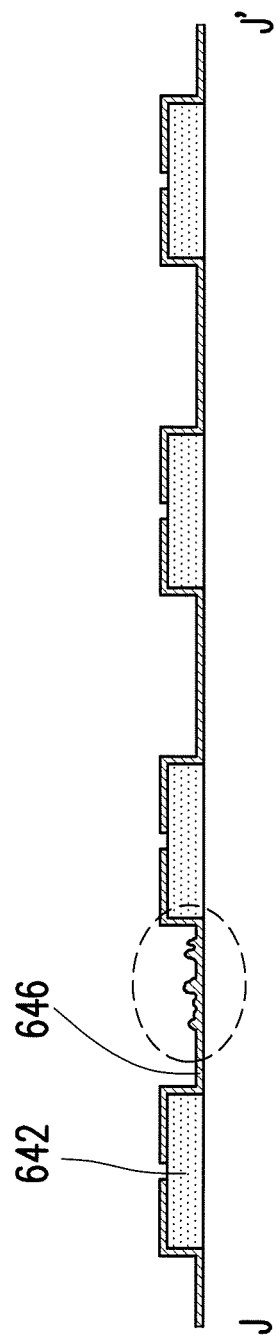
FIG. 44 is another schematic cross-sectional view taken along a line J-J' in FIG. 27.

The passivation layer described herein may have the undulated structure (a structure that protrudes upward and is recessed downward), and therefore the width c≠0 μm. FIG. 44 is another schematic cross-sectional view taken along a line J-J' in FIG. 27. With reference to FIG. 44, during the manufacturing process, the inaccurate control of etching and insufficient photoresist uniformity may increase the surface roughness of the passivation layer in the groove 646, as shown by the dotted frame in FIG. 44, which may further lead to light leakage. If the above factors are taken into account, the width c is preferably less than 3 μm. Besides, according to the experimental results in Table 1, in the present embodiment, if the depth d of each groove is about 0.2 μm, L1>S1, or the L1/S1 ratio increases. Thereby, L0 Leakage is less likely to occur. In other words, the smaller the depth d of the groove 646 of the passivation layer is, the less likely L0 Leakage occurs, and the greater the contrast becomes. When the height of the branch protrusion patterns 642 of the passivation layer is equal to the width of the groove 646, i.e., (a+2b)μm, the contrast may stay the same or may be enhanced. In view of the above, the width c is preferably within the following range: 3 μm<c≤(a+2b)μm. FIG. 42 and FIG. 43 may also serve to clarify the design of a, b, and c provided in the previous embodiment, as shown in FIG. 33, FIG. 37, and so on, for instance, and effects achieved according to the previous embodiments can also be accomplished according to the present embodiment.

TABLE 1

|  | L1/S1 | |
| --- | --- | --- |
|  | 4 μm/4 μm | 5 μm/3 μm |
| L0 (nits) | 0.0744 | 0.0518 |
| CR | 1112 | 1544 |

To sum up, the pixel electrode described in some embodiments of the disclosure may have plural branch electrodes, and the passivation layer may have plural branch protrusion patterns. The desired pixel structure, as described herein, has the branch electrodes and the branch protrusion patterns which are alternately arranged. In particular, the pixel structure described herein may prevent the conventional issue of the unstably tilted liquid crystal caused by the insufficient depth of each groove in the passivation layer, and the efficiency of liquid crystal can be enhanced. Moreover, the pixel structure described herein is able to reduce the dark-state light leakage caused by the tapered sidewalls of the branch protrusion patterns of the passivation layer, such that the resultant display panel can have favorable transmittance and contrast.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A pixel structure comprising:
   a substrate;
   an opposite substrate located on the substrate, the opposite substrate having a common electrode on one side of the opposite substrate facing the substrate;
   a scan line and a data line both formed on the substrate;
   an active device formed on the substrate and electrically connected to the scan line and the data line;
   a pixel electrode electrically connected to the active device, the pixel electrode having a plurality of branch electrodes, an interval being between two adjacent branch electrodes of the branch electrodes, an orthogonal projection width of the interval being a, 0 μm<a<3 μm; and
   a passivation layer located below the pixel electrode, the passivation layer having a plurality of branch protrusion patterns, at least one groove being located between two adjacent branch protrusion patterns of the branch protrusion patterns, wherein
   an orthogonal projection distance b is between an orthogonal projection edge of each of the branch electrodes and an orthogonal projection edge of one of the grooves corresponding to said branch electrode, and 1.5 μm≤b≤10 μm.

2. The pixel structure according to claim 1, wherein a depth of each of the grooves ranges from about 0.1 μm to about 0.3 μm.

3. The pixel structure according to claim 1, wherein a width of each of the grooves is c, and 3 μm<c≤(a+2b)μm.

4. The pixel structure according to claim 1, wherein each of the branch electrodes of the pixel electrode is arranged corresponding to one of the grooves of the passivation layer and extends from the one of the grooves to two adjacent branch protrusion patterns of the branch protrusion patterns, and two of the intervals are overlapped with the two adjacent branch protrusion patterns, respectively.

5. The pixel structure according to claim 1, wherein each of the branch electrodes of the pixel electrode is arranged corresponding to one of the branch protrusion patterns of the passivation layer and extends from the one of the branch protrusion patterns to two adjacent grooves of the grooves, and two of the intervals are overlapped with the two adjacent grooves, respectively.

6. The pixel structure according to claim 1, wherein
   the pixel electrode further comprises a main electrode, the branch electrodes are connected to the main electrode and extend along a plurality of directions from the main electrode,
   the passivation layer further comprises a main protrusion pattern, the branch protrusion patterns are connected to the main protrusion pattern and extend along a plurality of directions from the main protrusion pattern, and
   the main electrode and the main protrusion pattern are overlapped.

7. The pixel structure according to claim 6, wherein the main electrode is shaped as a crisscross, and the main protrusion pattern is shaped as a crisscross.

8. The pixel structure according to claim 6, wherein a width of the main electrode is greater than a width of the main protrusion pattern.

9. The pixel structure according to claim 6, wherein the pixel electrode further comprises at least one block-shaped electrode and a plurality of outer branch electrodes connected to the at least one block-shaped electrode.

10. The pixel structure according to claim 9, wherein the passivation layer further comprises at least one block-shaped pattern, and the outer branch electrodes are located on the at least one block-shaped pattern.

11. The pixel structure according to claim 1, wherein a is 2 μm, and b is 1.5 μm.

12. The pixel structure according to claim 1, further comprising a color filter layer formed on the substrate and located below the passivation layer.

13. The pixel structure according to claim 1, wherein a width of each of the first branch electrodes ranges from about 1 μm to about 10 μm.

14. The pixel structure according to claim 1, wherein a width of each of the branch protrusion patterns ranges from about 1 μm to about 10 μm.

15. A display panel comprising:
   a plurality of the pixel structures recited in claim 1, wherein at least three of the pixel structures form a pixel unit, and a width of each of the first branch electrodes or an interval between the first branch electrodes in at least one of the pixel structures in the pixel unit is different from a width of each of the first branch electrodes or an interval between the first branch electrodes in the other pixel structures in the pixel unit.

16. A pixel structure comprising:
   a substrate;
   an opposite substrate disposed on the substrate, the opposite substrate having a common electrode on one side of the opposite substrate facing the substrate;
   a scan line and a data line both formed on the substrate;
   an active device formed on the substrate and electrically connected to the scan line and the data line;
   a pixel electrode electrically connected to the active device, the pixel electrode having at least one block-shaped electrode and a plurality of first branch electrodes; and
   a passivation layer located below the pixel electrode, the passivation layer having at least one block-shaped protrusion pattern, a plurality of branch protrusion patterns, and a plurality of grooves,
   wherein the at least one block-shaped electrode of the pixel electrode conformally covers the branch protrusion patterns of the passivation layer, such that the at least one block-shaped electrode protrudes based on the branch protrusion patterns to form a plurality of second branch electrodes, wherein the first branch electrodes of the pixel electrode are located on the at least one block-shaped protrusion pattern of the passivation layer, wherein an edge of the at least one block-shaped electrode of the pixel electrode further extends to the at least one block-shaped protrusion pattern of the passivation layer, wherein an orthogonal projection gap W1 is between an orthogonal projection edge of the at least one block-shaped electrode and an orthogonal projection edge of a nearest one of the first branch electrodes, and 0 μm<W1≤4 μm, and wherein an orthogonal projection distance W2 is between the orthogonal projection edge of the at least one block-shaped electrode and an orthogonal projection edge of the at least one block-shaped protrusion pattern, and 2 μm≤W2≤5.5 μm.

17. The pixel structure according to claim 16, wherein a depth of each of the grooves of the passivation layer ranges from about 0.1 μm to about 0.3 μm.

18. The pixel structure according to claim 16, wherein
the pixel electrode further comprises a main electrode, and the first branch electrodes are connected to the main electrode;
the passivation layer further comprises a main protrusion pattern, the branch protrusion patterns and the main protrusion pattern are connected, and the main electrode of the pixel electrode and the main protrusion pattern of the passivation layer are intersected each other.

19. The pixel structure according to claim 18, wherein the at least one block-shaped electrode of the pixel electrode is located at two sides of the main electrode, and the at least one block-shaped protrusion pattern of the passivation layer is located at two sides of the main protrusion pattern.

20. The pixel structure according to claim 18, wherein the pixel electrode further comprises a plurality of outer branch electrodes connected to the at least one block-shaped electrode.

21. The pixel structure according to claim 20, wherein the passivation layer further comprises at least one block-shaped pattern, and the outer branch electrodes are located on the at least one block-shaped pattern.

22. The pixel structure according to claim 16, wherein
the pixel electrode further comprises a first main electrode and a second main electrode, the first branch electrodes of the pixel electrode comprise a plurality of first sub-branch electrodes connected to the first main electrode and a plurality of second sub-branch electrodes connected to the second main electrode, and the at least one block-shaped electrode is located between the first sub-branch electrodes and the second sub-branch electrodes;
the passivation layer further comprises a first main protrusion pattern and a second main protrusion pattern, the branch protrusion patterns of the passivation layer comprise a plurality of first branch protrusion patterns connected to the first main protrusion pattern and a plurality of second branch protrusion patterns connected to the second main protrusion pattern, and the at least one block-shaped protrusion pattern is located below orthogonal projections of the first sub-branch electrodes and the second sub-branch electrodes, such that the at least one block-shaped protrusion pattern is overlapped with the first sub-branch electrodes and the second sub-branch electrodes.

23. The pixel structure according to claim 16, wherein
the at least one block-shaped electrode of the pixel electrode comprises a plurality of sub-block-shaped electrodes, and at least one of the first branch electrodes is located between two adjacent sub-block-shaped electrodes of the sub-block-shaped electrodes;
the at least one block-shaped protrusion pattern of the passivation layer comprises a plurality of sub-block-shaped protrusion patterns, and at least one of the branch protrusion patterns is located between two adjacent sub-block-shaped protrusion patterns of the sub-block-shaped protrusion patterns.

24. The pixel structure according to claim 16, wherein W1 is 2 μm, and W2 is 3 μm.

25. The pixel structure according to claim 16, further comprising a color filter layer formed on the substrate and located below the passivation layer.

26. The pixel structure according to claim 16, wherein a width of each of the first branch electrodes ranges from about 1 μm to about 10 μm, and an interval between the first branch electrodes ranges from about 1 μm to about 10 μm.

27. The pixel structure according to claim 16, wherein a width of each of the branch protrusion patterns ranges from about 1 μm to about 10 μm, and an interval between the branch protrusion patterns ranges from about 1 μm to about 10 μm.

28. A display panel comprising:
a plurality of the pixel structures recited in claim 16, wherein at least three of the pixel structures form a pixel unit, and a width of each of the first branch electrodes or an interval between the first branch electrodes in at least one of the pixel structures in the pixel unit is different from a width of each of the first branch electrodes or an interval between the first branch electrodes in the other pixel structures in the pixel unit.

* * * * *